US007887991B2

(12) United States Patent
Hatakeyama et al.

(10) Patent No.: US 7,887,991 B2
(45) Date of Patent: Feb. 15, 2011

(54) POSITIVE RESIST COMPOSITION AND PATTERNING PROCESS USING THE SAME

(75) Inventors: Jun Hatakeyama, Niigata (JP); Takanobu Takeda, Niigata (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 200 days.

(21) Appl. No.: 12/320,265

(22) Filed: Jan. 22, 2009

(65) Prior Publication Data

US 2009/0202940 A1    Aug. 13, 2009

(30) Foreign Application Priority Data

Feb. 8, 2008    (JP) .............................. 2008-029479

(51) Int. Cl.
*G03F 7/039* (2006.01)
*G03F 7/20* (2006.01)
*G03F 7/30* (2006.01)
*G03F 7/38* (2006.01)

(52) U.S. Cl. .................... 430/270.1; 430/326; 430/311; 430/330; 430/905; 430/907; 430/914

(58) Field of Classification Search .................... None
See application file for complete search history.

(56) References Cited

U.S. PATENT DOCUMENTS

| 6,448,420 | B1 | 9/2002 | Kinsho et al. |
| 6,630,280 | B1 | 10/2003 | Fujimori et al. |
| 2007/0231708 | A1 | 10/2007 | Matsumaru et al. |

FOREIGN PATENT DOCUMENTS

| EP | 0 473 547 A1 | 3/1992 |
| JP | A-04-230645 | 8/1992 |
| JP | A-11-322656 | 11/1999 |
| JP | A-2000-327633 | 11/2000 |
| JP | A-2005-084365 | 3/2005 |
| JP | A-2006-084365 | 2/2006 |
| JP | A-2006-169302 | 6/2006 |
| JP | A-2006-178317 | 7/2006 |
| JP | B2-3865048 | 1/2007 |
| JP | B2-3963625 | 8/2007 |
| WO | WO 2004/074242 A2 | 9/2004 |

OTHER PUBLICATIONS

Matsuzawa et al., "Theoretical Calculation of Photoabsorption of Various Polymers in an Extreme Ultraviolet Region," *Japanese Journal of Applied Physics*, Part I, vol. 38, No. 12B, pp. 7109-7113, Dec. 1999.

*Primary Examiner*—Sin J. Lee
(74) *Attorney, Agent, or Firm*—Oliff & Berridge, PLC

(57) ABSTRACT

The present invention provides a polymer, having a high sensitivity, a high degree of resolution, a good pattern configuration after exposure, and in addition an excellent etching resistance, suitable as a base resin for a positive resist composition, especially for a chemically amplified positive resist composition; a positive resist composition using the polymer; and a patterning process.

The positive resist composition of the present invention is characterized in that it contains at least, as a base resin, a polymer whose hydrogen atom of a phenolic hydroxide group is substituted by an acid labile group represented by the following general formula (1).

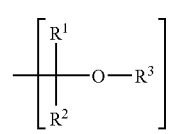

(1)

25 Claims, No Drawings

POSITIVE RESIST COMPOSITION AND PATTERNING PROCESS USING THE SAME

BACKGROUND OF THE INVENTION

1. Field of the Invention

The present invention relates to a polymer suitable as a base resin for a positive resist composition, in particular a chemically amplified positive resist composition, to a positive resist composition using the polymer, and to a patterning process.

2. Description of the Related Art

As LSI progresses toward a high integration and a further acceleration in speed, a finer pattern rule is rapidly progressing. In particular, the expansion of a flash memory market and the enlargement of a memory capacity lead the finer pattern rule. Mass production of a 65-nm node device by a miniaturized fine line of an ArF lithography is currently in practice and preparation of the mass production of a 45-nm node device by a next generation ArF-immersion lithography is now progressing. As the candidates for the post next generation technology, a 32-nm node, an immersion lithography by a ultra high NA lens comprising a liquid having a higher refractive index than water, a high-refractive lens and a high-refractive resist, an extreme ultraviolet (EUV) lithography of 13.5-nm wavelength, and a double exposure (a double patterning lithography) of an ArF lithography, and the like are being studied.

In a high energy beam of an extremely short wavelength such as an EB, a X-ray, and the like, a light element such as a hydrocarbon used in a resist has almost no absorption, and thus a resist composition based on polyhydrorxystyrene is studied.

An EB resist has been practically used for a mask lithography. In recent years, a mask production technology has been considered to be a problem. A reduced projection exposure system with a ⅕ reduction ratio had been used from the time of a g-beam exposure, but an effect of the size misalignment of a mask on a size change of a pattern on a wafer becomes a problem since an enlarged chip size, a projection lens with an enlarged diameter, and also a ¼ reduction ratio have been employed. In addition, as the pattern miniaturization progresses, it is pointed out that a size misalignment on a wafer is becoming larger than a size misalignment of a mask. A Mask Error Enhancement Factor (MEEF) is calculated by using a mask size change as a dominator and a size change on a wafer as a numerator. In the pattern of a 45-nm class, it is not a rare case that MEEF is over 4. If the reduction ratio is ¼ and MEEF is 4, it can be said that the equivalent precision as a substantially same magnitude mask is necessary in the mask production.

In order to improve a precision of a line width in a mask production, exposure system using a laser beam to an electronic beam (EB) have been used. In addition, as a further miniaturization becomes possible by raising an acceleration voltage of an electron gun, a voltage of 10 to 30 keV, and of 50 keV becomes a mainstream recently, and further the study is progressing toward 100 keV further.

Here, as an increase of the acceleration voltage, a tendency to a lower sensitivity of a resist becomes a problem. A higher acceleration voltage enables to improve the degree of resolution and a size controlling as the effect of a front scattering in a resist film becomes smaller, leading to an improvement in a contrast of an electronic lithography energy, but a sensitivity of a resist is decreased as an electron passes through a resist film freely. Because a mask exposure system exposes a light directly for a lithography by a traversable line, the decrease of the resist sensitivity leads to a decrease in productivity and thus is not desirable. In view of a request for a higher sensitivity, a chemically amplified positive resist composition is being studied.

As a miniaturization of a pattern of an EB lithography for a mask production progresses, a move to a thinner resist is progressing in order to prevent a pattern fall due to a high aspect ratio at the time of development. In the case of a photolithography, the move to a thinner resist contributes greatly to the improvement in a resolution. This is owing to a flattening of a device by introduction of a CMP and the like. In the mask production, a substrate is flat, thus a film thickness of the substrate to be processed (for instance, Cr, MoSi and $SiO_2$) is determined for the light shielding rate and the phase difference control. In order to make it thinner, it is necessary to improve a dry-etching resistance of a resist.

Meanwhile, it is generally assumed that there is a relationship between a resist carbon density and a dry-etching resistance. In the EB lithography not affected by an absorption, a resist based on a novolak polymer having a good etching resistance has been developed. However, a novolak polymer is not assumed to be a suitable composition for a fine processing as it is difficult to control a molecular weight and a degree of dispersion.

In addition, it is reported that an absorption of a carbon atom is small in a soft X-ray (EUV) exposure using a 5-20 nm wavelength, which is expected, along with an $F_2$ exposure, as a promising exposure method in a fine processing using a 70 nm wavelength or in a process that follows thereafter. A higher carbon density is effective not only for improvement in the dry-etching resistance but also for increase in a transmittance in the region of a soft X-ray wavelength (N. Matsuzawa et. al.; Jp. J. Appl. Phys., Vol. 38, p 7109-7113 (1999)).

SUMMARY OF THE INVENTION

The present invention was made in view of the above situation, and has an object to provide a polymer suitable as a base resin for a positive resist composition, in particular a chemically amplified positive resist composition, having a higher sensitivity and resolution than a conventional positive resist composition, a good pattern configuration after exposure, and in addition an excellent etching resistance; a positive resist composition using the polymer; and a patterning process.

The present invention was made in order to achieve the above objectives, and thus provides a positive resist composition characterized in that it contains at least, as a base resin, a polymer whose hydrogen atom of a phenolic hydroxide group is substituted by an acid labile group represented by the following general formula (1).

(In the formula, $R^1$ and $R^2$ each represent independently any of a linear, a branched, and a cyclic alkyl group having 1 to 6 carbon atoms, and a hydrogen atom. $R^3$ represents a fluorenyl group or a fluorenylmethyl group.)

As remarked above, a positive resist composition containing at least, as a base resin, a polymer whose hydrogen atom of a phenolic hydroxide group is substituted by the acid labile group represented by the above general formula (1) shows a high sensitivity and resolution, a good etching configuration, and an excellent etching resistance.

Further, it is preferable that the polymer be the one whose hydrogen atom of a phenolic hydroxide group is substituted by the acid labile group represented by the following general formula (2).

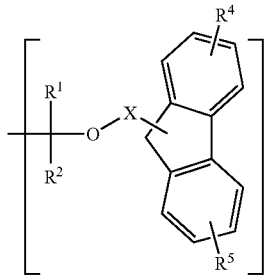
(2)

(In the formula, $R^1$ and $R^2$ represent the same meanings as before. $R^4$ and $R^5$ each represent independently any of a hydrogen atom, an alkyl group having 1 to 30 carbon atoms, an alkyl group a part of or all of whose hydrogen atoms are substituted by a halogen atom, an alkoxy group, an alkanoyl group, an alkoxycarbonyl group, an aryl group having 6 to 10 carbon atoms, and a halogen atom. X represents a single bond or a methylene group.)

As remarked above, the polymer, if its hydrogen atom of a phenolic hydroxide group is substituted by the acid labile group represented by the above general formula (2), can be made to a base resin very suitable for a positive resist composition showing a high sensitivity and resolution, a good etching configuration, and an excellent etching resistance.

Further, it is preferable that the polymer be the one that has the weight-average molecular weight of 1,000 to 500,000 and contains at least a repeating unit a1, a hydroxy styrene that is substituted by the acid labile group, and/or a repeating unit b1, a hydroxy vinyl naphthalene that is substituted by the acid labile group, and a repeating unit a2 and/or a repeating unit b2, as represented by the following general formula (3).

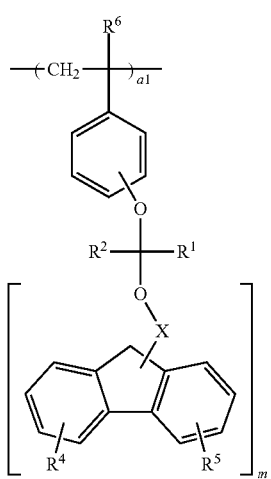
(3)

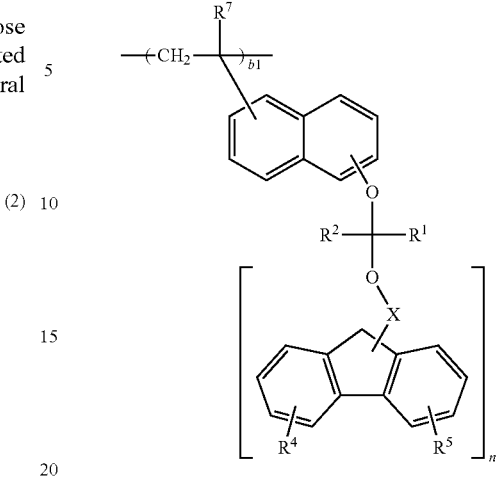

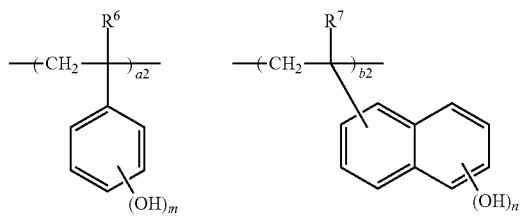

(In the formula, $R^6$ and $R^7$ each represent independently a hydrogen atom or a methyl group. $R^1$ and $R^2$ represent the same meanings as before. $R^4$ and $R^5$ each represent independently any of a hydrogen atom, an alkyl group having 1 to 30 carbon atoms, an alkyl group a part of or all of whose hydrogen atoms are substituted by a halogen atom, an alkoxy group, an alkanoyl group, an alkoxycarbonyl group, an aryl group having 6 to 10 carbon atoms, and a halogen atom. X represents a single bond or a methylene group. Here, m and n represent 1 or 2, and $0 \leq a1/(a1+b1+a2+b2) \leq 0.5$, $0 \leq b1/(a1+b1+a2+b2) \leq 0.5$, and $0.05 \leq (a1+b1)/(a1+b1+a2+b2) \leq 0.5$.)

As remarked above, in the positive resist composition of the present invention, if the polymer having the weight-average molecular weight of 1,000 to 500,000 and containing at least a repeating unit a1 of a hydroxy styrene substituted by the acid labile group and/or a repeating unit b1 of a hydroxy vinyl naphthalene substituted by the acid labile group, and a repeating unit a2 and/or a repeating unit b2, as represented by the general formula (3), is used as the base resin, the positive resist composition showing a remarkably high contrast of the alkaline-dissolution rates before and after the exposure, a high sensitivity and resolution, a good pattern configuration after exposure, and in addition an excellent etching resistance, particularly suitable for the VLSI manufacture or for a micropatterning material of a photo mask, can be obtained.

Further, the polymer may be the one that has the weight-average molecular weight of 1,000 to 500,000 and contains at least a repeating unit a1' of a hydroxy styrene substituted by the acid labile group and a repeating unit a2' represented by the following general formula (4), and further contains one or more of repeating units selected from c, d, e, f, and g that are represented by the following general formula (4).

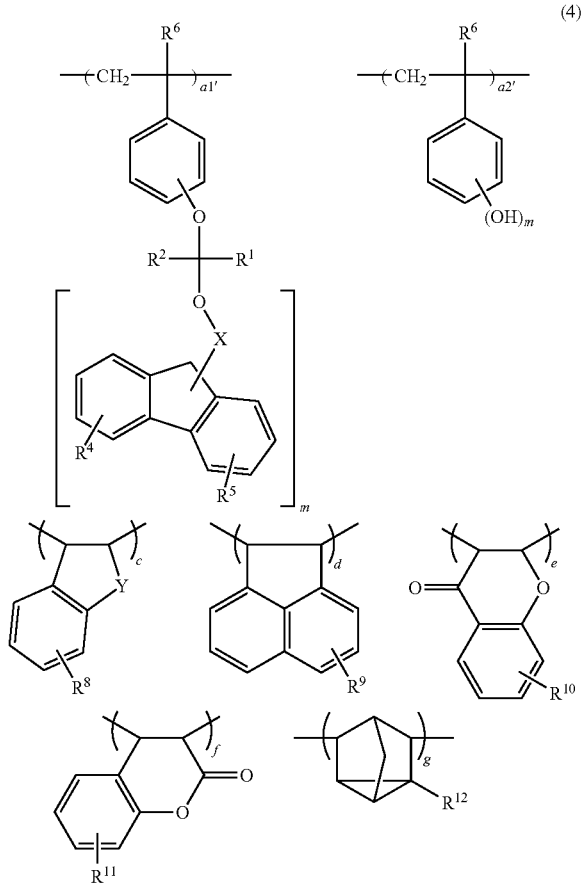

(4)

(In the formula, $R^6$ represents a hydrogen atom or a methyl group. $R^1$ and $R^2$ represent the same meaning as before. $R^4$ and $R^5$ each represent independently any of a hydrogen atom, an alkyl group having 1 to 30 carbon atoms, an alkyl group a part of or all of whose hydrogen atoms are substituted by a halogen atom, an alkoxy group, an alkanoyl group, an alkoxycarbonyl group, an aryl group having 6 to 10 carbon atoms, and a halogen atom. X represents a single bond or a methylene group. $R^8$ to $R^{12}$ each represent independently any of a hydrogen atom, an alkyl group having 1 to 30 carbon atoms, an alkyl group a part of or all of whose hydrogen atoms are substituted by a halogen atom, a hydroxy group, an alkoxy group, an alkanoyl group, an alkoxycarbonyl group, an aryl group having 6 to 10 carbon atoms, a halogen atom, and a 1,1,1,3,3,3-hexafluoro-2-propanol group. Y represents any of a methylene group, an oxygen atom, and a sulfur atom. Here, m represents 1 or 2, and $0<a1'/(a1'+a2'+c+d+e+f+g)\leq0.5$, $0\leq a2'/(a1'+a2'+c+d+e+f+g)\leq0.9$, $0\leq c/(a1'+a2'+c+d+e+f+g)\leq0.5$, $0\leq d/(a1'+a2'+c+d+e+f+g)\leq0.5$, $0\leq e/(a1'+a2'+c+d+e+f+g)\leq0.5$, $0\leq f/(a1'+a2'+c+d+e+f+g)\leq0.5$, $0\leq g/(a1'+a2'+c+d+e+f+g)\leq0.5$, and $0.03\leq(c+d+e+f+g)/(a1'+a2'+c+d+e+f+g)\leq0.4$.)

As remarked above, in the positive resist composition of the present invention, if the polymer having the weight-average molecular weight of 1,000 to 500,000 and containing at least a repeating unit a1' of a hydroxy styrene substituted by the acid labile group and a repeating unit a2' represented by the following general formula (4), and further contains one or more of repeating units selected from c, d, e, f, and g that are represented by the following general formula (4) is used as the base resin, the positive resist composition showing remarkably a high contrast of the alkaline-dissolution rates before and after the exposure, high sensitivity and resolution, good pattern configuration after exposure, and in addition an excellent etching resistance, particularly suitable for the VLSI manufacture or for a micropatterning material of a photo mask, can be obtained.

Further, it is preferable that the positive resist composition be a chemically amplified positive resist composition containing further an organic solvent and an acid generator.

As remarked above, if the positive resist composition of the present invention is a chemically amplified positive resist composition containing an acid generator, a pattern with a remarkably high precision can be obtained by an acid-catalysis reaction. In addition, by adding an organic solvent it may be possible, for instance, to improve the coating properties of the resist composition on a substrate and the like.

Furthermore, it is preferable that the composition further contain a dissolution inhibitor.

As remarked above, by adding a dissolution inhibitor into the positive resist composition of the present invention, it is possible to further increase the difference of the dissolution rates between an exposed area and a unexposed area, and thus to further improve the degree of resolution.

Further, it is preferable that the positive resist composition of the present invention be further blended with a basic compound and/or a surfactant as an additive.

As remarked above, by further blending a basic compound as an additive to the positive resist composition of the present invention, it is possible, for instance, to suppress a diffusion rate of an acid in a resist film and thus to further improve the degree of resolution. By blending a surfactant, it is possible to further improve or suppress coating properties of the resist composition.

The positive resist composition of the present invention may be used as a processing to pattern on a semi-conductor substrate, on a mask substrate, and the like by performing at least a step of applying the positive resist composition on a substrate, a step of exposing the substrate high energy beam after heat-treatment, and a step of developing the substrate with a developer.

It is obvious that the development may also be done after the exposure, which is followed by the heat treatment, and there are no problems to carry out other processes such as an etching process, a resist-removing process, a washing process, and the like.

The positive resist composition of the present invention has a high sensitivity and resolution, and a good pattern configuration after exposure, and in addition, suppresses particularly diffusion rate of an acid and shows an excellent etching resistance. Accordingly, a positive resist composition, in particular a chemically amplified positive resist composition, particularly suitable for the VLSI manufacture, for a micropatterning material of a photo mask, or for a patterning material for an EUV exposure may be obtained.

DETAILED DESCRIPTION OF THE INVENTIONS

Inventors of the present invention carried out an extensive investigation with a purpose to obtain a positive resist composition having a high sensitivity and resolution, a large exposure allowance, a small sparse-dense size difference, a good process applicability, a good etching configuration and an excellent etching resistance, all of, which are desired in recent years. As a result of the investigation for this, the present inventors found that a polymer containing a phenolic hydroxy group that is substituted by an acid labile group having a structure of a fluorenyl group and a fluorenylmethyl group, in particular a polymer obtained by substituting a hydroxy styrene or a hydroxy vinyl naphthalene by the above-mentioned acid labile group is useful for a positive resist composition, in particular for a chemically amplified positive resist composition. Based on that information the present invention was accomplished.

The present inventors considered firstly to increase the carbon density of the resist in order to improve the etching resistance. The carbon density of the benzene ring is 92% while that of the naphthalene ring is 94%, thus it is expected that the composition containing the naphthalene ring may improve its dry etching resistance. In its nature, the naphthalene ring has a high absorption of light so that the composition containing it has not received so much attention in the past, but was assumed to be a promising composition in the exposure of an extremely short wavelength where there is no effect by the absorption.

In addition, it is expected that an indene copolymerization disclosed in the Japanese Patent Publication No. 3865048 and an acenaphthylene copolymerization disclosed in the Japanese Publication of Unexamined Application No. 2006-169302 may improve the etching resistance owing to not only a high carbon density but also a rigid main chain structure due to a cyclic olefin structure.

Further, the etching resistance is also improved by an acetal group having a cyclic structure such as a balky acetal and the like disclosed in the Japanese Patent Publication No, 3963625.

Accordingly, the present inventors found that a positive resist composition, in particular a chemically amplified positive resist composition, particularly suitable for the VLSI manufacture or for a micropatterning material of a photo mask, having a remarkably high contrast of alkali-dissolution rates before and after the exposure, a high sensitivity and resolution, a good pattern configuration after exposure and in addition an excellent etching resistance could be obtained by using a polymer containing a hydroxy styrene or a hydroxy vinyl naphthalene that are substituted by an acid labile group in order to improve the dissolution contrast by lowering the acid diffusion and to increase the etching resistance, as a base resin for a positive resist composition, in particular for a chemically amplified positive resist composition.

The positive resist composition of the present invention shows particularly a high dissolution contrast of a resist film, a high sensitivity and resolution, a large exposure allowance, an excellent process applicability, a good pattern configuration after the exposure, particularly a small size difference between a dense pattern and a sparse pattern, and a further excellent etching resistance. Accordingly, the composition has an extremely high practicality because of these characteristics and is very useful as a resist composition for the VLSI manufacture or for a patterning material of a mask.

In the following, the present invention will further be explained specifically.

The positive resist composition in the present invention is characterized in that the positive resist composition contains at least, as a base resin, a polymer whose hydrogen atom of a phenolic hydroxide group is substituted by an acid labile group represented by the following general formula (1).

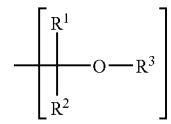

(In the formula, $R^1$ and $R^2$ each represent independently any of a hydrogen atom, and a linear, a branched, and a cyclic alkyl group having 1 to 6 carbon atoms. $R^3$ represents a fluorenyl group or a fluorenylmethyl group.)

Further, it is preferable that the polymer be the one whose hydrogen atom of a phenolic hydroxide group is substituted by an acid labile group represented by the following general formula (2). Namely, the acid labile group represented by the general formula (1) may be the one represented by the following general formula (2).

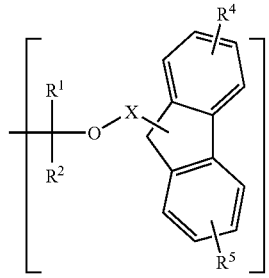

(In the formula, $R^1$ and $R^2$ represent the same meanings as before. $R^4$ and $R^5$ each represent independently any of a hydrogen atom, an alkyl group having 1 to 30 carbon atoms, an alkyl group a part of or all of whose hydrogen atoms are substituted by a halogen atom, an alkoxy group, an alkanoyl group, an alkoxycarbonyl group, an aryl group having 6 to 10 carbon atoms, and a halogen atom. X represents a single bond or a methylene group.)

And further, it is preferable that the positive resist composition of the present invention contains, as a base resin, a polymer having a repeating unit a1 of a hydroxy styrene whose hydrogen atom of the hydroxy group is substituted by the acid labile group represented by the general formula (1) or (2) and/or a repeating unit b1 of a hydroxy vinyl naphthalene substituted by the acid labile group represented by the general formula (1) or (2), and a repeating unit a2 and/or a repeating unit b2, as shown by the following general formula (3). Here, it is preferable that the polymer be the one that has the weight-average molecular weight of 1,000 to 500,000.

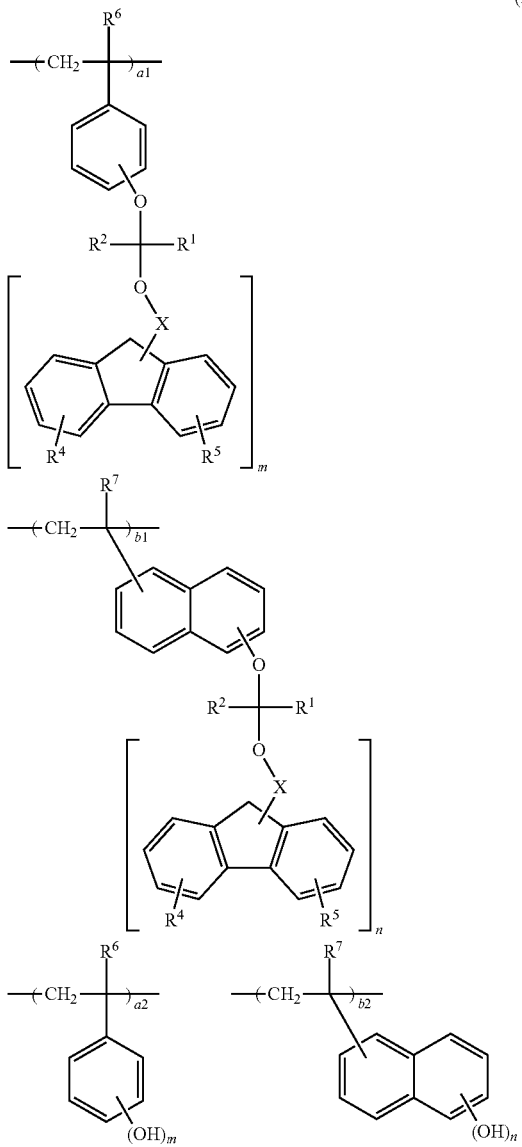

(3)

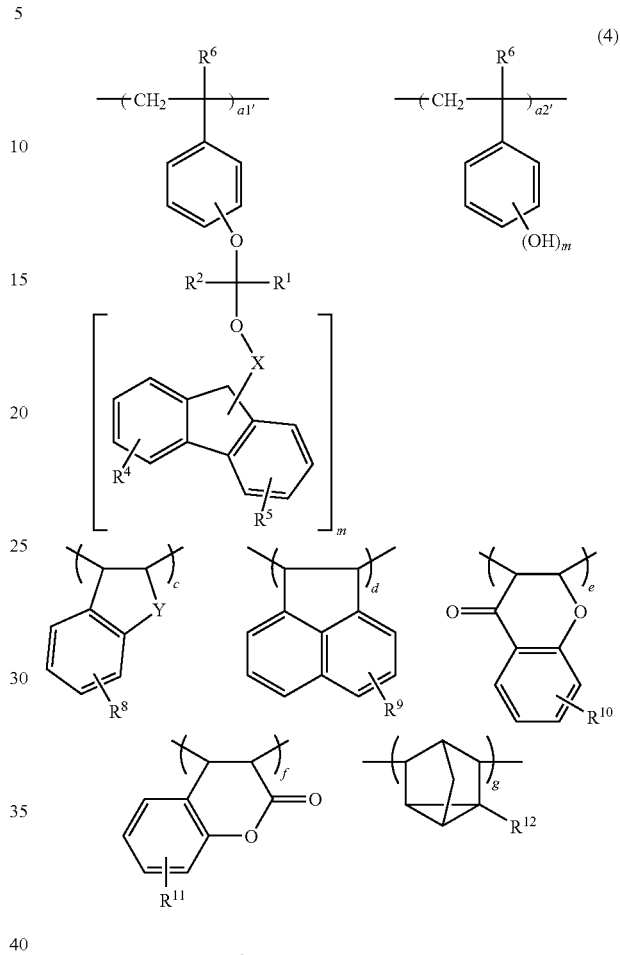

(4)

sented by the following general formula (4). Here, it is preferable that the polymer be the one that has the weight-average molecular weight of 1,000 to 500,000.

(In the formula, $R^6$ and $R^7$ each represent independently a hydrogen atom or a methyl group, and $R^1$ and $R^2$ represent the same meanings as before. $R^4$ and $R^5$ each represent independently any of a hydrogen atom, an alkyl group having 1 to 30 carbon atoms, an alkyl group a part of or all of whose hydrogen atoms are substituted by a halogen atom, an alkoxy group, an alkanoyl group, an alkoxycarbonyl group, an aryl group having 6 to 10 carbon atoms, and a halogen atom. X represents a single bond or a methylene group. Here, m and n represent 1 or 2, and $0 \leq a1/(a1+b1+a2+b2) \leq 0.5$, $0 \leq b1/(a1+b1+a2+b2) \leq 0.5$, and $0.05 \leq (a1+b1)/(a1+b1+a2+b2) \leq 0.5$.)

Further, the polymer contained in the resist composition of the present invention may also be the one that contains at least a repeating unit a1' of a hydroxy styrene substituted by the acid labile group represented by the general formula (1) or (2) and a repeating unit a2', and further contains one or more of repeating units selected from (c) an indene group and the like, (d) an acenaphthylene group, (e) a chromone group, (f) a cumarine group, and (g) a norbornadiene group, as repre- (In the formula, $R^6$ represents a hydrogen atom or a methyl group. $R^1$ and $R^2$ represent the same meanings as before. $R^4$ and $R^5$ each represent independently any of a hydrogen atom, an alkyl group having 1 to 30 carbon atoms, an alkyl group a part of or all of whose hydrogen atoms are substituted by a halogen atom, an alkoxy group, an alkanoyl group, an alkoxycarbonyl group, an aryl group having 6 to 10 carbon atoms, and a halogen atom. X represents a single bond or a methylene group. $R^8$ to $R^{12}$ each represent independently any of a hydrogen atom, an alkyl group having 1 to 30 carbon atoms, an alkyl group a part of or all of whose hydrogen atoms are substituted by a halogen atom, a hydroxy group, an alkoxy group, an alkanoyl group, an alkoxycarbonyl group, an aryl group having 6 to 10 carbon atoms, a halogen atom, and a 1,1,1,3,3,3-hexafluoro-2-propanol group. Y represents a methylene group, an oxygen atom, or a sulfur atom. Here, m represents 1 or 2, and $0<a1'/(a1'+a2'+c+d+e+f+g) \leq 0.5$, $0 \leq a2'/(a1'+a2'+c+d+e+f+g) \leq 0.9$, $0 \leq c/(a1'+a2'+c+d+e+f+g) \leq 0.5$, $0 \leq d/(a1'+a2'+c+d+e+f+g) \leq 0.5$, $0 \leq e/(a1'+a2'+c+d+e+f+g) \leq 0.5$, $0 \leq f/(a1'+a2'+c+d+e+f+g) \leq 0.5$, $0 \leq g/(a1'+a2'+c+d+e+f+g) \leq 0.5$, and $0.03 \leq (c+d+e+f+g)/(a1'+a2'+c+d+e+f+g) \leq 0.4$.)

Accordingly, it is preferable that the polymer in the present invention contain, as the repeating unit containing the acid labile group, either one or both of a repeating unit of a hydroxy styrene whose hydrogen atom at the hydroxy group is substituted by the acid labile group as shown by a1 and a1' and a repeating unit of a hydroxy vinyl naphthalene whose hydrogen atom at the hydroxy group is substituted by the acid labile group as shown by b1. Further, it may be possible to copolymerize additionally a repeating unit h of a (meth)acrylate ester substituted by the acid labile group represented by the following general formula (5) or a repeating unit i that is substituted by the acid labile group $R^{17}$ other than those represented by the general formulae (1) and (2).

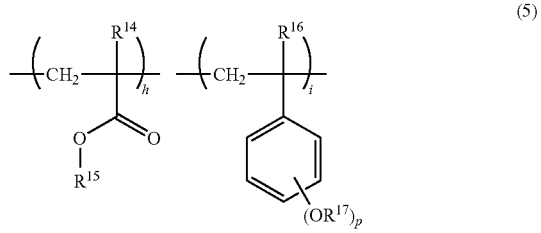

(5)

(In the formula, $R^{14}$ and $R^{16}$ represent a hydrogen atom or a methyl group. $R^{15}$ represents the acid labile group, and $R^{17}$ represents the acid labile group other than those represented by the general formulae (1) and (2). Here, p represents 1 or 2, and $0 \leq (h+i)/(a1+a2+b1+b2+c+d+e+f+g+h+i) \leq 0.7$.)

As the copolymerizable repeating units other than the repeating units a1, a2, b1, b2, c, d, e, f, g, h, and i, there may be mentioned styrene, vinyl naphthalene, vinyl anthracene, vinyl pyrene, indole, norbornene, tricyclodecene, tetracyclododecene, methylene indane, a lactone-containing (meth) acrylate, (meth)acrylic acid, 3-hydroxyadamantane (meth) acrylate ester, maleic anhydride, itaconic anhydride, a maleimide, a vinyl ether, and the like. In addition, an acid-generating onium salt containing a polymerizable olefin group may also be copolymerized. In the Japanese Publication of Unexamined Application No. 4-230645, 2005-84365, and 2006-045311, a sulfonium salt containing a polymerizable olefin that can liberate a specific sulfonic acid and an iodonium salt are proposed, and in the Japanese Publication of Unexamined Application No. 2006-178317, a sulfonium salt whose sulfonic acid is directly bonded to a main chain is proposed.

In the present invention, for example, repeating units j1, j2, and j3 that contain a sulfonium salt represented by the following general formula (6) may be copolymerized.

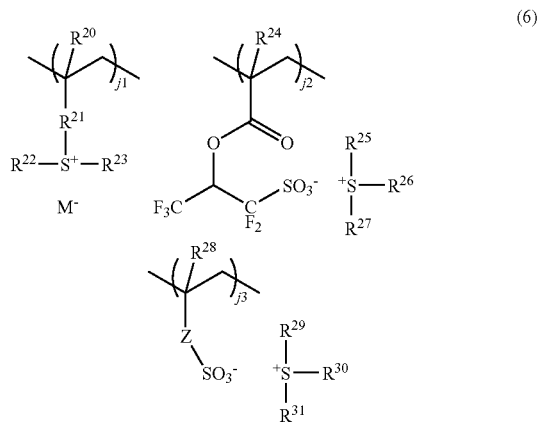

(6)

(In the formula, $R^{20}$, $R^{24}$, $R^{28}$ represent a hydrogen atom or a methyl group. $R^{21}$ represents a phenylene group, an —O—$R^{28}$— group, or a —C(=O)—$Y_1$—$R^{28'}$— group. $Y_1$ represents an oxygen atom or an NH group, and $R^{28}$ represents a linear, a branched, or a cyclic alkylene group having 1 to 6 carbon atoms, a phenylene group, and a alkenylene group, and may contain a carbonyl group, an ester group, an ether group, or a hydroxy group. $R^{22}$, $R^{23}$, $R^{25}$, $R^{26}$, $R^{27}$, $R^{29}$, $R^{30}$ and $R^{31}$ represent the same or different linear, branched, or cyclic alkyl group having 1 to 12 carbon atoms, and may contain a carbonyl group, an ester group, or an ether group, or represent an aryl group having 6 to 12 carbon atoms, an aralkyl group having 7 to 20 carbon atoms, or a thiophenyl group. Z represents a single bond, a methylene group, an ethylene group, a phenylene group, a fluorinated phenylene group, an —O—$R^{32'}$— group, or a —C(=O)-$Z_1$-$R^{32'}$— group. $Z_1$ represents an oxygen atom or an NH group, and $R^{32'}$ represents a linear, a branched, or a cyclic alkylene group having 1 to 6 carbon atoms, a phenylene group, or a alkenylene group, and may contain a carbonyl group, an ester group, an ether group, or a hydroxy group. $M^-$ represents a non-nucleophilic counter ion.)

The $M^-$ non-nucleophilic counter ion may be exemplified by a halide ion such as a chloride ion, a bromide ion, and the like; a fluoroalkyl sulfonate such as triflate, 1,1,1-trifluoroethane sulfonate, nonafluorobutane sulfonate, and the like; an aryl sulfonate such as tosylate, benzene sulfonate, 4-fluorobenzene sulfonate, 1,2,3,4,5-pentafluorobenzene sulfonate, and the like; a alkyl sulfonate such as mesylate, butane sulfonate, and the like; an imidic acid such as bis(trifluoromethylsulfonyl)imide, bis(perfluoroethylsulfonyl)imide, bis (perfluorobutylsulfonyl)imide, and the like; and a methide acid such as tris(trifluoromethylsulfonyl)methide, tris(perfluoroethylsulfonyl)methide, and the like.

The distribution of an acid generator in a resist film is uniformity and edge roughness of a resist pattern after developing is improved by copolymerizing an acid generator as a repeating unit.

Further, by a short diffusion length of an acid, j2 and j3, whose main chain of the polymer has a sulfo group, have the merit of improving the degree of resolution in a fine patterning.

Many groups may be selected for the acid labile groups $R^{15}$ and $R^{17}$ that are represented by the general formula (5). They may be the same or different, and specifically a group substituted by the following formulae (A-1) to (A-3) may be exemplified.

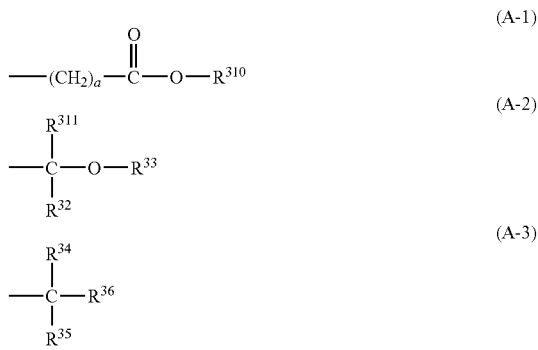

In the formula (A-1), $R^{310}$ represents a tertiary alkyl group having 4 to 20 carbon atoms, preferably 4 to 15 carbon atoms, a trialkyl silyl group whose each alkyl group has 1 to 6 carbon atoms, an oxoalkyl group having 4 to 20 carbon atoms, or a group represented by the above general formula (A-3). Specific examples of the tertiary alkyl group include a tert-butyl group, a tert-amyl group, a 1,1-diethylpropyl group, a 1-ethylcyclopentyl group, a 1-butylcyclopentyl group, a 1-ethylcyclohexyl group, a 1-butylcyclohexyl group, a 1-ethyl-2-cyclopentenyl group, a 1-ethyl-2-cyclohexenyl group, a 2-methyl-2-adamantyl group, and the like. Specific examples of the trialkyl silyl group include a trimethyl silyl group, a triethyl silyl group, a dimethyl-tert-butyl silyl group, and the like. Specific examples of the oxoalkyl group include a 3-oxocyclohexyl group, a 4-methyl-2-oxooxane-4-yl group, a 5-methyl-2-oxooxolane-5-yl group, and the like. Here, represents an integer of 0 to 6.

In the formula (A-2), $R^{311}$ and $R^{32}$ each represent independently any of a hydrogen atom, or a linear, a branched, or a cyclic alkyl group having 1 to 18 carbon atoms, preferably 1 to 10 carbon atoms such as, specifically, a methyl group, an ethyl group, a propyl group, an isopropyl group, a n-butyl group, a sec-butyl group, a tert-butyl group, a cyclopentyl group, a cyclohexyl group, a 2-ethylhexyl group, a n-octyl group, and the like. $R^{33}$ represents a monovalent hydrocarbon group having 1 to 18 carbon atoms and preferably 1 to 10 carbon atoms, which may contain a hetero atom such as an oxygen atom and the like, and there may be mentioned a linear, a branched, or a cyclic alkyl group, a part of whose hydrogen atoms may be substituted by a hydroxy group, an alkoxy group, an oxo group, an amino group, an alkylamino group, and the like. Specific example of them may be a substituted alkyl group as shown below.

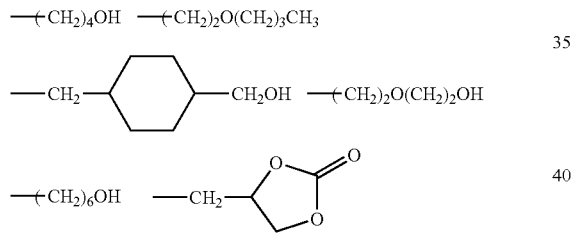

Further, $R^{311}$ and $R^{32}$, $R^{311}$ and $R^{33}$, and $R^{32}$ and $R^{33}$ may be bonded to form a ring together with the carbon atoms to, which they are bonded, and when forming the ring, $R^{311}$, $R^{32}$ and $R^{33}$ each represent a linear or a branched alkylene group having 1 to 18 carbon atoms, preferably 1 to 10 carbon atoms, and the ring has preferably 3 to 10 carbon atoms, particularly 4 to 10 carbon atoms.

Specific examples of the acid labile group in the formula (A-1) include tert-buthoxy carbonyl group, a tert-buthoxy carbonyl methyl group, a tert-amyloxy carbonyl group, a tert-amyloxy carbonyl methyl group, a 1,1-diethylpropyloxy carbonyl group, a 1,1-diethylpropyloxy carbonyl methyl group, a 1-ethylcyclopentyloxy carbonyl group, a 1-ethylcyclopentyloxy carbonyl methyl group, a 1-ethyl-2-cyclopentenyloxy carbonyl group, a 1-ethyl-2-cyclopentenyloxy carbonyl methyl group, a 1-ethoxyethoxy carbonyl methyl group, a 2-tetrahydropyranyloxy carbonyl methyl group, a 2-tetrahydrofuranyloxy carbonyl methyl group, and the like.

Further, there may also be mentioned substituent groups represented by the following formulae (A-1)–1 to (A-1)-10.

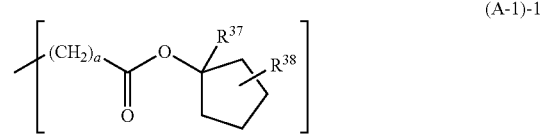

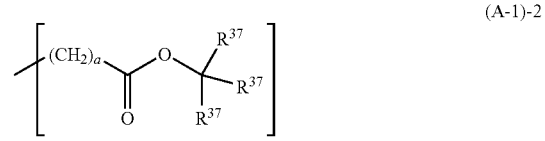

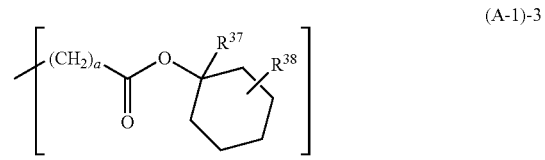

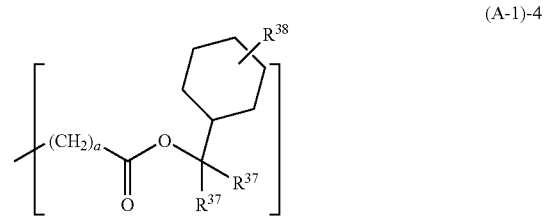

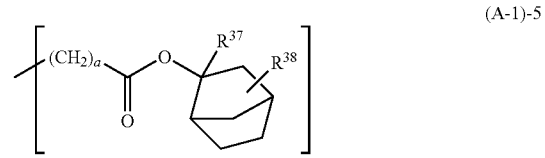

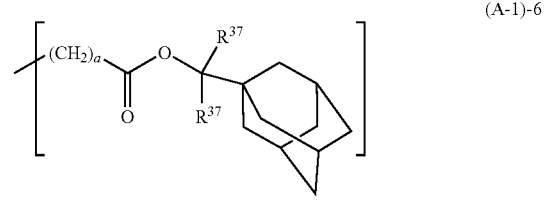

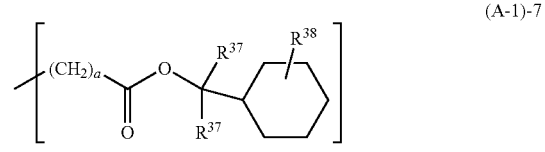

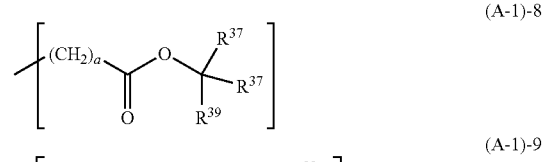

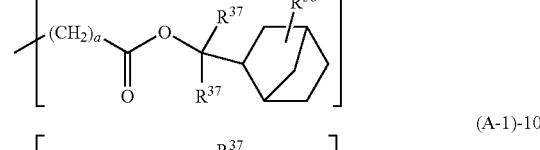

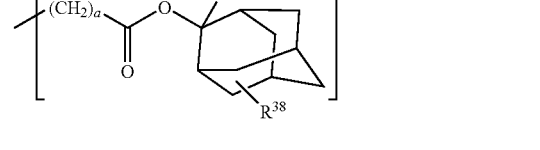

Here, a represents the same meaning as before. Each $R^{37}$ represents the same or different linear, branched, or cyclic alkyl group having 1 to 10 carbon atoms, or an aryl group having 6 to 20 carbon atoms. $R^{38}$ represents a hydrogen atom, or a linear, a branched, or a cyclic alkyl group having 1 to 10 carbon atoms.

Further, each $R^{39}$ represents the same or different linear, branched, or cyclic alkyl group having 2 to 10 carbon atoms, or an aryl group having 6 to 20 carbon atoms.

Among the acid labile group represented by the formula (A-2), the linear or the branched group may be exemplified by the groups shown by the following formulae (A-2)-1 to (A-2)-17.

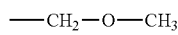 (A-2)-1

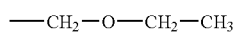 (A-2)-2

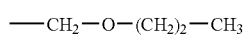 (A-2)-3

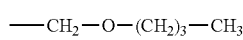 (A-2)-4

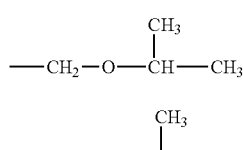 (A-2)-5

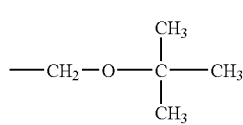 (A-2)-6

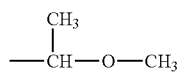 (A-2)-7

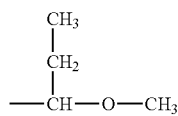 (A-2)-8

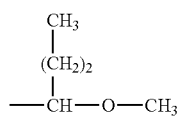 (A-2)-9

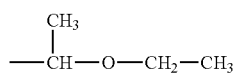 (A-2)-10

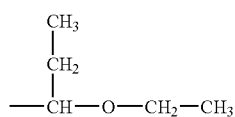 (A-2)-11

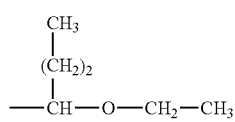 (A-2)-12

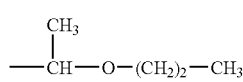 (A-2)-13

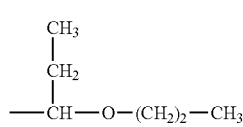 (A-2)-14

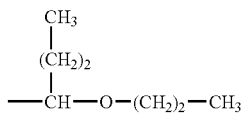 (A-2)-15

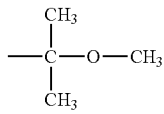 (A-2)-16

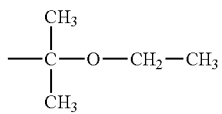 (A-2)-17

Further, among the acid labile groups represented by the formula (A-2), the cyclic group may be exemplified by a tetrahydrofurane-2-yl group, a 2-methyltetrahydrofurane-2-yl group, a tetrahydropyrane-2-yl group, a 2-methyltetrahydropyrane-2-yl group, and the like. Further, among the acid labile groups represented by the formula (A-2), the ring-containing group may also be exemplified by the groups shown by the following (A-2)-18 to (A-2)-35.

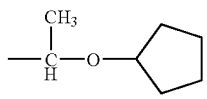 (A-2)-18

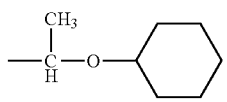 (A-2)-19

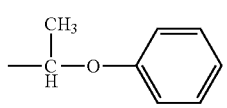 (A-2)-20

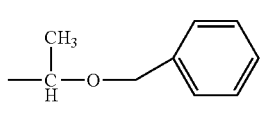 (A-2)-21

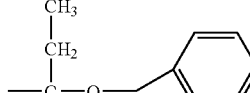 (A-2)-22

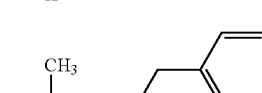 (A-2)-23

 (A-2)-24

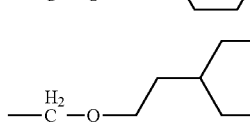 (A-2)-25

-continued (A-2)-26 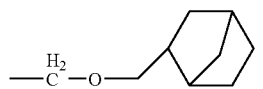

(A-2)-27 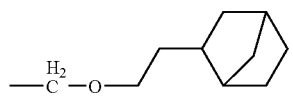

(A-2)-28 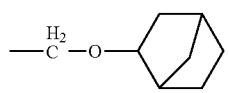

(A-2)-29 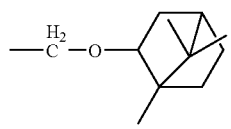

(A-2)-30 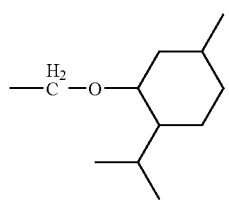

(A-2)-31 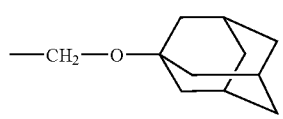

(A-2)-32 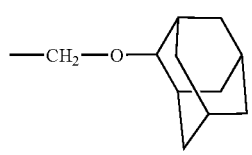

(A-2)-33 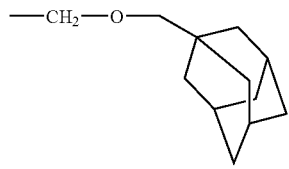

(A-2)-34 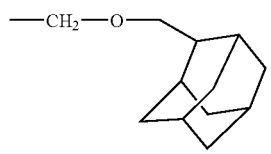

-continued (A-2)-35 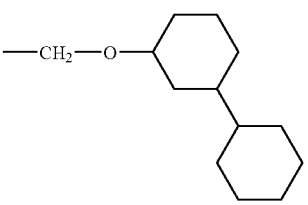

In addition, the base resin may be crosslinked intramolecularly or intermolecularly by the acid labile groups represented by the general formula (A-2a) or (A-2b).

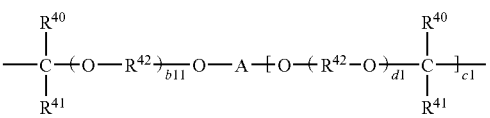
(A-2a)

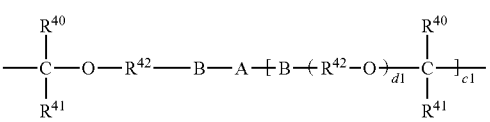
(A-2b)

In the above formulae, $R^{40}$ and $R^{41}$ represent a hydrogen atom, or a linear, a branched, or a cyclic alkyl group having 1 to 8 carbon atoms. Here, $R^{40}$ and $R^{41}$ may be bonded to form a ring together with the carbon atoms to, which they are bonded, and when forming the ring, $R^{40}$ and $R^{41}$ represent a linear or a branched alkylene group having 1 to 8 carbon atoms. $R^{42}$ represents a linear, a branched, or a cyclic alkylene group having 1 to 10 carbon atoms. b11 and d1 represent 0 or a integer of 1 to 10, preferably 0 or an integer of 1 to 5, and c represents an integer of 1 to 7. Further, A represents an aliphatic or an alicyclic (c1+1)-valent saturated hydrocarbon group having 1 to 50 carbon atoms, an aromatic hydrocarbon group, or a heterocyclic group. These groups may be intervened by a hetero atom, or a part of the hydrogen atoms attached to their carbon atom may be substituted by a hydroxy group, a carboxyl group, a carbonyl group, or a fluorine atom. Also, B represents a —CO—O— group, a —NHCO—O— group, or a —NHCONH— group.

In this case, A is preferably a linear, a branched, or a cyclic 2- to 4-valent alkylene group having 1 to 20 carbon atoms, an alkyl triyl group, an alkyl tetrayl group, and an arylene group having 6 to 30 carbon atoms. These groups may be intervened by a hetero atom, and a part of the hydrogen atoms attached to their carbon atom may be substituted by a hydroxy group, a carboxyl group, an acyl group, or a halogen atom. Here, c1 represents preferably an integer of 1 to 3.

The crosslinkable acetal groups represented by the formulae (A-2a) and (A-2b) may be specifically exemplified by the groups shown by the formulae (A-2)-37 to (A-2)-44.

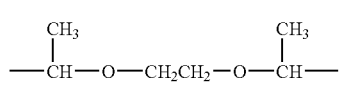 (A-2)-37

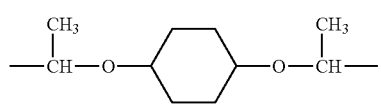 (A-2)-38

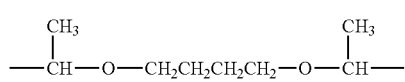 (A-2)-39

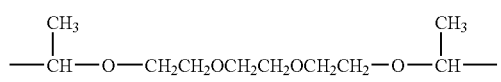 (A-2)-40

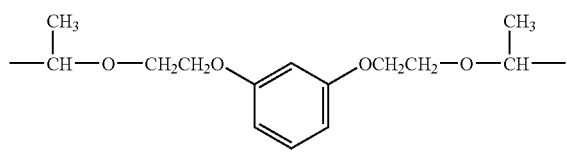 (A-2)-41

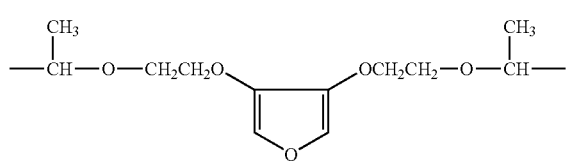 (A-2)-42

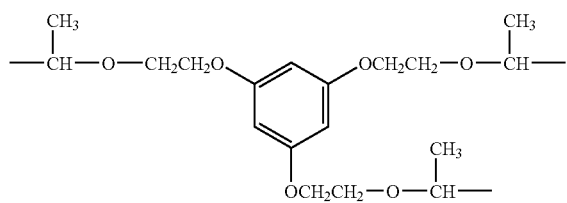 (A-2)-43

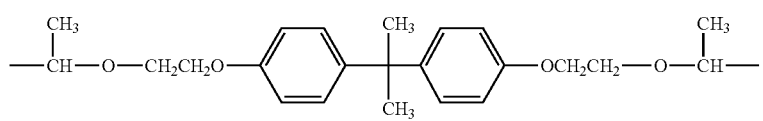 (A-2)-44

Further, in the formula (A-3), $R^{34}$, $R^{35}$ and $R^{36}$ represent a linear, a branched, or a cyclic monovalent alkyl group having 1 to 20 carbon atoms and the like, and may contain a hetero atom such as an oxygen atom, a sulfur atom, a nitrogen atom, a fluorine atom, and the like. $R^{34}$ and $R^{35}$, $R^{34}$ and $R^{36}$, and $R^{35}$ and $R^{36}$ may be bonded with each other to form a ring having 3 to 20 carbon atoms together with the carbon atoms to, which they are bonded.

The tertiary alkyl group represented by the formula (A-3) may be exemplified by a tert-butyl group, a triethyl carbyl group, a 1-ethylnorbonyl group, a 1-methylcyclohexyl group, a 1-ethylcyclopentyl group, a 2-(2-methyl)adamantly group, a 2-(2-ethyl)adamantly group, a tert-amyl group, and the like.

Further, the tertiary alkyl group may be specifically exemplified by the groups shown by the following formulae (A-3)-1 to (A-3)-18.

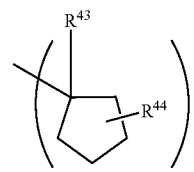 (A-3)-1

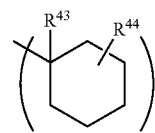 (A-3)-2

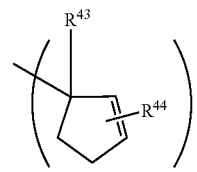 (A-3)-3

-continued
(A-3)-4 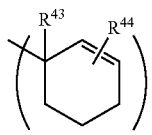
(A-3)-5 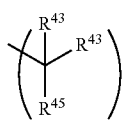
(A-3)-6 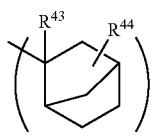
(A-3)-7 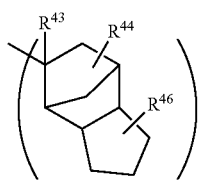
(A-3)-8 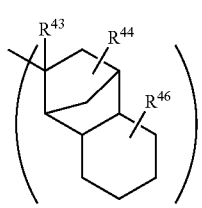
(A-3)-9 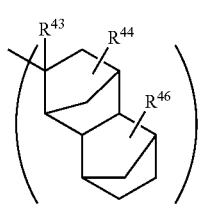
(A-3)-10 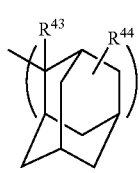
(A-3)-11 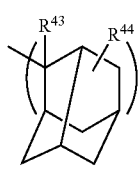
(A-3)-12 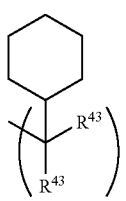
(A-3)-13 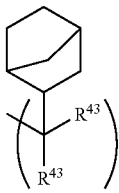
(A-3)-14 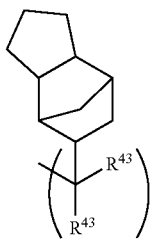
(A-3)-15 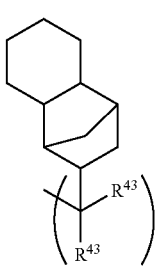
(A-3)-16 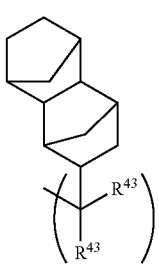
(A-3)-17 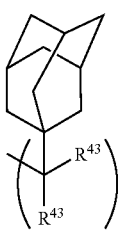
(A-3)-18 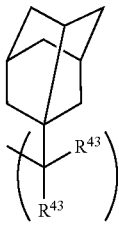
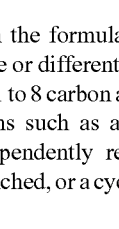
In the formulae (A-3)-1 to (A-3)-18, $R^{43}$ represents the same or different linear, branched, or cyclic alkyl group having 1 to 8 carbon atoms, or an aryl group having 6 to 20 carbon atoms such as a phenyl group and the like. $R^{44}$ and $R^{46}$ independently represent a hydrogen atom, or a linear, a branched, or a cyclic alkyl group having 1 to 20 carbon atoms.

$R^{45}$ represents an aryl group having 6 to 20 carbon atoms such as a phenyl group and the like.

Further, as shown by the following formulae (A-3)-19 and (A-3)-20, a polymer may be crosslinked intramolecularly or intermolecularly by $R^{47}$ having the valency of 2 or more, including an alkylene group and an arylene group.

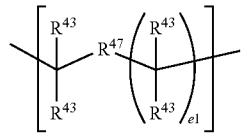

(A-3)-19

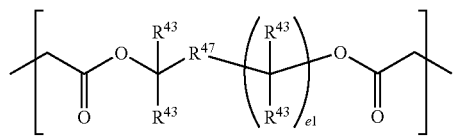

(A-3)-20

In the formulae (A-3)-19 and (A-3)-20, $R^{43}$ represents the same meaning as before. $R^{47}$ represents a linear, a branched, or a cyclic alkylene group having 1 to 20 carbon atoms, or an arylene group such as a phenylene group and the like, and may contain a hetero atom such as an oxygen atom, a sulfur atom, a nitrogen atom, and the like. Here, e1 represents an integer of 1 to 3.

$R^{300}$, $R^{33}$ and $R^{36}$ in the formulae (A-1), (A-2), (A-3) may be exemplified by; a substituted or non-substituted aryl group such as an alkoxy-substitute phenyl group and the like, namely a phenyl group, a p-methylphenyl group, a p-ethylphenyl group, a p-methoxyphenyl group, and the like; an aralkyl group such as a benzyl group, a phenetyl group, and the like; an alkyl group or an oxoalkyl group shown by the below formulae, namely the groups containing an oxygen atom, the group whose hydrogen atom attached to a carbon atom is substituted by a hydroxy group, and the group whose two hydrogen atoms are substituted by an oxygen atom to form a carbonyl group.

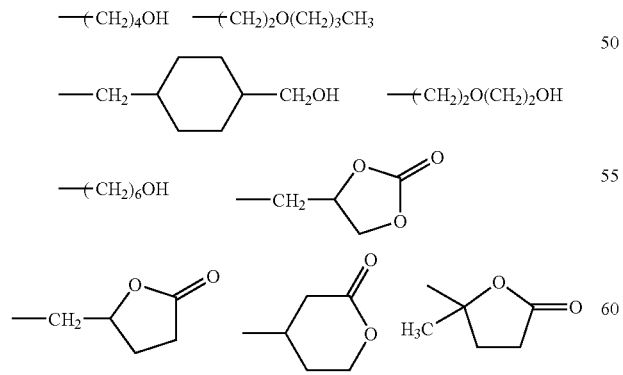

As the acid labile group of (A-3), a repeating unit of a (meth)acrylate ester having the exo structure as shown by the following A-3-21 may be cited as a preferable example.

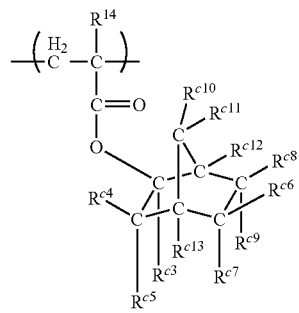

A-3-21

(In the formula, $R^{14}$ represents the same meanings as before. $R^{c3}$ represents a linear, a branched, or a cyclic alkyl group having 1 to 8 carbon atoms, or an aryl group having 6 to 20 carbon atoms optionally substituted. $R^{c4}$ to $R^{c9}$, $R^{c12}$, and $R^{c13}$ each represent independently a hydrogen atom, or a monovalent hydrocarbon group having 1 to 15 carbon atoms, which may contain a hetero atom. $R^{c10}$ and $R^{c11}$ represent a hydrogen atom. Alternatively, $R^{c4}$ and $R^{c5}$, $R^{c6}$ and $R^{c8}$, $R^{c6}$ and $R^{c9}$, $R^{c7}$ and $R^{c9}$, $R^{c7}$ and $R^{c13}$, $R^{c8}$ and $R^{c12}$, $R^{c10}$ and $R^{c11}$, or $R^{c11}$ and $R^{c12}$ may form a ring with each other, and in that case they represent a divalent hydrocarbon group having 1 to 15 carbon atoms, which may contain a hetero atom. Further, $R^{c4}$ and $R^{c13}$, $R^{c10}$ and $R^{c13}$, or $R^{c6}$ and $R^{c8}$ may form a double bond by a direct bond between groups connected to neighboring carbons. $R^{c14}$ represents a hydrogen atom, or a linear, a branched, or a cyclic alkyl group having 1 to 15 carbon atoms. Furthermore, the formula also represents its mirror image.)

Here, an ester monomer to obtain a repeating unit having the exo structure shown in the general formula A-3-21 is disclosed in the Japanese Publication of Unexamined Application No. 2000-327633.

Specific examples may be cited in the following, but not limited by them.

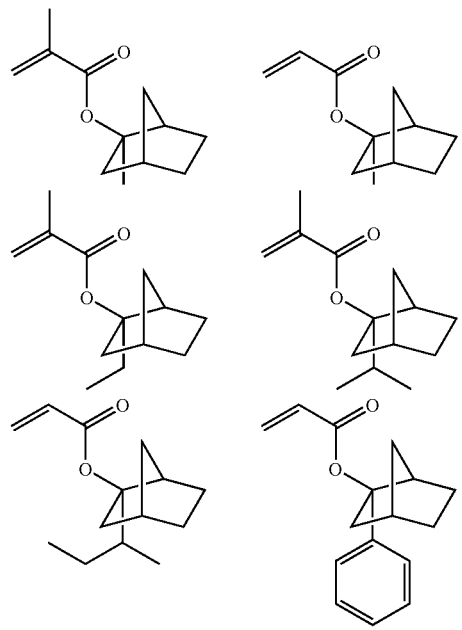

-continued

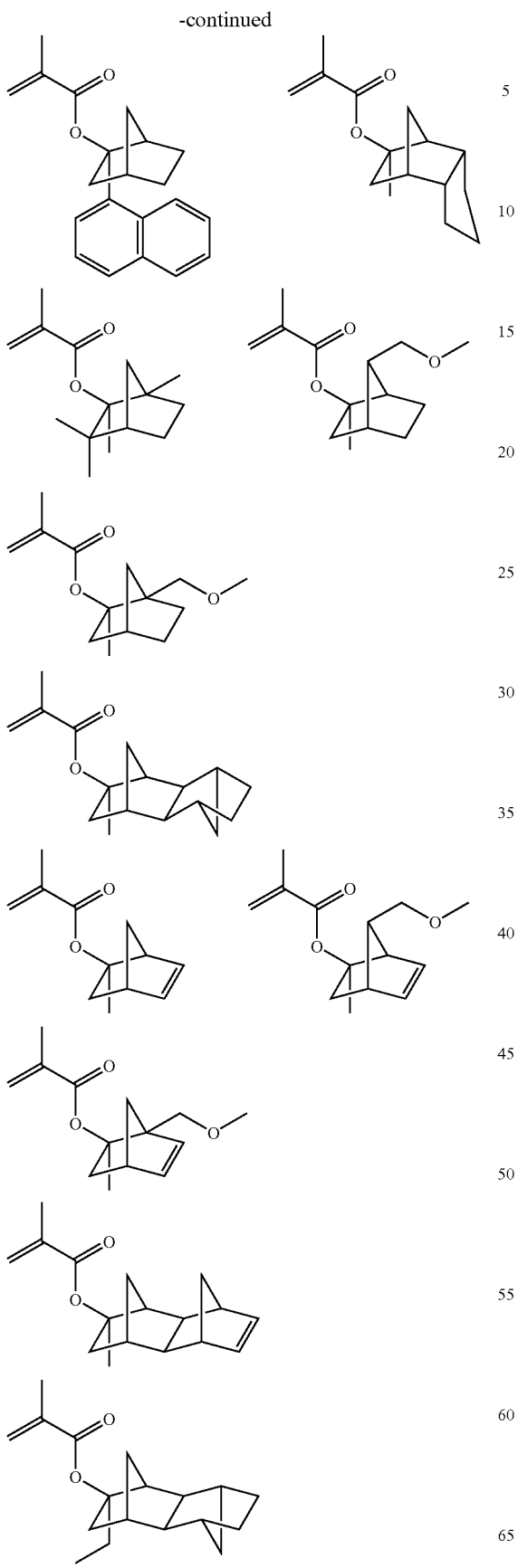

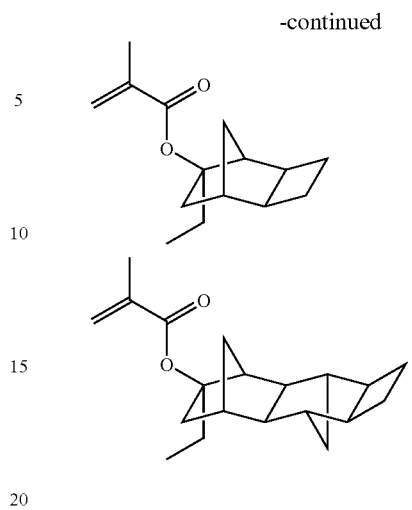

Further, the acid labile groups shown in (A-3) may be exemplified by the acid labile group having a (meth)acrylate ester, which contains a furane diyl group, a tetrahydrofurane diyl group, or an oxanorbornane diyl group, as shown by A-3-22.

A-3-22

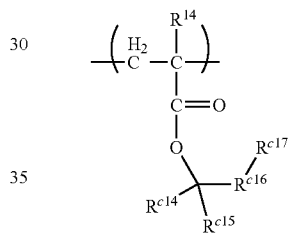

(In the formula, $R^{14}$ represents the same meaning as before. $R^{c14}$ and $R^{c15}$ each represent independently a linear, a branched, or a cyclic monovalent hydrocarbon group having 1 to 10 carbon atoms. Alternatively, $R^{c14}$ and $R^{c15}$ may form an aliphatic hydrocarbon ring, by bonding with each other, together with the carbon atoms to, which they are bonding. $R^{c16}$ represents a divalent group selected from a furane diyl group, a tetrahydrofurane diyl group, and an oxanorbornane diyl group. $R^{c17}$ represents a hydrogen atom, or a linear, a branched, or a cyclic monovalent hydrocarbon group having 1 to 10 carbon atoms optionally containing a hetero atom.)

The monomers to obtain a repeating unit, which is substituted by the acid labile group and contains a furane diyl group, a tetrahydrofurane diyl group, or an oxanorbornane diyl group may be exemplified by the following.

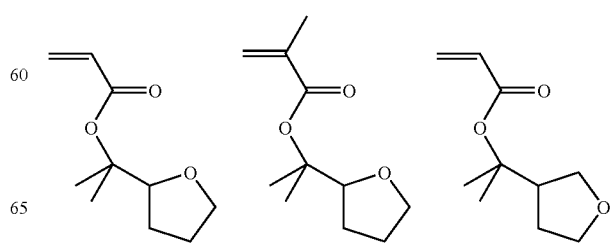

-continued
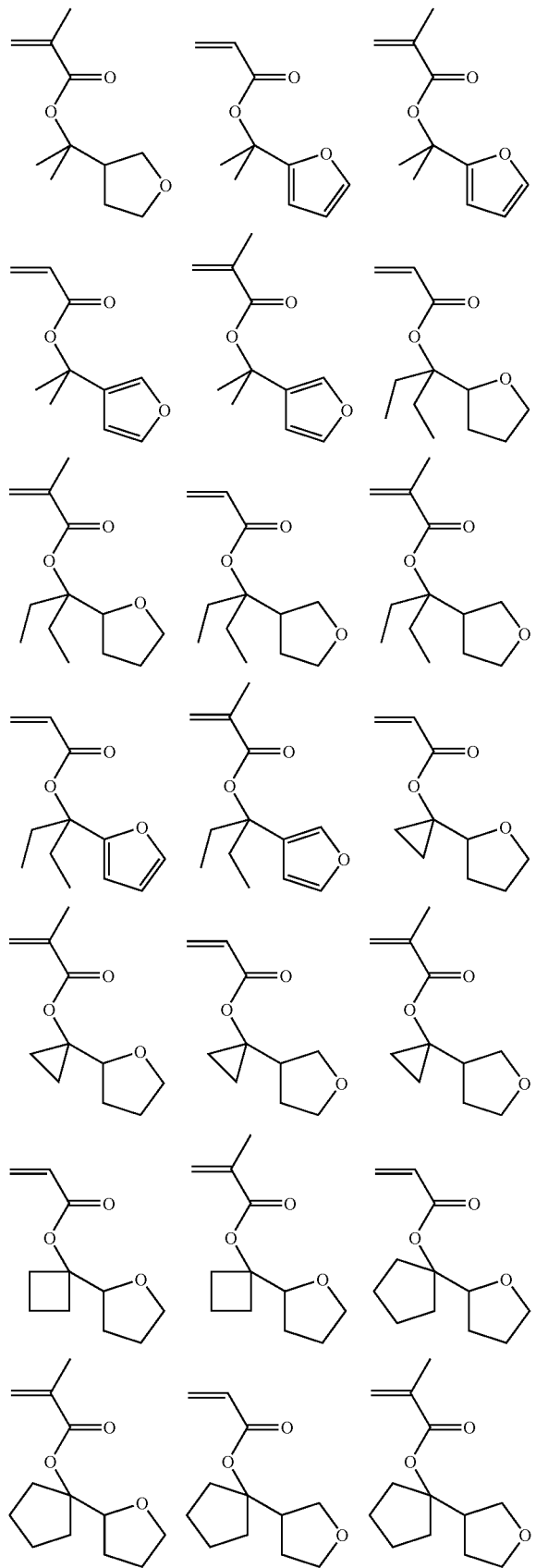
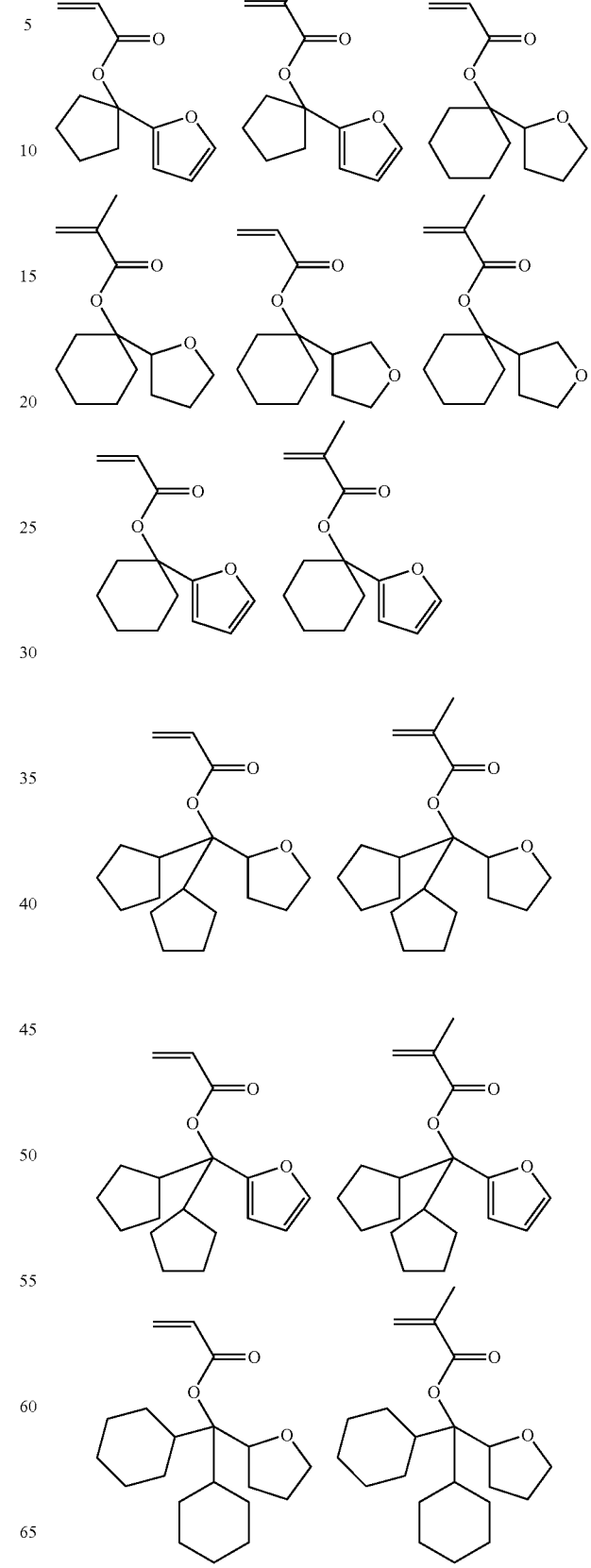

-continued
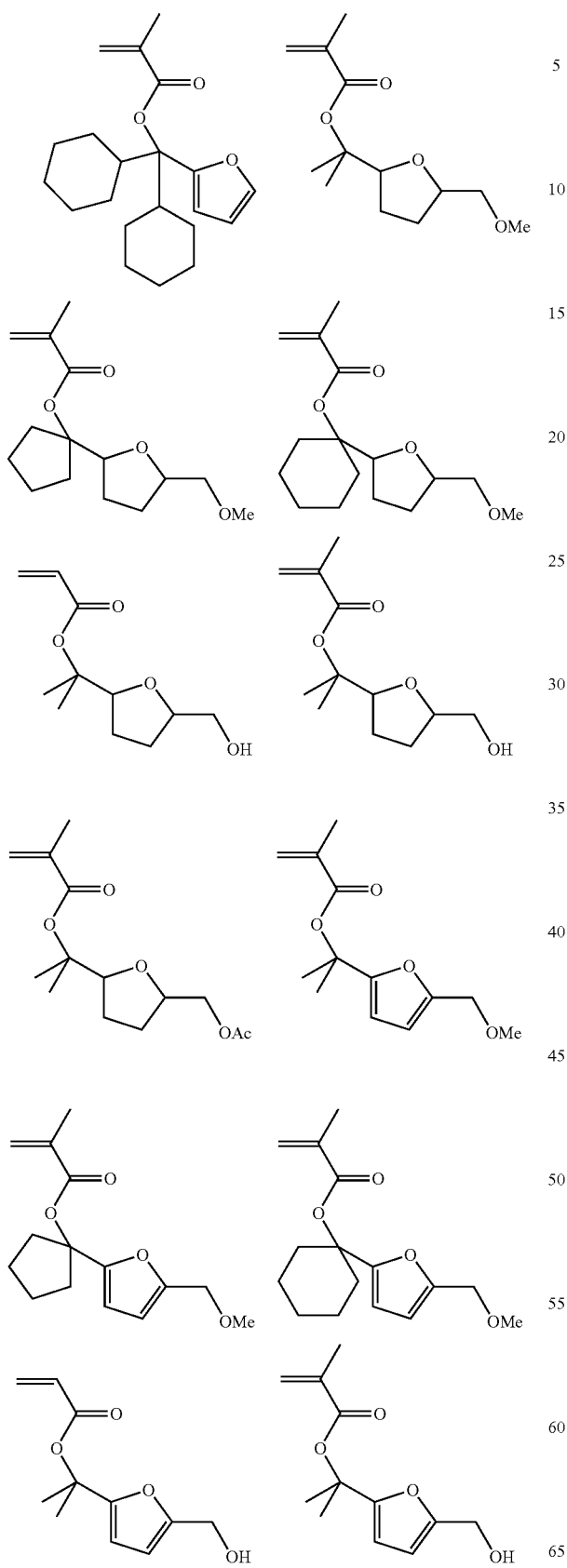
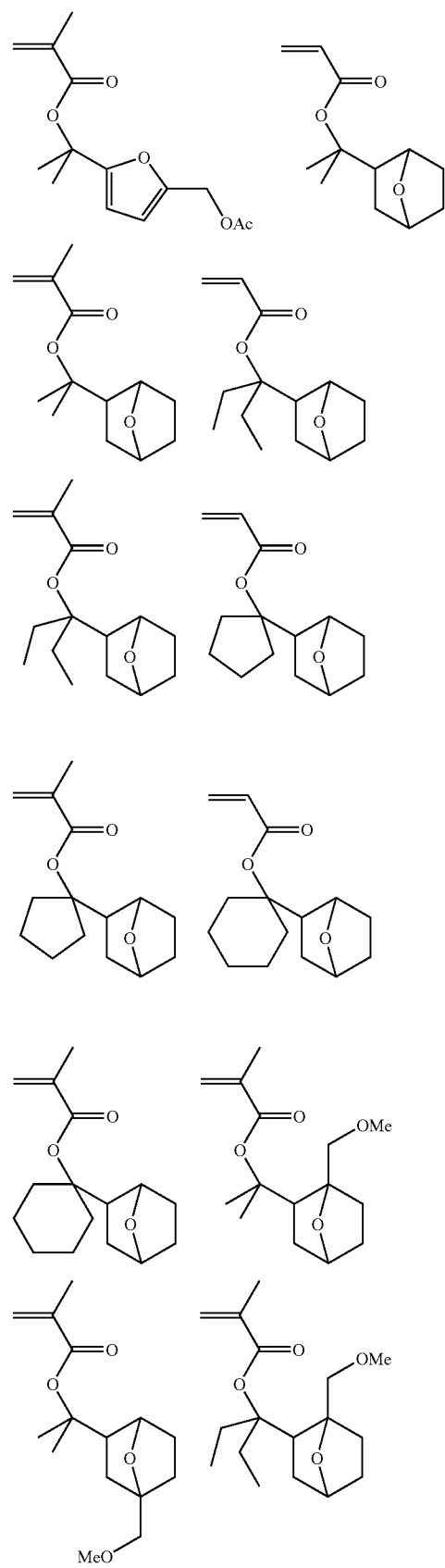

-continued

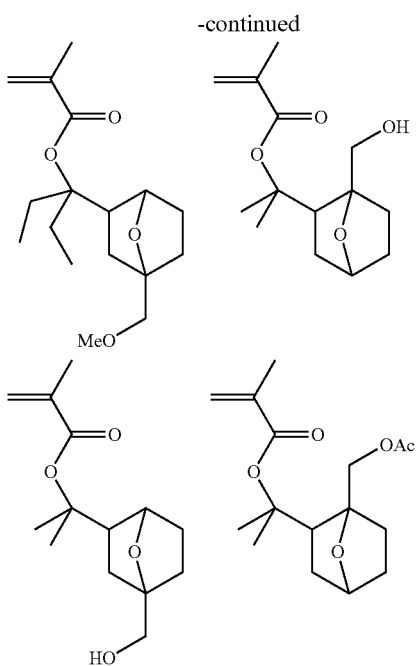

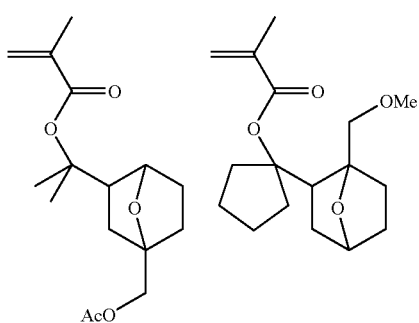

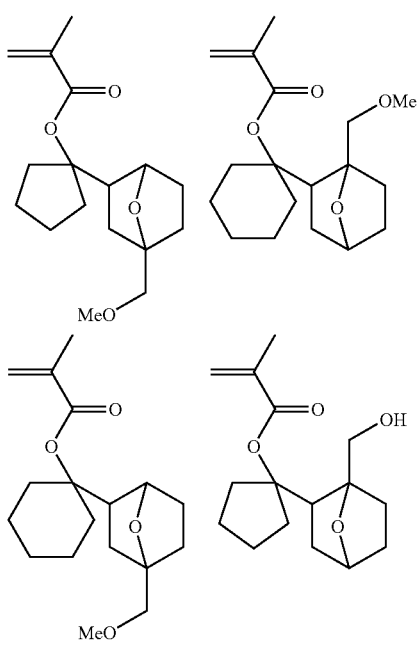

-continued

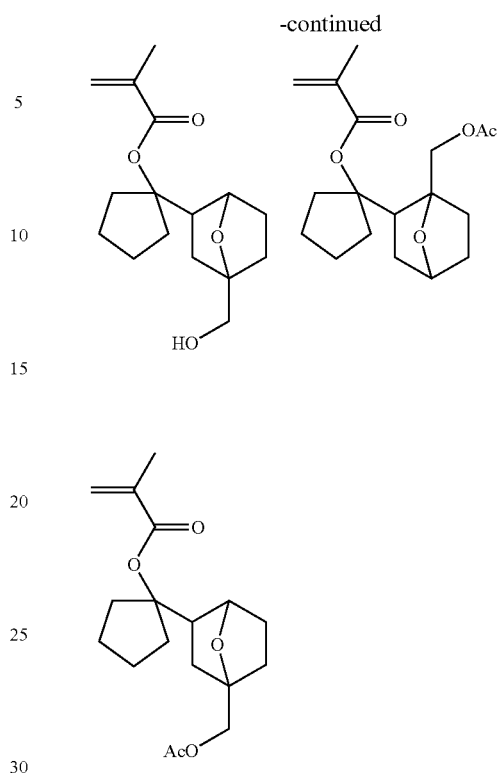

One exemplary method for synthesizing a polymer for a base resin of the positive resist composition in the present invention may be following: a hydroxy styrene substituted by the acid labile group shown by the following formula Ma1, a hydroxy vinyl naphthalene substituted by the acid labile group shown by the following formula Mb1, and other monomer are heated for a thermal polymerization by adding a radical polymerization initiator in an organic solvent to obtain a polymer as a copolymer.

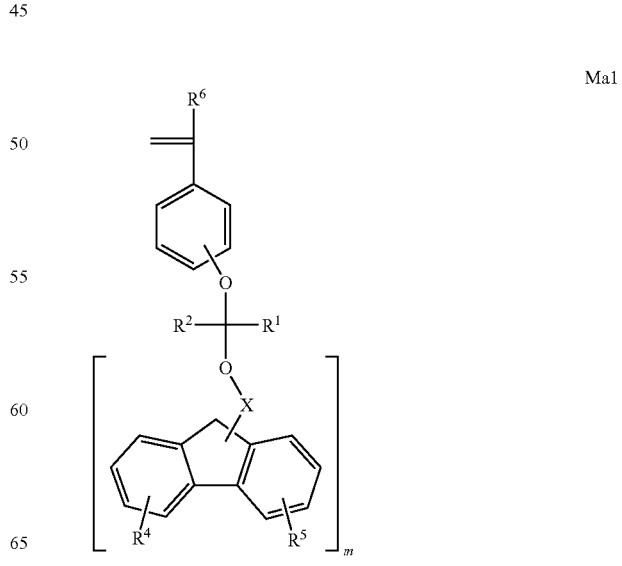

Ma1

-continued

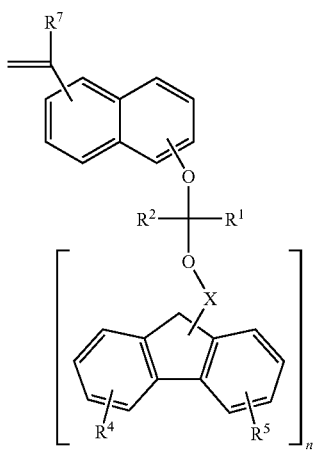

Mb1

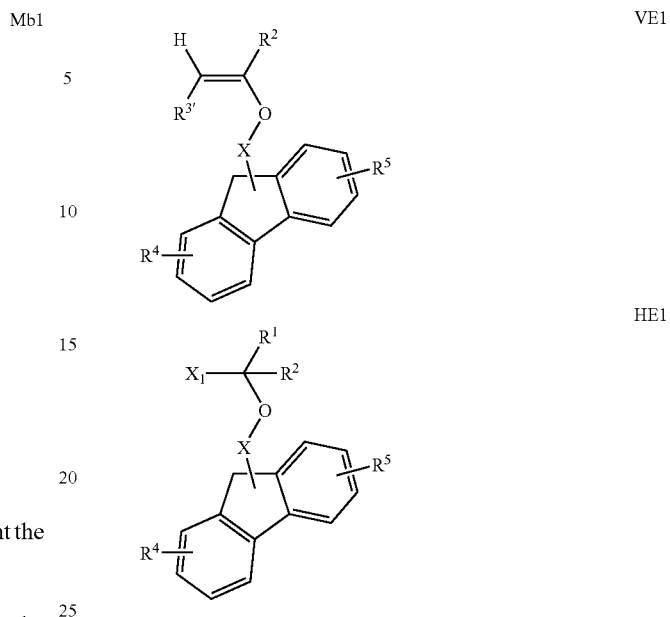

(In the formulae, $R^1$, $R^2$, $R^4$ to $R^7$, m, n, and X represent the same meanings as before.)

The solvents to be used in the polymerization may be exemplified by toluene, benzene, tetrahydrofurane, diethyl ether, dioxane, and the like. The polymerization initiators may be exemplified by 2,2'-azobisisobutyronitrile (AIBN), 2,2'-azobis(2,4-dimethylvaleronitrile), dimethyl 2,2-azobis (2-methylpropionate), benzoyl peroxide, lauroyl peroxide, and the like. The polymerization may be done by heating at 50 to 80° C. The reaction time is 2 to 100 hours, and preferably 5 to 20 hours.

It may also be possible to polymerize a hydroxy styrene or a hydroxy vinyl naphthalene, which is then followed by substitution by the acid labile group represented by the general formulae (1) and (2).

In addition, there may also be a method to use, in stead of a hydroxy styrene or a hydroxy vinyl naphthalene, an acetoxy styrene or an acetoxy vinyl naphthalene, wherein the acetoxy group is deprotected by the above-mentioned alkaline hydrolysis after the polymerization to obtain a poly(hydroxy styrene) or a poly(hydroxy vinyl naphthalene).

The basic compound for the alkaline hydrolysis may be exemplified by an aqueous ammonium, triethylamine, and the like. The reaction temperature is −20 to 100° C., and preferably 0 to 60° C. The reaction time is 0.2 to 100 hours, and preferably 0.5 to 20 hours.

If the acid labile group is introduced to the phenolic hydroxide part after the separation of the polymer obtained, it is possible to obtain the polymer whose phenolic hydroxy group is partially protected by an alkoxyalkyl group by reacting the phenolic hydroxide group of the polymer with an alkenyl ether compound VE1 in the presence of an acid catalyst. Here, in the following formula of VE1, $R^1$, $R^2$, $R^4$, $R^5$, and X represent the same meanings as before, and $R^{3'}$ represents an alkyl group having a lesser content of $CH_2$ deducted from $R^1$.

Here, as the reaction solvent, a non-protonic polar solvent such as dimethyl formamide, dimethyl acetamide, tetrahydrofurane, ethyl acetate, and the like is preferable, and they may be used singly or in a mixture of two or more kinds. As the catalyst acid, hydrochloric acid, sulfuric acid, trifluoromethanesulfonic acid, p-toluenesulfonic acid, methanesulfonic acid, a pyridinium p-toluenesulfonate salt, and the like are preferable. Its use amount is preferably 0.1 to 10 mole % relative to 1 mole of the total hydroxide of the phenolic hydroxide in the polymer to be reacted. The reaction temperature is −20 to 100° C., and preferably 0 to 60° C. The reaction time is 0.2 to 100 hours, and preferably 0.5 to 20 hours.

Further, it is also possible to obtain the polymer whose phenolic hydroxy group is partially protected by an alkoxyalkyl group by reacting the polymer with a halogenated alkyl ether compound (above formula HE1) in the presence of a base. Here, in the above HE1 formula, $R^1$, $R^2$, $R^4$, $R^5$, and X represent the same meanings as before, and $X_1$ is selected from a chlorine atom, a bromine atom, and an iodine atom.

Here, as the reaction solvent, a non-protonic polar solvent such as acetonitrile, acetone, dimethyl formamide, dimethyl acetamide, tetrahydrofurane, dimethyl sulfoxide, and the like is preferable, and they may be used singly or in a mixture of two or more kinds. As the base, triethylamine, pyridine, diisopropylamine, potassium carbonate, and the like are preferable. Its use amount is preferably 10% or more by mole relative to 1 mole of the total hydroxide of the phenolic hydroxide in the polymer to be reacted. The reaction temperature is −50 to 100° C., and preferably 0 to 60° C. The reaction time is 0.5 to 100 hours, and preferably 1 to 20 hours.

The synthesis of VE1 may be done by adding acetylene to a hydroxyl fluorene.

As the synthetic method for HE1 whose $X_1$ is a chlorine atom, it may be obtained by adding hydrochloride to a vinyl ether in the obtained VE1.

However, the synthesis method is not limited by them.

The weight-average molecular weight of the polymer of the present invention is 1,000 to 500,000, and preferably 2,000 to 30,000. When the weight-average molecular weight is 1,000 or more, the resist composition is excellent in its heat resistance, and when it is 500,000 or less, there is a high alkali solubility, and less risk of a post development after the pattern is formed, thus this region is preferable.

Further, in the polymer of the present invention, the molecular weight distribution (Mw/Mn) of a multi-components copolymer is preferably 1.0 to 2.0, while a narrow range of 1.0 to 1.5 is more preferable. If the molecular weight distribution (Mw/Mn) of a multi-components copolymer is in this range, there is less risk of forming foreign spots on the pattern after exposure and less risk of deterioration of the pattern configuration, thus this range is preferable because the resist composition suitably useful for fine pattern size can be obtained.

Further, it may also be possible to blend two or more polymers having different component ratios, molecular weight distributions, and molecular weights.

The polymer of the present invention is suitable as the base resin for a positive resist composition. The positive resist composition obtained by blending this polymer as the base resin with an organic solvent, an acid generator, a dissolution inhibitor, a basic compound, a surfactant, and the like in an appropriate composition ratio depending on the purpose can accelerate the dissolution rate of the polymer into a development solution by a catalysis reaction in an exposed area. Therefore, it can make the positive resist composition having an extremely high sensitivity, a large exposure allowance, a good process applicability, a further excellent etching resistance in spite of a good pattern configuration after the exposure, a small sparse-dense size difference particularly owing to a depressed diffusion of an acid, a high practicality because of the above-mentioned advantages, and a high validity as the resist composition for a very-large-scale integrated circuit. Especially the positive resist composition a chemically amplified-positive resist composition utilizing an acid catalysis reaction by an acid generator contained therein has a high sensitivity and various further improved properties, and thus is extremely useful.

In addition, the degree of resolution can be further improved by blending a dissolution inhibitor into the positive resist composition, since the difference of dissolution rates between an exposed area and an unexposed area is further increased.

Furthermore, by adding a basic compound, for example, the diffusion rate of an acid in the resist film may be suppressed so that the degree of resolution may be further improved, and by adding a surfactant, the coating properties of the resist composition may be further improved or controlled.

Thus, the positive resist composition of the present invention may contain an organic solvent, a compound generating an acid by response to a high energy beam (an acid generator), and optionally a dissolution inhibitor, a basic compound, a surfactant, and other components. As an organic solvent to be used for the positive resist composition particularly for the chemically amplified positive resist composition, of the present invention, any organic solvents may be used as far as it can dissolve a base resin, an acid generator, and other additives, and the like. Such organic solvent may be exemplified by a ketone such as cyclohexanone, methyl 2-n-amyl ketone, and the like; an alcohol such as 3-methoxy butanol, 3-methyl-3-methoxy butanol, 1-methoxy-2-propanol, 1-ethoxy-2-propanol, and the like; an ether such as propyleneglycol monomethyl ether, ethyleneglycol monomethyl ether, propyleneglycol monoethyl ether, ethyleneglycol monoethyl ether, propyleneglycol dimethyl ether, diethyleneglycol dimethyl ether, and the like; an ester such as propyleneglycol monomethyl ether acetate, propyleneglycol monoethyl ether acetate, ethyl lactate, ethyl pilvate, butyl acetate, methyl 3-methoxypropionate, ethyl 3-ethoxypropionate, tert-butyl acetate, tert-butyl propionate, propyleneglycol mono-tert-butyl ether acetate, and the like; and a lactone such as γ-butyllactone and the like, but is not restricted by them.

These organic solvents may be used singly or in a mixture of two or more kinds. In the present invention, among these organic solvents, in view of the highest solubility of the acid generator contained in the resist components, diethyleneglycol dimethyl ether, 1-ethoxy-2-propanol, propyleneglycol monomethyl ether acetate, and a mixture thereof are preferably used.

The amount of the organic solvent to be used is preferably 200 to 1,000 parts by weight, and more preferably 400 to 800 parts by weight, relative to 100 parts by weight of the base resin (hereinafter "by weight" after "parts" is neglected in this document).

The acid generator blended in the positive resist composition of the present invention may be exemplified by:
(i) an onium salt represented by the following general formula (P1a-1), (P1a-2), or (P1b),
(ii) a diazomethane derivative represented by the following general formula (P2),
(iii) a glyoxime derivative represented by the following general formula (P3),
(iv) a bissulfone derivative represented by the following general formula (P4),
(v) a sulfonate ester of N-hydroxyimide compound represented by the following general formula (P5),
(vi) a β-ketosulfonic acid derivative,
(vii) a disulfone derivative,
(viii) a nitrobenzyl sulfonate derivative,
(ix) a sulfonate ester derivative, and the like.

(In the formula, $R^{101a}$, $R^{101b}$, and $R^{101c}$ each represent a linear, a branched, or a cyclic alkyl group, an alkenyl group, an oxoalkyl group or an oxoalkenyl group having 1 to 12 carbon atoms, an aryl group having 6 to 20 carbon atoms, or an aralkyl group or an aryloxoalkyl group having 7 to 12 carbon atoms, wherein a part or all of hydrogen atoms in these groups may be substituted by an alkoxy group and the like. $R^{101b}$ and $R^{101c}$ may form a ring, and when a ring is formed, $R^{101b}$ and $R^{101c}$ each represent an alkylene group having 1 to 6 carbon atoms. $K^-$ represents a non-nucleophilic counter ion.)

The above-mentioned $R^{101a}$, $R^{101b}$ and $R^{101c}$ may be the same or different, and specifically include, as the alkyl group, a methyl group, an ethyl group, a propyl group, an isopropyl group, a n-butyl group, a sec-butyl group, a tert-butyl group, a pentyl group, a hexyl group, a heptyl group, an octyl group, a cyclopentyl group, a cyclohexyl group, a cycloheptyl group, a cyclopropylmethyl group, a 4-methylcyclohexyl group, a cyclohexylmethyl group, a norbornyl group, an adamantyl group, and the like. The alkenyl group may be exemplified by a vinyl group, an allyl group, a propenyl group, a buthenyl group, a hexenyl group, a cyclohexenyl group, and the like. The oxoalkyl group may be exemplified by a 2-oxocyclopentyl group, 2-oxocyclohexyl group, and the like, and further by a 2-oxopropyl group, a 2-cyclopentyl-2-oxoethyl group, a 2-cyclohexyl-2-oxoethyl group, a 2-(4-methylcyclohexyl)-2-oxoethyl group, and the like. The aryl group may be exemplified by a phenyl group, a naphthyl group, and the like; an alkoxyphenyl group such as a p-methoxyphenyl group, a m-methoxyphenyl group, an o-methoxyphenyl group, an ethoxyphenyl group, a p-tert-buthoxyphenyl group, a m-tert-buthoxyphenyl group, and the like; an alkylphenyl group such as a 2-methylphenyl group, a 3-methylphenyl group, a 4-methylphenyl group, an ethylphenyl group, a 4-tert-butylphenyl group, a 4-butylphenyl group, a dimethylphenyl group, and the like; an alkylnaphthyl group such as a methylnaphthyl group, an ethylnaphthyl group, and the like; an alkoxynaphthyl group such as methoxynaphthyl group, an ethoxynaphtyl group, and the like; a dialkylnaphthyl group such as a dimethylnaphthyl group, a diethylnaphthyl group, and the like; a dialkoxynaphthyl group such as dimethoxynaphthyl group, a diethoxynaphthyl group, and the like; and others. The aralkyl group may be exemplified by a benzyl group, a phenylethyl group, a phenetyl group, and the like. The aryloxoalkyl group may be exemplified by a 2-aryl-2-oxoethyl group such as a 2-phenyl-2-oxoethyl group, a 2-(1-naphthyl)-2-oxoethyl group, a 2-(2-naphthyl)-2-oxoethyl group, and the like. The non-nucleophilic counter ion K$^-$ may be exemplified by a halide ion such as a chloride ion, a bromide ion, and the like; a fluoroalkyl sulfonate such as triflate, 1,1,1-trifluoroethane sulfonate, nonafluorobutane sulfonate, and the like; an aryl sulfonate such as tosylate, benzene sulfonate, 4-fluorobenzene sulfonate, 1,2,3,4,5-pentafluorobenzene sulfonate, and the like; an alkyl sulfonate such as mesylate, butane sulfonate, and the like; an imidic acid such as bis(trifluoromethylsulfonyl)imide, bis(perfluoroethylsulfonyl)imide, bis(perfluorobutylsulfonyl)imide, and the like; and a methide acid such as tris(trifluoromethylsulfonyl)methide, tris(perfluoroethylsulfonyl)methide, and the like; a sulfonate whose α-position is substituted by a fluorine atom as shown by the following general formula K-2, and a sulfonate whose α and β positions are substituted by a fluorine atom as shown by the following general formula K-1.

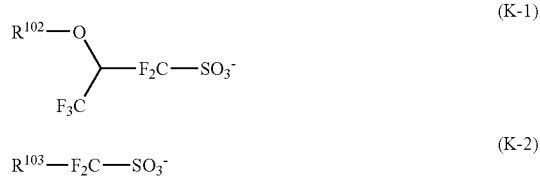

In the general formula (K-1), $R^{102}$ represents a hydrogen atom, a linear, a branched, or a cyclic alkyl group having 1 to 30 carbon atoms, an acyl group, an alkenyl group having 2 to 20 carbon atoms, an aryl group having 6 to 20 carbon atoms, or an aryloxy group, and may contain an ether group, an ester group, a carbonyl group, and a lactone ring. In the general formula (K-2), $R^{103}$ represents a hydrogen atom, a linear, a branched, or a cyclic alkyl group having 1 to 20 carbon atoms, an alkenyl group having 2 to 20 carbon atoms, or an aryl group having 6 to 20 carbon atoms, and may contain an ether group, an ester group, a carbonyl group, and a lactone ring.

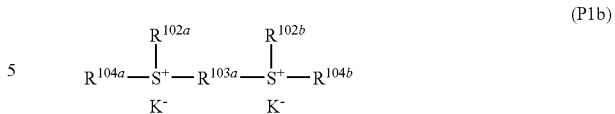

(In the formula, $R^{102a}$ and $R^{102b}$ each represent a linear, a branched, or a cyclic alkyl group having 1 to 8 carbon atoms. $R^{103a}$ represents a linear, a branched, or a cyclic alkylene group having 1 to 10 carbon atoms. $R^{104a}$ and $R^{104b}$ each represent a 2-oxoalkyl group having 3 to 7 carbon atoms. K$^-$ represents a non-nucleophilic counter ion.)

Specific examples of $R^{102a}$ and $R^{102b}$ include a methyl group, an ethyl group, a propyl group, an isopropyl group, a n-butyl group, a sec-butyl group, a tert-butyl group, a pentyl group, a hexyl group, a heptyl group, an octyl group, a cyclopentyl group, a cyclohexyl group, a cyclopropylmethyl group, a 4-methylcyclohexyl group, a cyclohexylmethyl group, and the like. Specific example of $R^{103a}$ include a methylene group, an ethylene group, a propylene group, a butylene group, a pentylene group, a hexylene group, a heptylene group, an octylene group, a nonylene group, a 1,4-cyclohexylene group, a 1,2-cyclohexylene group, a 1,3-cyclopentylene group, a 1,4-cyclooctylene group, a 1,4-cyclohexanedimethylene group, and the like. Examples of $R^{104a}$ and $R^{104b}$ include a 2-oxopropyl group, a 2-oxocyclopentyl group, a 2-oxocyclohexyl group, a 2-oxocycloheptyl group, and the like. K$^-$ may be exemplified by the same groups as those explained in the formulae (P1a-1) and (P1a-2).

(In the formula, $R^{105}$ and $R^{106}$ represent a linear, a branched, or a cyclic alkyl group or a halogenated alkyl group having 1 to 12 carbon atoms, an aryl group or a halogenated aryl group having 6 to 20 carbon atoms, or an aralkyl group having 7 to 12 carbon atoms.)

Examples of the alkyl group in $R^{105}$ and $R^{106}$ include a methyl group, an ethyl group, a propyl group, an isopropyl group, a n-butyl group, a sec-butyl group, a tert-butyl group, a pentyl group, a hexyl group, a heptyl group, an octyl group, an amyl group, a cyclopentyl group, a cyclohexyl group, a cycloheptyl group, a norbornyl group, an adamantyl group, and the like. Examples of the halogenated alkyl group include a trifluoromethyl group, a 1,1,1-trifluoroethyl group, a 1,1,1-trichloroethyl group, a nonafluorobutyl group, and the like. The aryl group may be exemplified by a phenyl group, an alkoxyphenyl group such as a p-methoxyphenyl group, a m-methoxyphenyl group, an o-methoxyphenyl group, an ethoxyphenyl group, a p-tert-buthoxyphenyl group, a m-tert-buthoxyphenyl group, and the like; and an alkylphenyl group such as a 2-methylphenyl group, a 3-methylphenyl group, a 4-methylphenyl group, an ethylphenyl group, a 4-tert-butylphenyl group, a 4-butylphenyl group, a dimethylphenyl group, and the like. The halogenated aryl group may be exemplified by a fluorophenyl group, a chlorophenyl group, a 1,2,3,4,5-pentafluorophenyl group, and the like. The aralkyl group may be exemplified by a benzyl group, a phenetyl group, and the like.

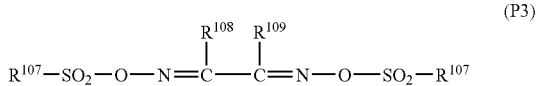

(P3)

(In the formula, $R^{107}$, $R^{108}$, and $R^{109}$ represent a linear, a branched, or a cyclic alkyl group or a halogenated alkyl group having 1 to 12 carbon atoms, an aryl group or a halogenated aryl group having 6 to 20 carbon atoms, or an aralkyl group having 7 to 12 carbon atoms. $R^{108}$ and $R^{109}$ may form a ring structure by bonding with each other, and when a ring structure is formed, $R^{108}$ and $R^{109}$ each represent a linear or a branched alkylene group having 1 to 6 carbon atoms.)

The alkyl group, the halogenated alkyl group, the aryl group, the halogenated aryl group, and the aralkyl group in $R^{107}$, $R^{108}$, and $R^{109}$ may be the same groups as those explained in $R^{105}$ and $R^{106}$. Here, the alkylene group in $R^{108}$ and $R^{109}$ may be exemplified by a methylene group, an ethylene group, a propylene group, a butylene group, a hexylene group, and the like.

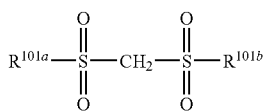

(P4)

(In the formula, $R^{101a}$ and $R^{101b}$ represent the same meanings as before.)

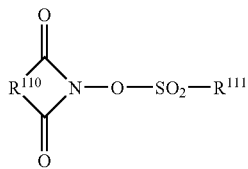

(P5)

(In the formula, $R^{110}$ represents an arylene group having 6 to 10 carbon atoms, an alkylene group having 1 to 6 carbon atoms, or an alkenylene group having 2 to 6 carbon atoms, wherein a part or all of hydrogen atoms in these groups may be further substituted by a linear or a branched alkyl group or an alkoxy group having 1 to 4 carbon atoms, a nitro group, an acetyl group, or a phenyl group. $R^{111}$ represents an alkyl group, an alkenyl group or an alkoxy alkyl group, linear, branched, or cyclic, having 1 to 8 carbon atoms, a phenyl group, or a naphthyl group, wherein a part of or all of hydrogen atoms in these groups may be substituted further by an alkyl group or an alkoxy group having 1 to 4 carbon atoms; a phenyl group optionally substituted by an alkyl group having 1 to 4 carbon atoms, an alkoxy group, a nitro group or an acetyl group; a heteroaromatic group having 3 to 5 carbon atoms; or a chlorine atom or a fluorine atom.

Here, the arylene group in $R^{110}$ may be exemplified by a 1,2-phenylene group, a 1,8-naphthylene group, and the like; the alkylene group may be exemplified by a methylene group, an ethylene group, a trimethylene group, a tetramethylene group, a phenylethylene group, a norbornane-2,3-diyl group, and the like; and the alkenylene group may be exemplified by a 1,2-vinylene group, a 1-phenyl-1,2-vinylene group, a 5-norbornene-2,3-diyl group, and the like. The alkyl group in $R^{111}$ represents the same meanings as $R^{101a}$ to $R^{101c}$. The alkenyl group may be exemplified by a vinyl group, a 1-propenyl group, an allyl group, a 1-buthenyl group, a 3-buthenyl group, an isoprenyl group, a 1-pentenyl group, a 3-pentenyl group, a 4-pentenyl group, a dimethylallyl group, a 1-hexenyl group, a 3-hexenyl group, a 5-hexenyl group, a 1-heptenyl group, a 3-heptenyl group, a 6-heptenyl group, a 7-octenyl group, and the like. The alkoxyalkyl group may be exemplified by a methoxymethyl group, an ethoxymethyl group, a propoxymethyl group, a buthoxymethyl group, a pentyloxymethyl group, a hexyloxymethyl group, a heptyloxymethyl group, a methoxyethyl group, an ethoxyethyl group, a propoxyethyl group, a buthoxyethyl group, a pentyloxyethyl group, a hexyloxyethyl group, a methoxypropyl group, an ethoxypropyl group, a propoxypropyl group, a buthoxypropyl group, a methoxybutyl group, an ethoxybutyl group, a propoxybutyl group, a methoxypentyl group, an ethoxypentyl group, a methoxyhexyl group, a methoxyheptyl group, and the like.

Here, the alkyl group having 1 to 4 carbon atoms optionally substituted may be exemplified by a methyl group, an ethyl group, a propyl group, an isopropyl group, a n-butyl group, an isobutyl group, a tert-butyl group, and the like; the alkoxy group having 1 to 4 carbon atoms may be exemplified by a methoxy group, an ethoxy group, a propoxy group, an isopropoxy group, a n-buthoxy group, an isobuthoxy group, a tert-buthoxy group, and the like; the phenyl group optionally substituted by an alkyl group having 1 to 4 carbon atoms, an alkoxy group, a nitro group, or an acetyl group may be exemplified by a phenyl group, a tollyl group, a p-tert-buthoxyphenyl group, a p-acetylphenyl group, a p-nitrophenyl group, and the like; the heteroaromatic group having 3 to 5 carbon atoms may be exemplified by a pyridyl group, a furyl group, and the like.

The onium salt may be exemplified by diphenyliodonium trifluoromethanesulfonate, (p-tert-buthoxyphenyl)phenyliodonium trifluoromethanesulfonate, diphenyliodonium p-toluenesulfonate, (p-tert-buthoxyphenyl)phenyliodonium p-toluenesulfonate, triphenylsulfonium trifluoromethanesulfonate, (p-tert-buthoxyphenyl)diphenylsulfonium trifluoromethanesulfonate, bis(p-tert-buthoxyphenyl)phenylsulfonium trifluoromethanesulfonate, tris(p-tert-buthoxyphenyl)sulfonium trifluoromethanesulfonate, triphenylsulfonium p-toluenesulfonate, (p-tert-buthoxyphenyl)diphenylsulfonium p-toluenesulfonate, bis(p-tert-buthoxyphenyl)phenylsulfonium p-toluenesulfonate, tris(p-tert-buthoxyphenyl)sulfonium p-toluenesulfonate, triphenylsulfonium nonafluorobutanesulfonate, triphenylsulfonium butanesulfonate, trimethylsulfonium trifluoromethanesulfonate, trimethylsulfonium p-toluenesulfonate, cyclohexylmethyl(2-oxocyclohexyl)sulfonium trifluoromethanesulfonate, cyclohexylmethyl(2-oxocyclohexyl)sulfonium p-toluenesulfonate, dimethylphenylsulfonium trifluoromethanesulfonate, dimethylphenylsulfonium p-toluenesulfonate, dicyclohexylphenylsulfonium trifluoromethanesulfonate, dicyclohexylphenylsulfonium p-toluenesulfonate, trinaphthylsulfonium trifluoromethanesulfonate, (2-norbonyl)methyl (2-oxocyclohexyl)sulfonium trifluoromethanesulfonate, ethylenebis[methyl(2-oxocyclopentyl)sulfonium trifluoromethanesulfonate], 1,2'-naphthylcarbonyl methyl tetrahydrothiophenium triflate, and the like.

The diazomethane derivative may be exemplified by bis(benzenesulfonyl)diazomethane, bis(p-toluenesulfonyl)diazomethane, bis(xylenesulfonyl)diazomethane, bis(cyclohexylsulfonyl)diazomethane, bis(cyclopentylsulfonyl)diazomethane, bis(n-butylsulfonyl)diazomethane, bis(isobutylsulfonyl)diazomethane, bis(sec-butylsulfonyl)diazomethane, bis(n-propylsulfonyl)diazomethane, bis (isopropylsulfonyl)diazomethane, bis(tert-butylsulfonyl)diazomethane, bis(n-amylsulfonyl)diazomethane, bis(isoamylsulfonyl)diazomethane, bis(sec-amylsulfonyl)diazomethane, bis(tert-amylsulfonyl)diazomethane, 1-cyclohexylsulfonyl-1-(tert-butylsulfonyl)diazomethane, 1-cyclohexylsulfonyl-1-(tert-amylsulfonyl)diazomethane, 1-tert-amylsulfonyl-1-(tert-butylsulfonyl)diazomethane, and the like.

The glyoxime derivative may be exemplified by bis-O-(p-toluenesulfonyl)-α-dimethyl glyoxime, bis-O-(p-toluenesulfonyl)-α-diphenyl glyoxime, bis-O-(p-toluenesulfonyl)-α-dicyclohexyl glyoxime, bis-O-(p-toluenesulfonyl)-2,3-pentanedione glyoxime, bis-O-(p-toluenesulfonyl)-2-methyl-3,4-pentanedione glyoxime, bis-O-(n-butanesulfonyl)-α-dimethyl glyoxime, bis-O-(n-butanesulfonyl)-α-diphenyl glyoxime, bis-O-(n-butanesulfonyl)-α-dicyclohexyl glyoxime, bis-O-(n-butanesulfonyl)-2,3-pentanedione glyoxime, bis-O-(n-butanesulfonyl)-2-methyl-3,4-pentanedione glyoxime, bis-O-(methanesulfonyl)-α-dimethyl glyoxime, bis-O-(trifluoromethanesulfonyl)-α-dimethyl glyoxime, bis-O-(1,1,1-trifluoroethanesulfonyl)-α-dimethyl glyoxime, bis-O-(tert-butanesulfonyl)-α-dimethyl glyoxime, bis-O-(perfluorooctanesulfonyl)-α-dimethyl glyoxime, bis-O-(cyclohexanesulfonyl)-α-dimethyl glyoxime, bis-O-(benzenesulfonyl)-α-dimethyl glyoxime, bis-O-(p-fluorobenzenesulfonyl)-α-dimethyl glyoxime, bis-O-(p-tert-butylbenzenesulfonyl)-α-dimethyl glyoxime, bis-O-(xylenesulfonyl)-α-dimethyl glyoxime, bis-O-(camphersulfonyl)-α-dimethyl glyoxime, and the like.

The bissulfone derivative may be exemplified by bisnaphthyl sulfonyl methane, bistrifluoromethyl sulfonyl methane, bismethyl sulfonyl methane, bisethyl sulfonyl methane, bispropyl sulfonyl methane, bisisopropyl sulfonyl methane, bis-p-toluene sulfonyl methane, bisbenzene sulfonyl methane, and the like.

The β-keto sulfone derivative may be exemplified by 2-cyclohexylcarbonyl-2-(p-toluenesulfonyl)propane, 2-isopropylcarbonyl-2-(p-toluenesulfonyl)propane, and the like.

The disulfone derivative may be exemplified by a diphenyl disulfone derivative, a dicyclohexyl disulfone derivative, and the like.

The nitrobenzyl sulfonate derivative may be exemplified by 2,6-dinitrobenzyl p-toluene sulfonate, 2,4-dinitrobenzyl p-toluene sulfonate, and the like.

The sulfonate ester derivative may be exemplified by 1,2,3-tris(methanesulfonyloxy)benzene, 1,2,3-tris(trifluoromethanesulfonyloxy)benzene, 1,2,3-tris(p-toluenesulfonyloxy)benzene, and the like.

Further, the sulfonate ester derivative of an N-hydroxyimide compound may be exemplified by N-hydroxysuccinimide methanesulfonate ester, N-hydroxysuccinimide trifluoromethanesulfonate ester, N-hydroxysuccinimide ethanesulfonate ester, N-hydroxysuccinimide 1-propanesulfonate ester, N-hydroxysuccinimide 2-propanesulfonate ester, N-hydroxysuccinimide 1-pentanesulfonate ester, N-hydroxysuccinimide 1-octanesulfonate ester, N-hydroxysuccinimide p-toluenesulfonate ester, N-hydroxysuccinimide p-methoxybenzenesulfonate ester, N-hydroxysuccinimide 2-chloroethanesulfonate ester, N-hydroxysuccinimide benzenesulfonate ester, N-hydroxysuccinimide 2,4,6-trimethylbenzenesulfonate ester, N-hydroxysuccinimide 1-naphthalenesulfonate ester, N-hydroxysuccinimide 2-naphthalenesulfonate ester, N-hydroxy-2-phenylsuccinimide methanesulfonate ester, N-hydroxymaleimide methanesulfonate ester, N-hydroxymaleimide ethanesulfonate ester, N-hydroxy-2-phenylmaleimide methanesulfonate ester, N-hydroxyglutarimide methanesulfonate ester, N-hydroxyglutarimide benzenesulfonate ester, N-hydroxyphthalimide methanesulfonate ester, N-hydroxyphthalimide benzenesulfonate ester, N-hydroxyphthalimide trifluoromethanesulfonate ester, N-hydroxyphthalimide p-toluenesulfonate ester, N-hydroxynaphthalimide methanesulfonate ester, N-hydroxynaphthalimide benzenesulfonate ester, N-hydroxy-5-norbornene-2,3-dicarboxylmide methanesulfonate ester, N-hydroxy-5-norbornene-2,3-dicarboxylmide trifluoromethanesulfonate ester, N-hydroxy-5-norbornene-2,3-dicarboxylmide p-toluenesulfonate ester, and the like.

Especially, the onium salt such as triphenylsulfonium trifluoromethanesulfonate, (p-tert-buthoxyphenyl)diphenylsulfonium trifluoromethanesulfonate, tris(p-tert-buthoxyphenyl)sulfonium trifluoromethanesulfonate, triphenylsulfonium p-toluenesulfonate, (p-tert-buthoxyphenyl)diphenylsulfonium p-toluenesulfonate, tris(p-tert-buthoxyphenyl)sulfonium p-toluenesulfonate, trinaphthylsulfonium trifluoromethanesulfonate, cyclohexylmethyl(2-oxocyclohexyl)sulfonium trifluoromethanesulfonate, (2-norbonyl)methyl(2-oxocyclohexyl)sulfonium trifluoromethanesulfonate, 1,2'-naphthylcarbonylmethyltetrahydrothiophenium triflate, and the like; the diazomethane derivative such as bis(benzenesulfonyl)diazomethane, bis(p-toluenesulfonyl)diazomethane, bis(cyclohexylsulfonyl)diazomethane, bis(n-butylsulfonyl)diazomethane, bis(isobutylsulfonyl)diazomethane, bis(sec-butylsulfonyl)diazomethane, bis(n-propylsulfonyl)diazomethane, bis(isopropylsulfonyl)diazomethane, bis(tert-butylsulfonyl)diazomethane, and the like; the glyoxime derivative such as bis-O-(p-toluenesulfonyl)-α-dimethyl glyoxime, bis-O-(n-butanesulfonyl)-α-dimethyl glyoxime, and the like; the bissulfone derivative such as bisnaphthyl sulfonyl methane and the like; the sulfonate ester derivatives of a N-hydroxyimide compound such as N-hydroxysuccinimide methanesulfonate ester, N-hydroxysuccinimide trifluoromethanesulfonate ester, N-hydroxysuccinimide 1-propanesulfonate ester, N-hydroxysuccinimide 2-propanesulfonate ester, N-hydroxysuccinimide 1-pentanesulfonate ester, N-hydroxysuccinimide p-toluenesulfonate ester, N-hydroxynaphthalimide methanesulfonate ester, N-hydroxynaphthalimide benzenesulfonate ester, and the like are preferably used.

Further, an acid generator of the oxime type shown by A2 in WO2004/074242 may be added.

Here, the acid generators as mentioned above may be used singly or in a combination of two or more kinds. The onium salt is effective for improvement in a rectangular shape, and the diazomethane derivative and the glyoxime derivative are effective for reduction of a standing wave, and thus a fine tuning of a profile may be possible by properly combining two of them.

The amount of the acid generator to be added is preferably 0.1 to 50 parts and more preferably 0.5 to 40 parts relative to 100 parts of the base resin. When the amount is 0.1 part or more, a high sensitivity and a high degree of resolution may be possible since the amount of the acid generated by a exposure is sufficient, while when 50 parts or less, a transmittance of a resist is not decreased, leading to less risk of deterioration of the degree of resolution, thus this range is preferable.

As the dissolution inhibitor to be added to the positive resist composition, in particular to the chemically amplified positive resist composition, of the present invention, a composition whose weight-average molecular weight is 100 to 1,000, preferably 150 to 800, and in addition, whose phenolic hydrogen atoms of 2 or more phenolic hydroxy groups contained in the molecule are substituted by the acid labile group by 0 to 100 mole % in average as a whole or whose caroboxylic acid hydrogen atom contained in the molecule is substituted by the acid labile group by 50 to 100 mole % in average as a whole is preferable.

Here, the substitution rate of the hydrogen atom of the phenolic hydroxy group by the acid labile group is 0 mole % or more in average and preferably 30 mole % or more relative to total phenolic hydroxy groups, while the upper limit is 100 mole % and preferably 80 mole %. The substitution rate of the hydrogen atom of the carboxy group by the acid labile group is 50 mole % or more in average and preferably 70 mole % or more, while the upper limit may be 100 mole %.

Here, the compound having 2 or more of the phenolic hydroxy group or the compound having the carboxy group is preferably a compound represented by the following formulae (D1) to (D14).

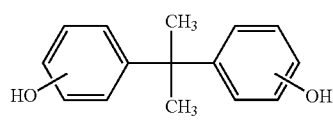
(D1)

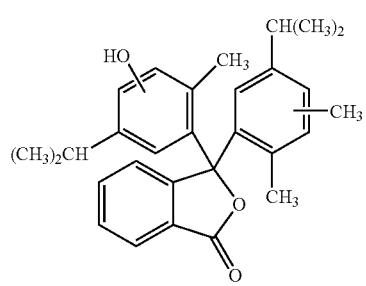
(D2)

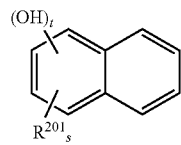
(D3)

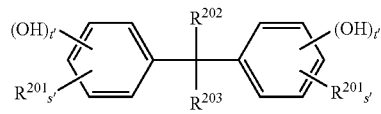
(D4)

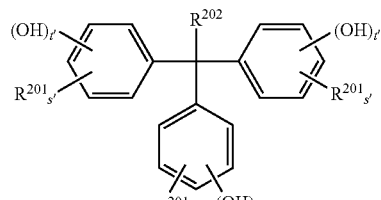
(D5)

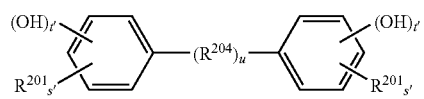
(D6)

-continued

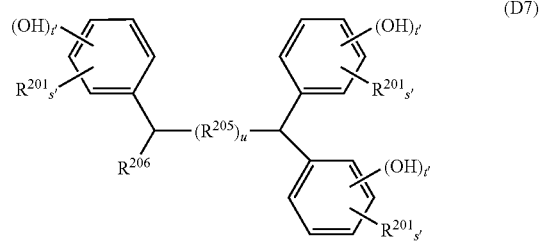
(D7)

(D8)

(D9)

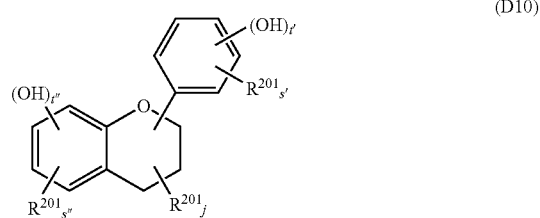
(D10)

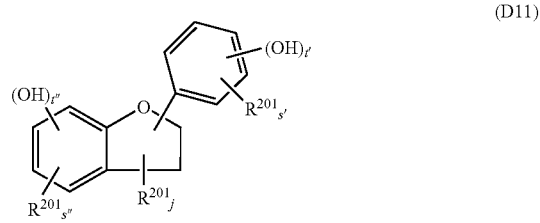
(D11)

(D12)

(D13)

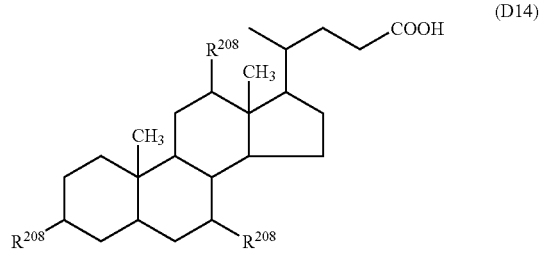
(D14)

Here, $R^{201}$ and $R^{202}$ each in the above formula represent a hydrogen atom, an alkyl group or an alkenyl group, linear or branched, having 1 to 8 carbon atoms. $R^{203}$ represents a hydrogen atom, an alkyl group or an alkenyl group, linear or branched, having 1 to 8 carbon atoms, or a —$(R^{207})_{h1}$COOH group. $R^{204}$ represents a —$(CH_2)_{i1}$— group (i1 represents 2 to 10), an arylene group having 6 to 10 carbon atoms, a carbonyl group, a sulfonyl group, an oxygen atom, or a sulfur atom. $R^{205}$ represents an alkylene group having 1 to 10 carbon atoms, an arylene group having 6 to 10 carbon atoms, a carbonyl group, a sulfonyl group, an oxygen atom, or a sulfur atom. $R^{206}$ represents a hydrogen atom, a linear or a branched alkyl group having 1 to 8 carbon atoms, an alkenyl group, or a phenyl group or a naphthyl group each substituted by a hydroxy group. $R^{207}$ represents a linear or a branched alkylene group having 1 to 10 carbon atoms. $R^{208}$ represents a hydrogen atom or a hydroxy group. Here, j represents an integer of 0 to 5; u and h1 represent 0 or 1; s, t, s', t', s", and t" satisfy following equations, namely, s+t=8, s'+t'=5, s"+t"=4, wherein the numbers are those giving at least one hydroxy group to each phenyl skeleton; α is the number that makes the weight-average molecular weight of the compounds (D8) and (D9) to be 100 to 1,000.

The amount of the dissolution inhibitor to be blended is 0 to 50 parts, preferably 5 to 50 parts, and further preferably 10 to 30 parts, relative to 100 parts of the base resin. It may be used singly or in a mixture of two or more kinds. The amount of 0 part or more relative to 100 parts of the base resin may improve the degree of resolution, and the amount of 50 parts or less may prevent a decrease of the degree of resolution from occurring because of less risk of the pattern film reduction, thus the above-mentioned range is preferable.

Further, the positive resist composition of the present invention may be added by a basic compound. It is preferable that the basic compound be the one, which can suppress a diffusion rate of the acid generated from the acid generator into a resist film. By blending the basic compound, it may be possible to suppress the diffusion rate of the acid in the resist film, leading to improve the degree of resolution, to suppress a sensitivity change after exposure, to reduce a dependency on a substrate and an environment, and to improve an exposure allowance, a pattern profile, and the like.

The basic compound may be exemplified by a primary, a secondary, and a tertiary aliphatic amine, a mixed amine, an aromatic amine, a heterocyclic amine, a compound containing nitrogen which has a carboxy group, a compound containing nitrogen which has a sulfonyl group, a compound containing nitrogen which has a hydroxy group, a compound containing nitrogen which has a hydroxyphenyl group, an alcoholic compound containing nitrogen, an amide derivative, an imide derivative, and the like.

Specific examples of the primary aliphatic amine include ammonia, methylamine, ethylamine, n-propylamine, isopropylamine, n-butylamine, isobutylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, tetraethylenepentamine, and the like. Specific examples of the secondary aliphatic amine includes dimethylamine, diethylamine, di-n-propylamine, diisopropylamine, di-n-butylamine, diisobutylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylene diamine, N,N-dimethylethylene diamine, N,N-dimethyltetraethylene pentamine, and the like. Specific examples of the tertiary aliphatic amine include trimethylamine, triethylamine, tri-n-propylamine, triisopropylamine, tri-n-butylamine, triisobutylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylene diamine, N,N,N',N'-tetramethylethylene diamine, N,N,N',N'-tetramethyltetraethylene pentamine, and the like.

The mixed amine may be exemplified by dimethylethylamine, methylethylpropylamine, benzylamine, phenetylamine, benzyldimethylamine, and the like.

Specific examples of the aromatic amine and the heterocyclic amine may be exemplified by an aniline derivative (such as aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, N,N-dimethyltoluidine, and the like), diphenyl(p-tolyl)amine, methyldiphenylamine, triphenylamine, phenylenediamine, naphthylamine, diaminonaphthalene, a pyrrole derivative (such as pyrrole, 2H-pyrrole, 1-methylpyrrole, 2,4-dimethylpyrrole, 2,5-dimethylpyrrole, N-methylpyrrole, and the like), a oxazole derivative (such as oxazole, isooxazole, and the like), a thiazole derivative (such as thiazole, isothiazole, and the like), an imidazole derivative (such as imidazole, 4-methylimidazole, 4-methyl-2-phenylimidazole, and the like), a pyrazole derivative, a furazan derivative, a pyrroline derivative (such as pyrroline, 2-methyl-1-pyrroline, and the like), a pyrrolidine derivative (such as pyrrolidine, N-methylpyrrolidine, pyrrolidinone, N-methylpyrrolidone, and the like), an imidazoline derivative, an imidazolidine derivative, a pyridine derivative (such as pyridine, methylpyridine, ethylpyridine, propylpyridine, butylpyridine, 4-(1-butylpentyl) pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, buthoxypyridine, dimethoxypyridine, 1-methyl-2-pyridine, 4-pyrrolidinopyridine, 1-methyl-4-phenylpyridine, 2-(1-ethylpropyl)pyridine, aminopyridine, dimethylaminopyridine, and the like), a pyridazine derivative, a pyrimidine derivative, a pyrazine derivative, a pirazoline derivative, a pyrazolidine derivative, a piperidine derivative, a piperazine derivative, a morpholine derivative, an indole derivative, an isoindole derivative, a 1H-indazole derivative, an indoline derivative, a quinoline derivative (such as quinoline, 3-quinolinecarbonitrile, and the like), an isoquinoline derivative, a cinnoline derivative, a quinazoline derivative, a quinoxaline derivative, a phthalazine derivative, a purine derivative, a pteridine derivative, a carbazole derivative, a phenanthridine derivative, an acridine derivative, a phenazine derivative, a 1,10-phenanthroline derivative, an adenine derivative, an adenosine derivative, a guanine derivative, a quanosine derivative, an uracil derivative, an uridine derivative, and the like.

Further, the compound containing nitrogen which has a carboxy group may be exemplified by amino benzoic acid, indole carboxylic acid, an amino acid derivative (such as nicotinic acid, alanine, arginine, aspartic acid, glutamic acid, glycine, histidine, isoleucine, glycyl leucine, leucine, methionine, phenylalanine, threonine, lysine, 3-aminopyrazine-2-carboxylic acid, and methoxy alanine), and the like. The compound containing nitrogen which has a sulfonyl group may be exemplified by 3-pyridinesulfonic acid, pyridinium p-toluenesulfonate, and the like. The compound containing nitrogen which has a hydroxy group, the compound containing nitrogen which has a hydroxyphenyl group, and the alcoholic compound containing nitrogen may be exemplified by 2-hydroxy pyridine, amino cresol, 2,4-quinoline diol, 3-indole methanol hydrate, monoethanol amine, diethanol amine, triethanol amine, N-ethyl diethanol amine, N,N-diethyl ethanol amine, triisopropanol amine, 2,2'-imino diethanol, 2-amino ethanol, 3-amino-1-propanol, 4-amino-1-buthanol, 4-(2-hydroxyethyl)morpholine, 2-(2-hydroxyethyl)pyridine, 1-(2-hydroxyethyl)piperazine, 1-[2-(2-hydroxyethoxy)ethyl]piperazine, piperidine ethanol, 1-(2-hydroxyethyl)pyrrolidine, 1-(2-hydroxyethyl)-2-pyrrolidinone, 3-piperidino-1,2-propane diol, 3-pyrrolidino-1,2-propane diol, 8-hydroxyjulolidine, 3-quinuclidinol, 3-tropanol, 1-methyl-2-pyrrolidine ethanol, 1-aziridine, ethanol, N-(2-hydroxyethyl)phthalimide, N-(2-hydroxyethyl) isonicotine amide, and the like. The amide derivative may be exemplified by formamide, N-methyl formamide, N,N-dimethyl formamide, acetamide, N-methyl acetamide, N,N-dimethyl acetamide, propione amide, benzamide, and the like. The imide derivative may be exemplified by phthalimide, succine imide, maleimide, and the like.

Further, a compound selected from the basic compounds represented by the following general formula (B)-1 may be added singly, or in a combination of two or more kinds.

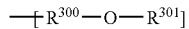 (B)-1

(In the formula, n1 represents 1, 2, or 3. The side-chain X' may be the same or different, and may be represented by the following general formulae (X)–1 to (X)-3. The side chain Y' may be the same or different, represents a hydrogen atom, a linear, a branched, or a cyclic alkyl group having 1 to 20 carbon atoms, and may contain an ether group or a hydroxy group. Further, X' may form a ring by connecting with each other.

—[R$^{300}$—O—R$^{301}$] (X)-1

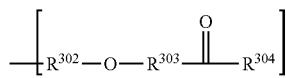 (X)-2

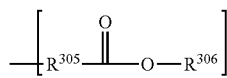 (X)-3

Here, R$^{300}$, R$^{302}$, and R$^{305}$ each represent independently any of a linear and a branched alkylene group having 1 to 4 carbon atoms. R$^{301}$ and R$^{304}$ each represent independently any of a hydrogen atom, or a linear, a branched, or a cyclic alkyl group having 1 to 20 carbon atoms, and may contain one or plural kinds selected from a hydroxy group, an ether group, an ester group, and a lactone ring. R$^{303}$ represents any of a single bond, a linear or a branched alkylene group having 1 to 4 carbon atoms. R$^{306}$ represents any of a linear, a branched, or a cyclic alkyl group having 1 to 20 carbon atoms, and may contain one or plural kinds selected from a hydroxy group, an ether group, an ester group, and a lactone ring.

Specific examples of the compound represented by the general formula (B)-1 include tris(2-methoxymethoxyethyl) amine, tris[2-(2-methoxyethoxy)ethyl]amine, tris[2-(2-methoxyethoxymethoxy)ethyl]amine, tris[2-(1-methoxyethoxy)ethyl]amine, tris[2-(1-ethoxyethoxy)ethyl]amine, tris[2-(1-ethoxypropoxy)ethyl]amine, tris{2-[2-(2-hydroxyethoxy)ethoxy]ethyl}amine, 4,7,13,16,21,24-hexaoxa-1,10-diazabicyclo[8.8.8]hexacosane, 4,7,13,18-tetraoxa-1,10-diazabicyclo[8.5.5]eicosane, 1,4,10,13-tetraoxa-7,16-diazabicyclooctadecane, 1-aza-12-crown-4,1-aza-15-crown-5,1-aza-18-crown-6, tris(2-formyloxyethyl)amine, tris(2-acetoxyethyl)amine, tris(2-propionyloxyethyl)amine, tris(2-butyryloxyethyl)amine, tris(2-isobutyryloxyethyl)amine, tris (2-valeryloxyethyl)amine, tris(2-pivaloyloxyethyl)amine, N,N-bis(2-acetoxyethyl) 2-(acetoxyacetoxy)ethyl amine, tris (2-methoxycarbonyloxyethyl)amine, tris(2-tert-buthoxycarbonyloxyethyl)amine, tris[2-(2-oxopropoxy)ethyl]amine, tris[2-(methoxycarbonylmethyl)oxyethyl]amine, tris[2-(tert-buthoxycarbonylmethyloxy)ethyl]amine, tris[2-(cyclohexyloxycarbonylmethyloxy)ethyl]amine, tris(2-methoxycarbonylethyl)amine, tris(2-ethoxycarbonylethyl)amine, N,N-bis (2-hydroxyethyl) 2-(methoxycarbonyl)ethyl amine, N,N-bis (2-acetoxyethyl) 2-(methoxycarbonyl)ethyl amine, N,N-bis (2-hydroxyethyl) 2-(ethoxycarbonyl)ethyl amine, N,N-bis (2-acetoxyethyl) 2-(ethoxycarbonyl)ethyl amine, N,N-bis(2-hydroxyethyl) 2-(2-methoxyethoxycarbonyl)ethyl amine, N,N-bis(2-acetoxyethyl) 2-(2-methoxyethoxycarbonyl)ethyl amine, N,N-bis(2-hydroxyethyl) 2-(2-hydroxyethoxycarbonyl)ethyl amine, N,N-bis(2-acetoxyethyl) 2-(2-acetoxyethoxycarbonyl)ethyl amine, N,N-bis(2-hydroxyethyl) 2-[(methoxycarbonyl)methoxycarbonyl]ethyl amine, N,N-bis(2-acetoxyethyl) 2-[(methoxycarbonyl)methoxycarbonyl]ethyl amine, N,N-bis(2-hydroxyethyl) 2-(2-oxopropoxycarbonyl)ethyl amine, N,N-bis(2-acetoxyethyl) 2-(2-oxopropoxycarbonyl)ethyl amine, N,N-bis(2-hydroxyethyl) 2-(tetrahydrofurfuryloxycarbonyl)ethyl amine, N,N-bis(2-acetoxyethyl) 2-(tetrahydrofurfuryloxycarbonyl)ethyl amine, N,N-bis(2-hydroxyethyl) 2-[(2-oxotetrahydrofurane-3-yl)oxycarbonyl]ethyl amine, N,N-bis(2-acetoxyethyl) 2-[(2-oxotetrahydrofurane-3-yl)oxycarbonyl]ethyl amine, N,N-bis(2-hydroxyethyl) 2-(4-hydroxybuthoxycarbonyl) ethyl amine, N,N-bis(2-formyloxyethyl) 2-(4-formyloxybuthoxycarbonyl)ethyl amine, N,N-bis(2-formyloxyethyl) 2-(2-formyloxyethoxycarbonyl)ethyl amine, N,N-bis(2-methoxyethyl) 2-(methoxycarbonyl)ethyl amine, N-(2-hydroxyethyl)bis[2-(methoxycarbonyl)ethyl]amine, N-(2-acetoxyethyl)bis[2-(methoxycarbonyl)ethyl]amine, N-(2-hydroxyethyl)bis[2-(ethoxycarbonyl)ethyl]amine, N-(2-acetoxyethyl)bis[2-(ethoxycarbonyl)-ethyl]amine, N-(3-hydroxy-1-propyl)bis[2-(methoxycarbonyl)ethyl]amine, N-(3-acetoxy-1-propyl)bis[2-(methoxycarbonyl)ethyl] amine, N-(2-methoxyethyl)bis[2-(methoxycarbonyl)ethyl] amine, N-butyl bis[2-(methoxycarbonyl)ethyl]amine, N-butyl bis[2-(2-methoxyethoxycarbonyl)ethyl]amine, N-methyl bis(2-acetoxyethyl)amine, N-ethyl bis(2-acetoxyethyl) amine, N-methyl bis(2-pivaloyloxyethyl)amine, N-ethyl bis [2-(methoxycarbonyloxy)ethyl]amine, N-ethyl bis[2-(tert-buthoxycarbonyloxy)ethyl]amine, tris (methoxycarbonylmethyl)amine, tris (ethoxycarbonylmethyl)amine, N-butyl bis (methoxycarbonylmethyl)amine, N-hexyl bis (methoxycarbonylmethyl)amine, β-(diethylamino)-δ-valerolactone, and the like, but the compound is not restricted by them.

Further, a basic compound having a ring structure represented by the following general formula (B)-2 may also be added singly, or in a combination of two or more kinds.

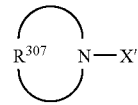 (B)-2

(In the formula, X' represents the same meanings as before. $R^{307}$ represents a linear or a branched alkylene group having 2 to 20 carbon atoms, and may contain one or plural kinds selected from a carbonyl group, an ether group, an ester group, and a sulfide group.)

Specific examples of the basic compound having a cyclic structure represented by the general formula (B)-2 include 1-[2-(methoxymethoxy)ethyl]pyrrolidine, 1-[2-(methoxymethoxy)ethyl]piperidine, 4-[2-(methoxymethoxy)ethyl]morpholine, 1-{2-[(2-methoxyethoxy)methoxy]ethyl}pyrrolidine, 1-{2-[(2-methoxyethoxy)methoxy]ethyl}piperidine, 4-{2-[(2-methoxyethoxy)methoxy]ethyl}morpholine, 2-(1-pyrrolidinyl)ethyl acetate, 2-piperidinoethyl acetate, 2-morpholinoethyl acetate, 2-(1-pyrrolidinyl)ethyl formate, 2-piperidinoethyl propionate, 2-morpholinoethyl acetoxyacetate, 2-(1-pyrrolidinyl)ethyl methoxyacetate, 4-[2-(methoxycarbonyloxy)ethyl]morpholine, 1-[2-(t-buthoxycarbonyloxy)ethyl]piperidine, 4-[2-(2-methoxyethoxycarbonyloxy)ethyl]morpholine, methyl 3-(1-pyrrolidinyl)propionate, methyl 3-piperidinopropionate, methyl 3-morpholinopropionate, methyl 3-(thiomorpholino) propionate, methyl 2-methyl-3-(1-pyrrolidinyl)propionate, ethyl 3-morpholinopropionate, methoxycarbonylmethyl 3-piperidinopropionate, 2-hydroxyethyl 3-(1-pyrrolidinyl) propionate, 2-acetoxyethyl 3-morpholinopropionate, 2-oxotetrahydrofurane-3-yl 3-(1-pyrrolidinyl)propionate, tetrahydrofurfuryl 3-morpholinopropionate, glycidyl 3-piperidinopropionate, 2-methoxyethyl 3-morpholinopropionate, 2-(2-methoxyethoxy)ethyl 3-(1-pyrrolidinyl)propionate, butyl 3-morpholinopropionate, cyclohexyl 3-piperidinopropionate, α-(1-pyrrolidinyl)methyl-γ-butyrolactone, β-piperidino-γ-butyrolactone, β-morpholino-δ-valerolactone, methyl 1-pyrrolidinylacetate, methyl piperidinoacetate, methyl morpholinoacetate, methyl thiomorpholinoacetate, ethyl 1-pyrrolidinylacetate, 2-methoxyethyl morpholinoacetate, and the like.

Further, a basic compound containing a cyano group represented by the following general formulae (B)-3 to (B)-6 may be added.

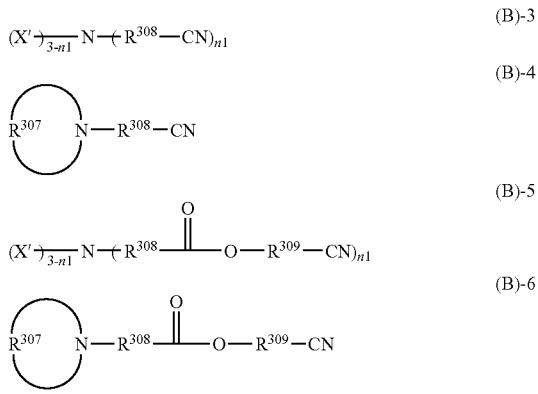

(In the formulae, X', $R^{307}$, and n1 represent the same meanings as before. $R^{308}$ and $R^{309}$ represent the same or different linear or branched alkylene group having 1 to 4 carbon atoms.)

Specific examples of the basic compound containing a cyano group include 3-(diethylamino)propiononitrile, N,N-bis(2-hydroxyethyl)-3-amino propiononitrile, N,N-bis(2-acetoxyethyl)-3-amino propiononitrile, N,N-bis(2-formyloxyethyl)-3-amino propiononitrile, N,N-bis(2-methoxyethyl)-3-amino propiononitrile, N,N-bis[2-(methoxymethoxy)ethyl]-3-amino propiononitrile, methyl N-(2-cyanoethyl)-N-(2-methoxyethyl)-3-amino propionate, methyl N-(2-cyanoethyl)-N-(2-hydroxyethyl)-3-amino propionate, methyl N-(2-acetoxyethyl)-N-(2-cyanoethyl)-3-amino propionate, N-(2-cyanoethyl)-N-ethyl-3-amino propiononitrile, N-(2-cyanoethyl)-N-(2-hydroxyethyl)-3-amino propiononitrile, N-(2-acetoxyethyl)-N-(2-cyanoethyl)-3-amino propiononitrile, N-(2-cyanoethyl)-N-(2-formyloxyethyl)-3-amino propiononitrile, N-(2-cyanoethyl)-N-(2-methoxyethyl)-3-amino propiononitrile, N-(2-cyanoethyl)-N-[2-(methoxymethoxy)ethyl]-3-amino propiononitrile, N-(2-cyanoethyl)-N-(3-hydroxy-1-propyl)-3-amino propiononitrile, N-(3-acetoxy-1-propyl)-N-(2-cyanoethyl)-3-amino propiononitrile, N-(2-cyanoethyl)-N-(3-formyloxy-1-propyl)-3-amino propiononitrile, N-(2-cyanoethyl)-N-tetrahydrofurfuryl-3-amino propiononitrile, N,N-bis(2-cyanoethyl)-3-amino propiononitrile, diethylamino acetonitrile, N,N-bis(2-hydroxyethyl)amino acetonitrile, N,N-bis(2-acetoxyethyl) amino acetonitrile, N,N-bis(2-formyloxyethyl)amino acetonitrile, N,N-bis(2-methoxyethyl)amino acetonitrile, N,N-bis[2-(methoxymethoxy)ethyl]amino acetonitrile, methyl N-cyanomethyl-N-(2-methoxyethyl)-3-amino propionate, methyl N-cyanomethyl-N-(2-hydroxyethyl)-3-amino propionate, methyl N-(2-acetoxyethyl)-N-cyanomethyl-3-amino propionate, N-cyanomethyl-N-(2-hydroxyethyl) amino acetonitrile, N-(2-acetoxyethyl)-N-(cyanomethyl) amino acetonitrile, N-cyanomethyl-N-(2-formyloxyethyl) amino acetonitrile, N-cyanomethyl-N-(2-methoxyethyl) amino acetonitrile, N-cyanomethyl-N-[2-(methoxymethoxy) ethyl]amino acetonitrile, N-(cyanomethyl)-N-(3-hydroxy-1-propyl)amino acetonitrile, N-(3-acetoxy-1-propyl)-N-(2-cyanomethyl)amino acetonitrile, N-cyanomethyl-N-(3-formyloxy-1-propyl)amino acetonitrile, N,N-bis (cyanomethyl)aminoacetonitrile, 1-pyrrolidine propiononitrile, 1-piperidine propiononitrile, 4-morpholine propiononitrile, 1-pyrrolidine acetonitrile, 1-piperidine acetonitrile, 4-morpholine acetonitrile, cyanomethyl 3-diethylamino propionate, cyanomethyl N,N-bis(2-hydroxyethyl)-3-amino propionate, cyanomethyl N,N-bis(2-acetoxyethyl)-3-amino propionate, cyanomethyl N,N-bis(2-formyloxyethyl)-3-amino propionate, cyanomethyl N,N-bis (2-methoxyethyl)-3-amino propionate, cyanomethyl N,N-bis [2-(methoxymethoxy)ethyl)]-3-amino propionate, 2-cyanoethyl 3-diethylamino propionate, 2-cyanoethyl N,N-bis(2-hydroxyethyl)-3-amino propionate, 2-cyanoethyl N,N-bis(2-acetoxyethyl)-3-amino propionate, 2-cyanoethyl N,N-bis(2-formyloxyethyl)-3-amino propionate, 2-cyanoethyl N,N-bis(2-methoxyethyl)-3-amino propionate, 2-cyanoethyl N,N-bis[2-(methoxymethoxy)ethyl)]-3-amino propionate, cyanomethyl 1-pyrrolidine propionate, cyanomethyl 1-piperidine propionate, cyanomethyl 4-morpholine propionate, 2-cyanoethyl 1-pyrrolidine propionate, 2-cyanoethyl 1-piperidine propionate, 2-cyanoethyl 4-morpholine propionate, and the like.

Here, the amount of the basic compound of the present invention to be blended is preferably 0.001 to 2 parts, in particular 0.01 to 1 part, relative to 100 parts of the base resin. When the amount is 0.001 part or more, the blending effect is excellent, and when the amount is 2 parts or less, a risk of lowering the degree of resolution is decreased, thus it is preferable.

As a compound having a ≡C—COOH group in its molecule that may be added to the positive resist of the present invention, there may be mentioned one kind or two or more kinds of the compounds selected from the following groups I and II, but it is not limited to them. By blending this component, the PED stability of a resist is increased, thus an edge roughness on a nitride film substrate is improved.

[Group I]

Compounds represented by the following general formulae (A1) to (A10) a part of or all of whose hydrogen atom of a phenolic hydroxide is substituted by a —$R^{401}$—COOH group ($R^{401}$ represents a linear or a branched alkylene group having 1 to 10 carbon atoms), and the mole ratio of whose phenolic hydroxide group (C) and ≡C—COOH group (D) (C/(C+D)) is 0.1 to 1.0.

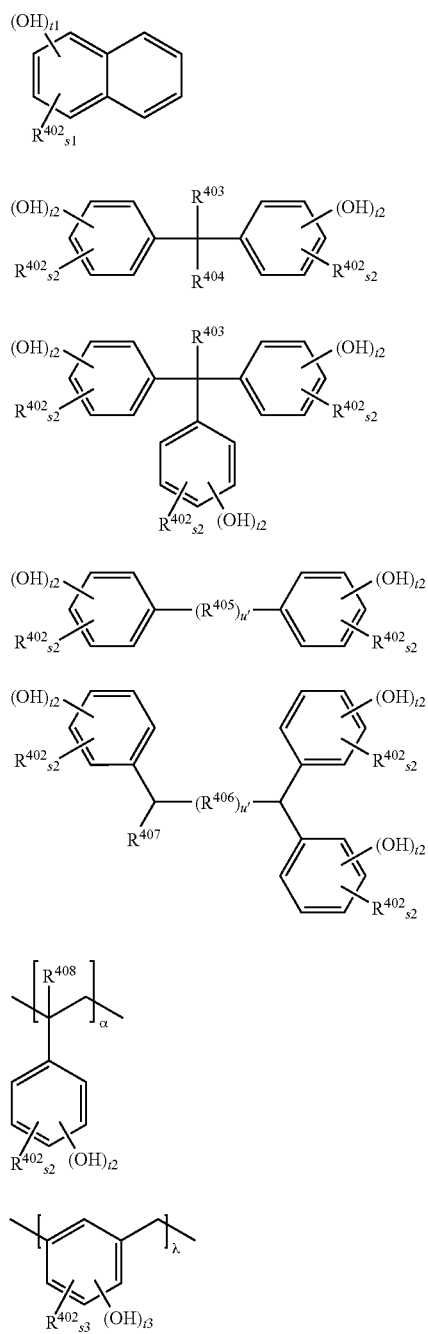

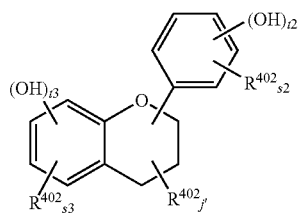

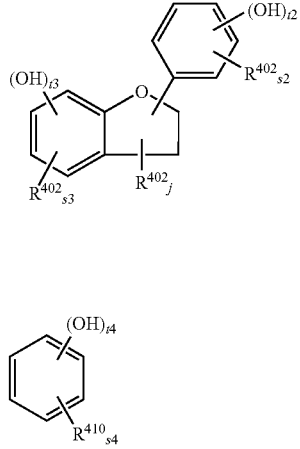

(Here, in the formula, $R^{408}$ represents a hydrogen atom or a methyl group. $R^{402}$ and $R^{403}$ each represent a hydrogen atom, a linear or a branched alkyl group or alkenyl group having 1 to 8 carbon atoms. $R^{404}$ represents a hydrogen atom, a linear or a branched alkyl group or alkenyl group having 1 to 8 carbon atoms, or a group represented by —$(R^{409})_{h''}$—COOR' (R' represents a hydrogen atom or a group represented by —$R^{409}$—COOH). $R^{405}$ represents a group represented by —$(CH_2)_{i''}$— (i" represents 2 to 10), an arylene group having 6 to 10 carbon atoms, a carbonyl group, a sulfonyl group, an oxygen atom, or a sulfur atom. $R^{406}$ represents an alkylene group having 1 to 10 carbon atoms, an arylene group having 6 to 10 carbon atoms, a carbonyl group, a sulfonyl group, an oxygen atom, or a sulfur atom. $R^{407}$ represents a hydrogen atom, a linear or a branched alkyl group having 1 to 8 carbon atoms, an alkenyl group, or a phenyl or a naphthyl group each substituted by a hydroxy group. $R^{409}$ represents an alkyl or an alkenyl group, linear or branched, having 1 to 10 carbon atoms, or a —$R^{411}$—COOH group. $R^{410}$ represents a hydrogen atom, an alkyl group or an alkenyl group, linear or branched, having 1 to 8 carbon atoms, or a —$R^{411}$—COOH group. $R^{411}$ represents a linear or a branched alkylene group having 1 to 10 carbon atoms. Here, j' represents 0 to 3; u' and h" represent 0 or 1; s1 to s4 and t1 to t4 each satisfy the equations s1+t1=8, s2+t2=5, s3+t3=4, s4+t4=6, and are the numbers giving at least one hydroxide group in each phenyl skeletons; K represents a number giving the weight-average molecular weight of 1,000 to 5,000 to a compound represented by the formula (A6); λ represents a number giving the weight-average molecular weight of 1,000 to 10,000 to a compound represented by the formula (A7).)

[Group II]

Compounds represented by the following general formulae (A11) to (A15).

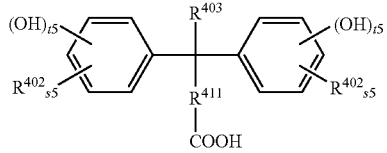
(A11)

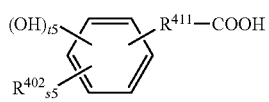
(A12)

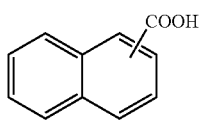
(A13)

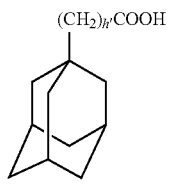
(A14)

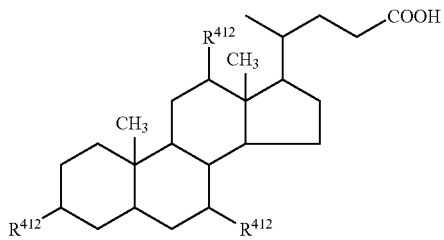
(A15)

($R^{402}$, $R^{403}$, and $R^{411}$ represent the same meanings as before. $R^{412}$ represents a hydrogen atom or a hydroxide group. Here, s5 and t5 are the numbers satisfying equations $s5 \geqq 0$, $t5 \geqq 0$ and $s5+t5=5$, and h' represents 0 or 1.)

Specific examples of the components represented by the general formula (A1) to (A15) include the compounds represented by the following general formulae (AI-1) to (AI-14) and (AII-1) to (AII-10), but the components are not limited by them.

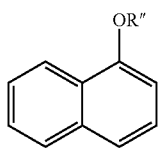
(AI-1)

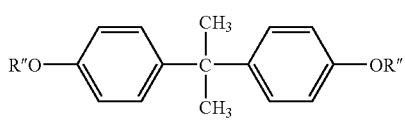
(AI-2)

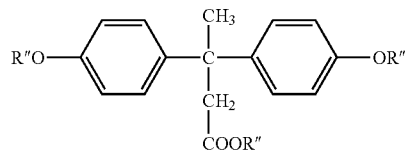
(AI-3)

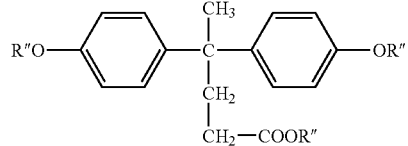
(AI-4)

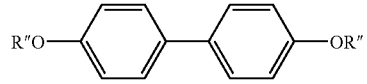
(AI-5)

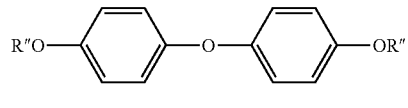
(AI-6)

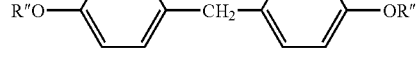
(AI-7)

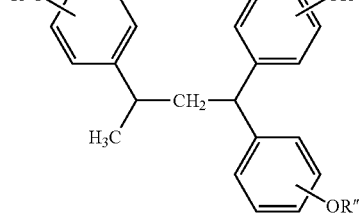
(AI-8)

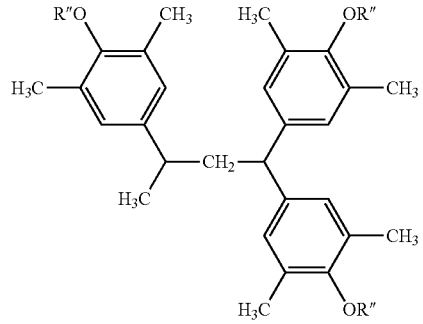
(AI-9)

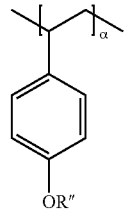
(AI-10)

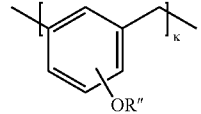
(AI-11)

-continued

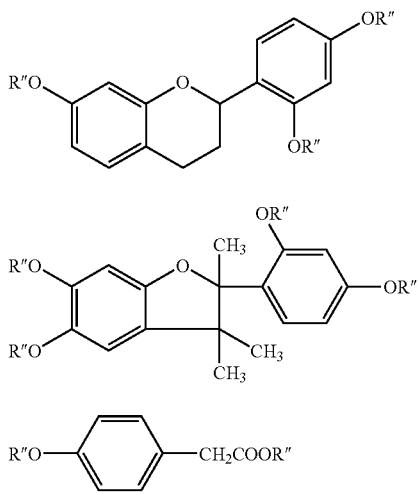

(AI-12)

(AI-13)

(AI-14)

(In the formulae, R″ represents a hydrogen atom or a CH$_2$COOH group, wherein 10 to 100 mole % of R″ in each compound is a CH$_2$COOH group. Here, α and κ represent the same meanings as before.)

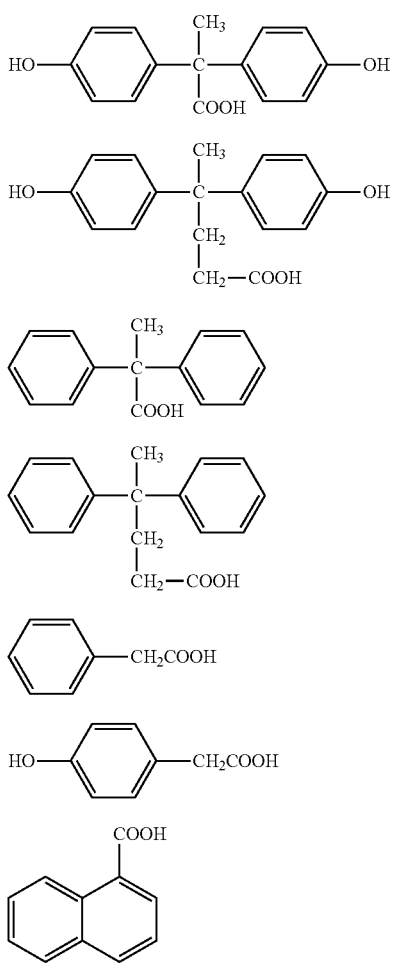

(AII-1)

(AII-2)

(AII-3)

(AII-4)

(AII-5)

(AII-6)

(AII-7)

-continued

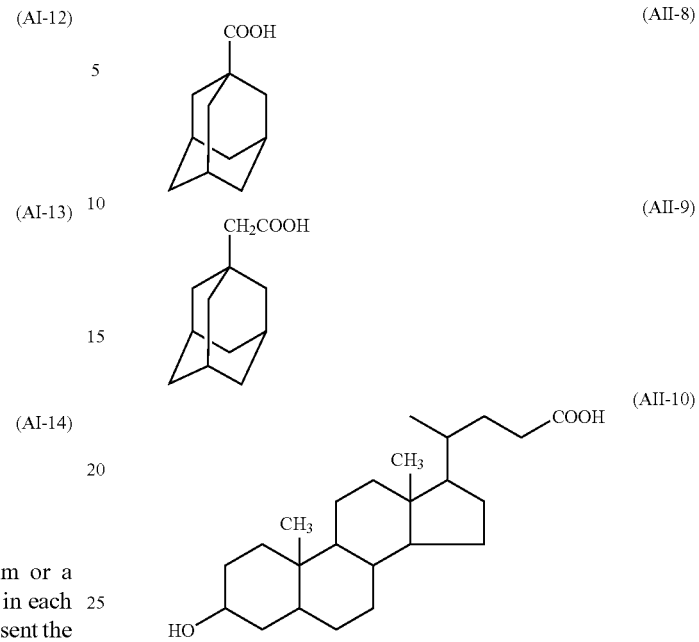

(AII-8)

(AII-9)

(AII-10)

Here, the compound having a ≡C—COOH group in its molecule may be used singly or in a combination of two or more kinds.

The amount of the compound having a ≡C—COOH group in its molecule to be added is 0 to 5 parts, preferably 0.1 to 5 parts, further preferably 0.1 to 3 parts, and further more preferably 0.1 to 2 parts, relative to 100 parts of the base resin. This range is preferable as a risk of deterioration of the degree of resolution of the resist composition is low.

Further, the positive resist composition of the present invention may be added by a dissolution controlling composition comprising a compound having plural bisphenol groups substituted by the acid labile group represented by the following general formula BP-(1).

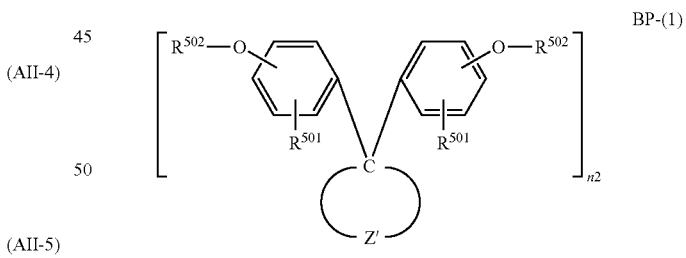

BP-(1)

(In the formula, $R^{501}$ represents the same or different hydrogen atom, a linear, a branched, or a cyclic alkyl group having 1 to 10 carbon atoms, an aryl group having 6 to 10 carbon atoms, an alkenyl group having 2 to 10 carbon atoms, or a halogen atom. $R^{502}$ represents independently the same or different hydrogen atom or acid labile group, and n2 represents an integer of 2 to 4. Z' represents an alkyl group having a cyclic structure having total 5 to 40 carbon atoms in the formula, a cyclic hydrocarbon group having a bridge structure, or a condensed polycyclic hydrocarbon group, and may contain a hetero atom such as sulfur and the like.

The acid labile group shown in the general formula BP-(1) may be used by selecting from those described above. The compound represented by the general formula BP-(1) may be specifically exemplified by the followings.
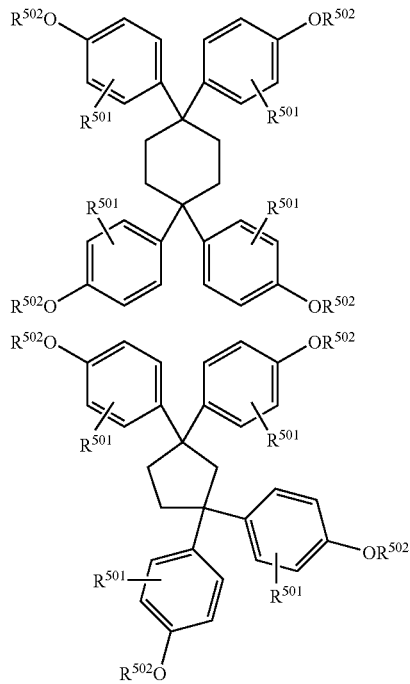
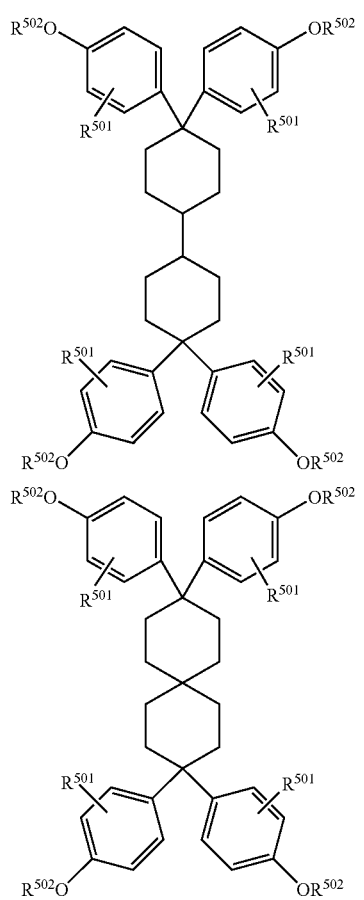
-continued
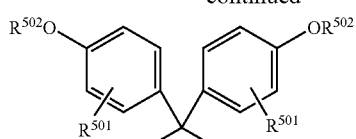
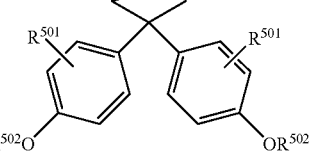
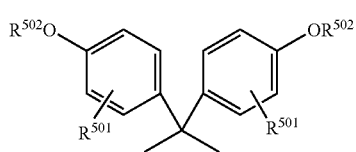
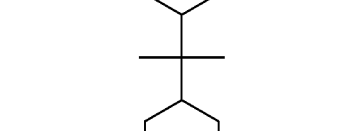
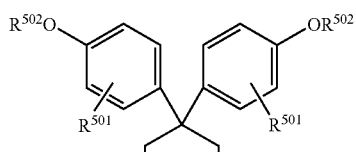
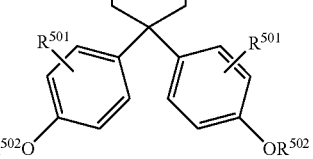

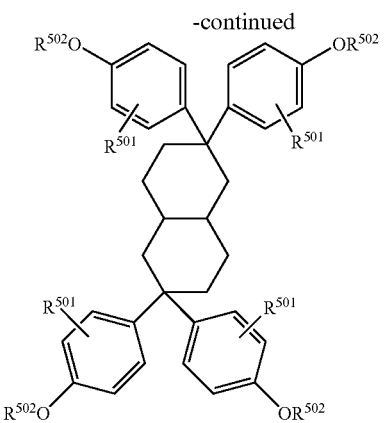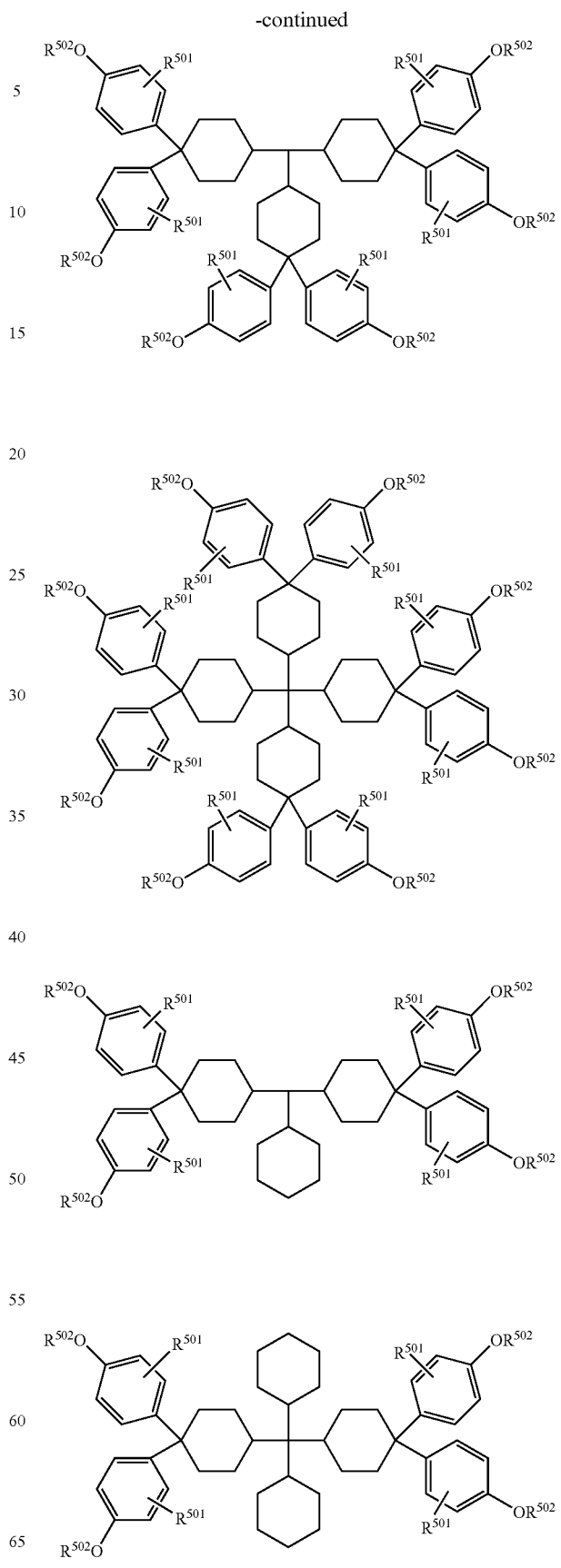

-continued
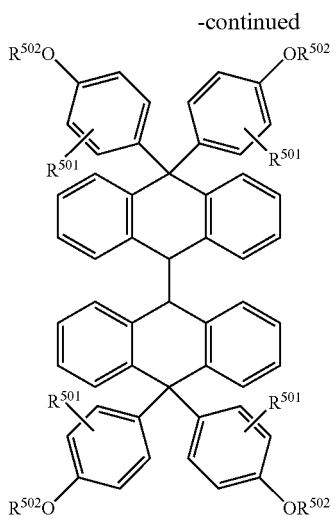
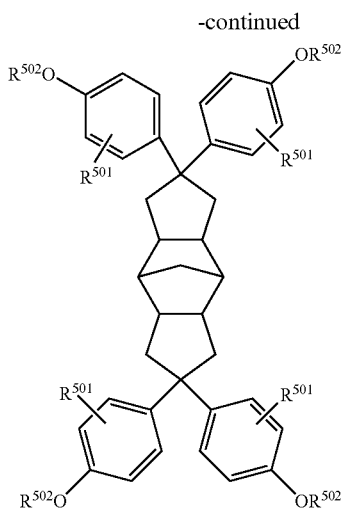
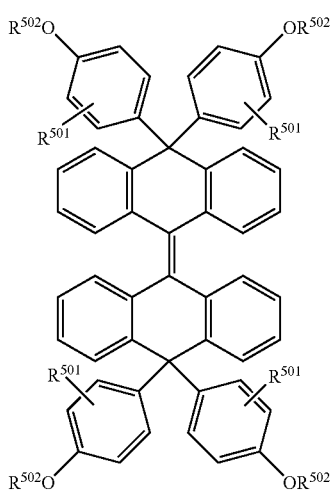
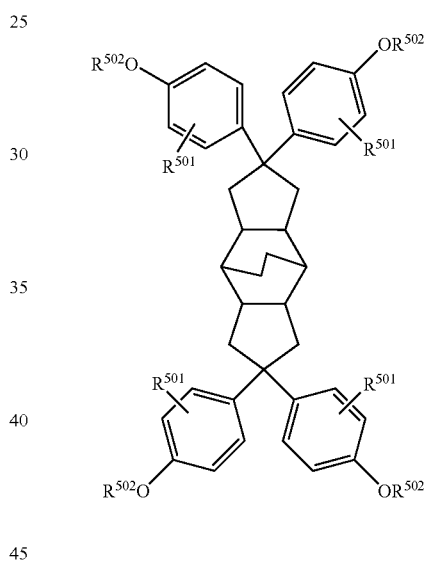
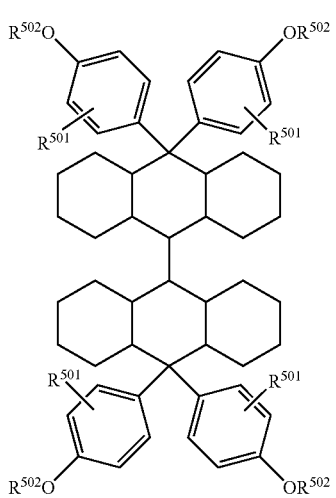
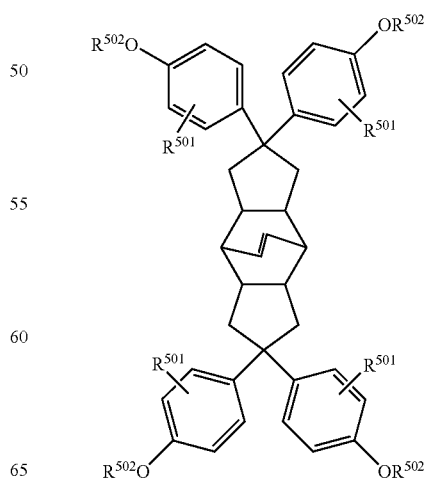

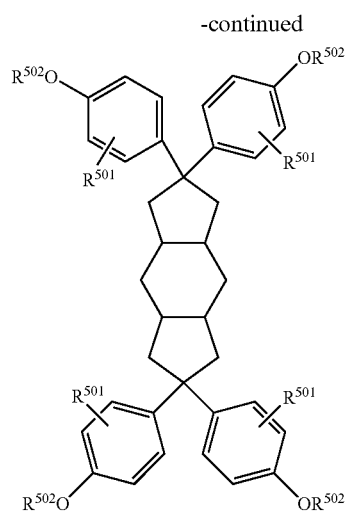
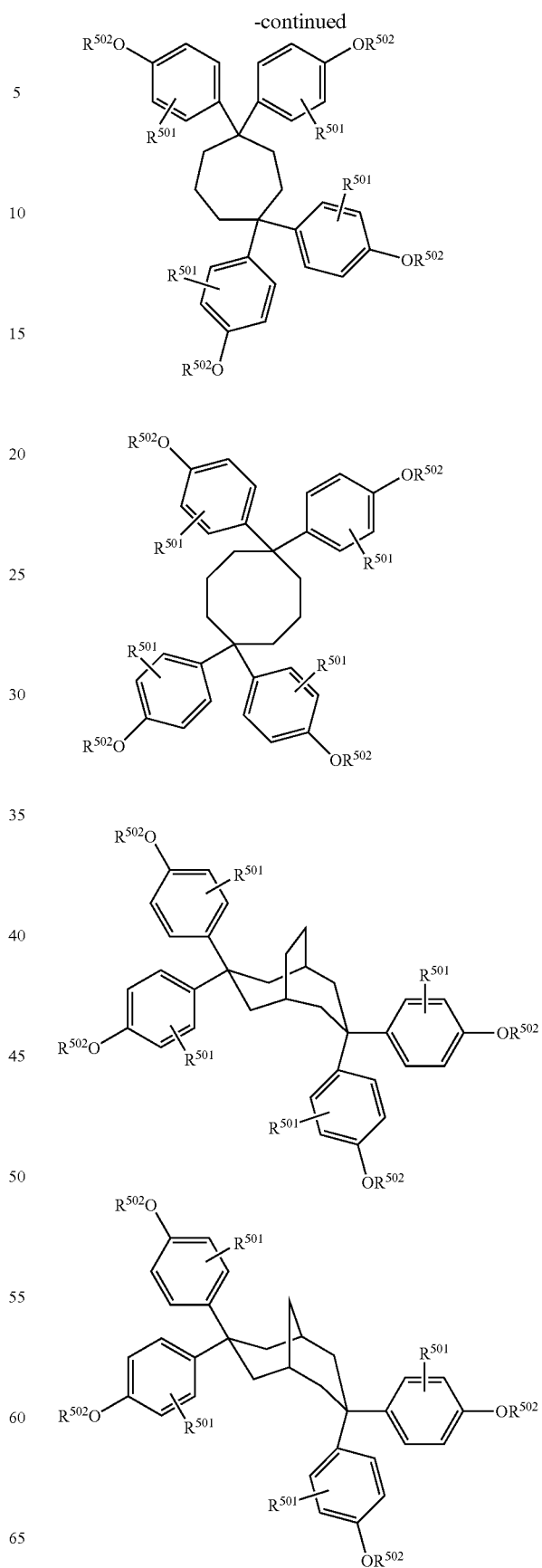

-continued
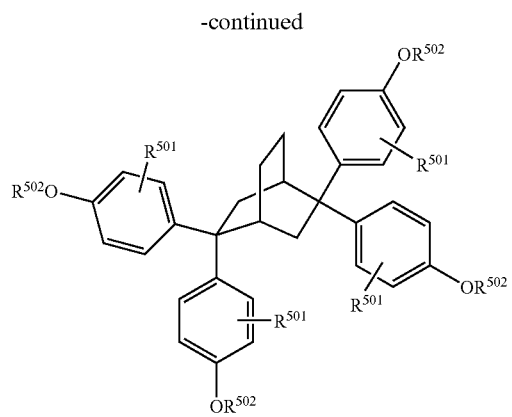
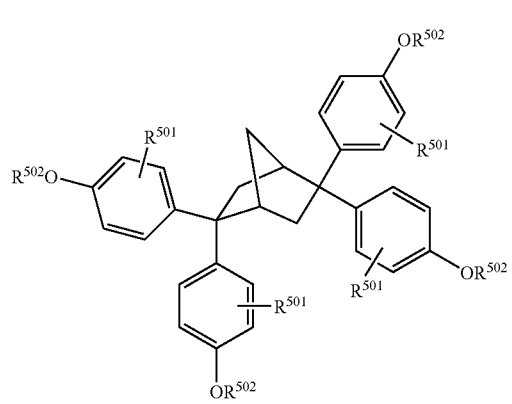
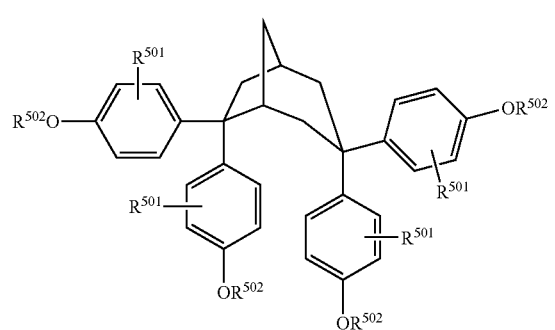
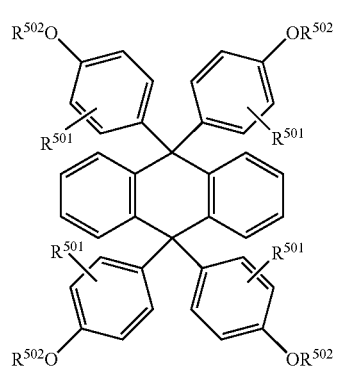
-continued
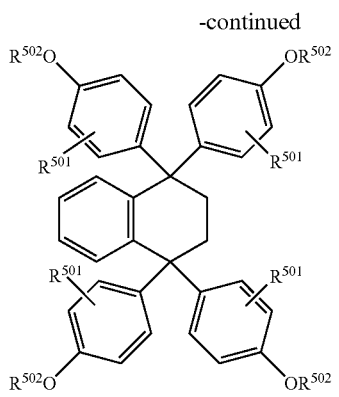
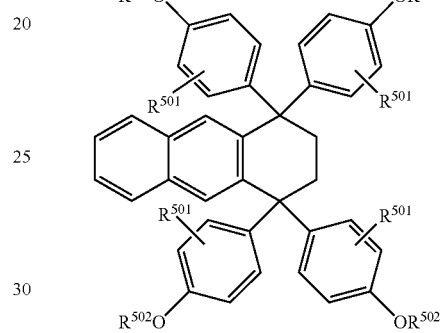
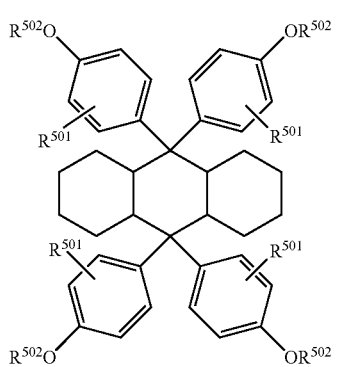
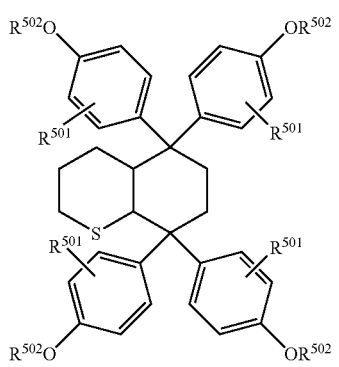

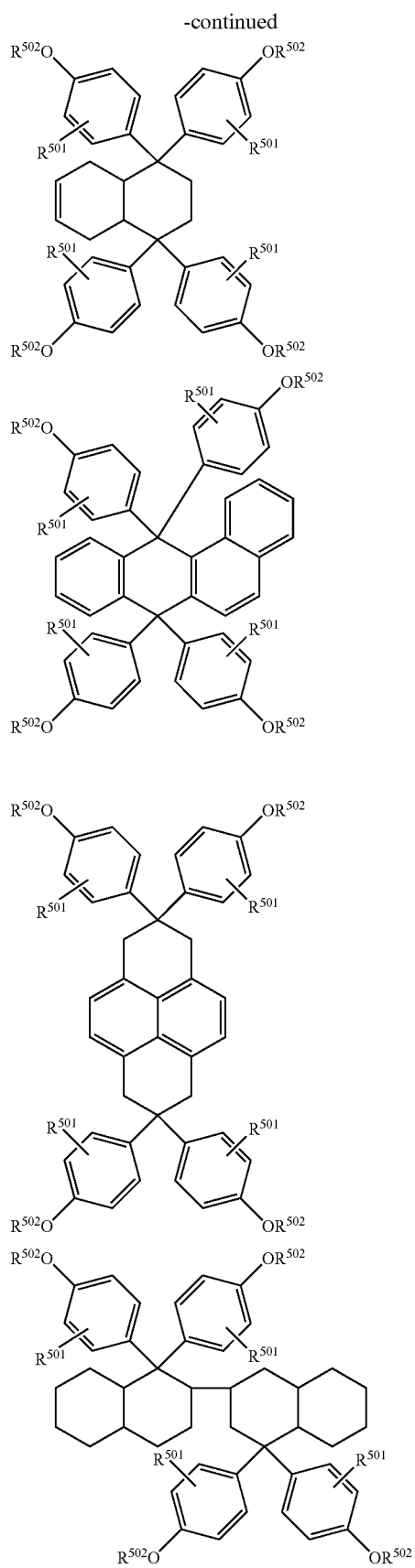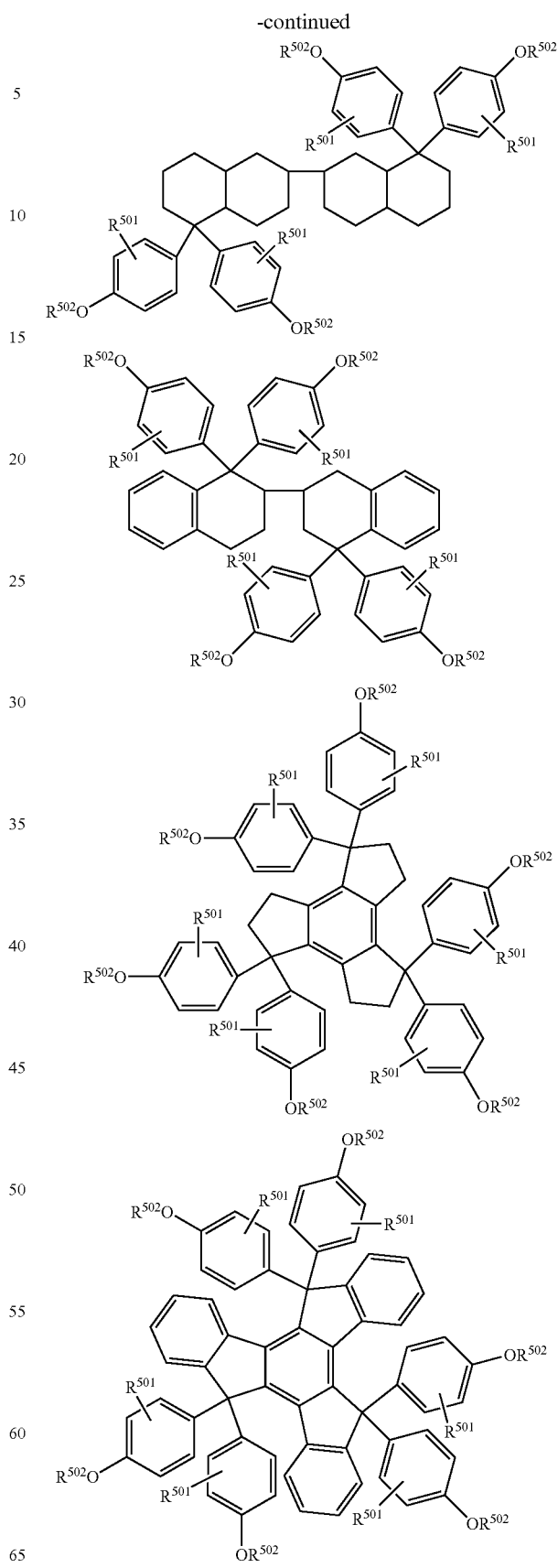

-continued
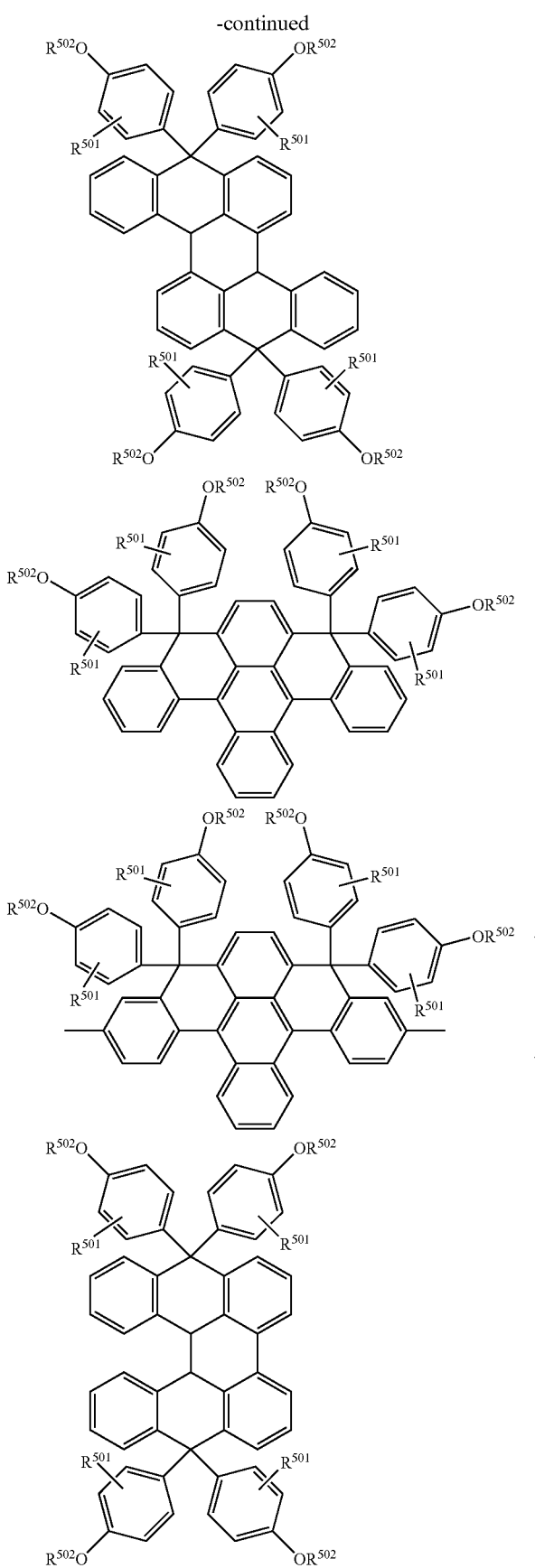
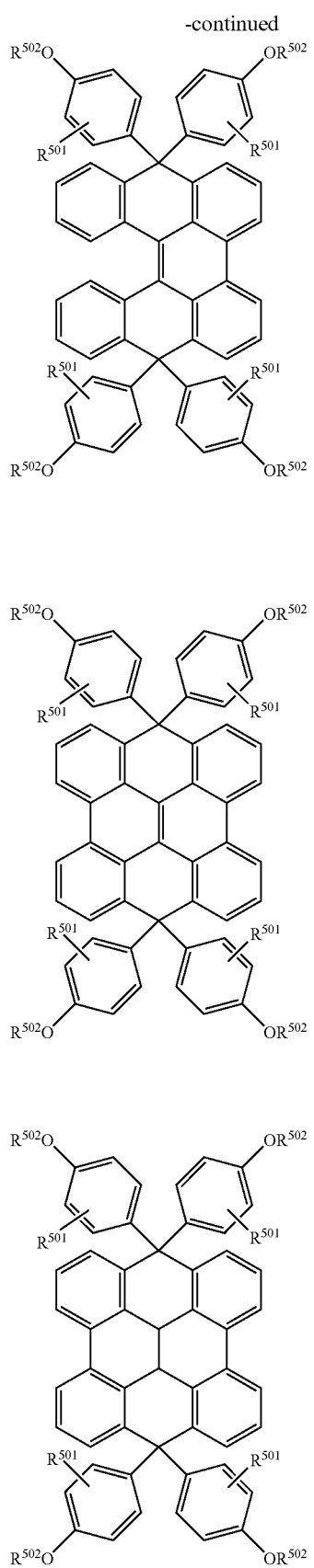

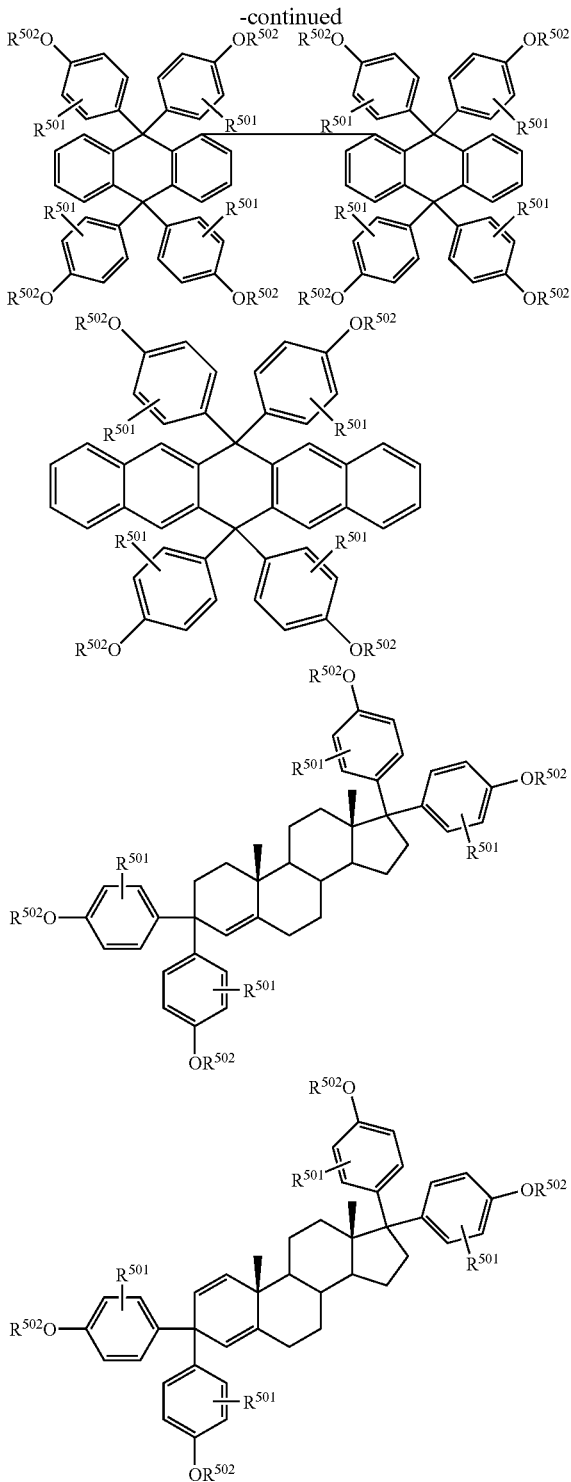

Further, the positive resist composition of the present invention may be added by a dissolution controlling composition comprising a calixarene substituted by an acid labile group disclosed in the Japan Publication of Unexamined Application No. 11-322656 and a calixresorcinol.

The surfactant to be added in the present invention is not particularly restricted, but may be exemplified by a polyoxyethylene alkyl ether such as polyoxyethylene lauryl ether, polyoxyethylene stearyl ether, polyoxyethylene cetyl ether, polyoxyethylene olein ether, and the like; a polyoxyethylene alkylaryl ether such as polyoxyethylene octylphenol ether, polyoxyethylene nonylphenol ether, and the like; a polyoxyethylene polyoxypropylene block copolymer; a sorbitane aliphatic acid ester such as sorbitane monolaurate, sorbitane monovalmitate, sorbitane monostearate, and the like; a nonionic surfactant of a polyoxyethylene sorbitane aliphatic acid ester such as polyoxyethylene sorbitane monolaurate, polyoxyethylene sorbitane monovalmitate, polyoxyethylene sorbitane monostearate, polyoxyethylene sorbitane trioleate, polyoxyethylene sorbitane tristearate, and the like; a fluoro surfactant such as F-Top EF301, EF303, and EF352 (manufactured by Tochem Products Co., Ltd.), Megafac F171, F172, and F173 (manufactured by Dainippon Ink & Chemicals, Inc.), Flolade FC430, FC431, and FC-4430. (manufactured by Sumitomo 3M Ltd.), Asahi Guard AG710, Surflon S-381, S-382, SC101, SC102, SC103, SC104, SC105, SC106, Surfinol E1004, KH-10, KH-20, KH-30, and KH-40 (manufactured by Asahi Glass Co., Ltd.); an organosiloxane polymer such as KP-341, X-70-092, and X-70-093 (manufactured by Shin-Etsu Chemical Co., Ltd.); and an acrylic acid or a methacrylic acid polymer such as Polyflow No. 75 and No. 95 (manufactured by Kyoeisha Yushikagaku Kogyo K. K.). Among them, FC430, FC-4430, Surflon S-381, Surfinol E1004, KH-20, and KH-30 are preferable. These may be used singly or in a combination of two or more kinds.

The amount of the surfactant in the positive resist composition, in particular the chemically amplified positive resist composition, of the present invention, is 2 parts or less, and preferably 1 part or less, relative to 100 parts of the base resin in the resist composition.

When the positive resist composition of the present invention, for instance, the positive resist composition a chemically amplified positive resist composition containing an organic solvent, a polymer whose hydrogen atom of the phenolic hydroxy group is substituted by the acid labile group represented by the general formula (1), an acid generator, and a basic compound is used for production of various integrated circuits, a publicly known lithography technology not particularly limited may be applied.

For instance, the positive resist composition of the present invention is applied on a substrate for an integrated circuit production (Si, $SiO_2$, SiN, SiON, TiN, WSi, BPSG, SOG, an organic anti-reflection film, and the like) or a substrate for a mask circuit production (Cr, CrO, CrON, MoSi, and the like) by an appropriate coating method such as a spin coat, a roll coat, a flow coat, a dip coat, a spray coat, a doctor coat, and the like, in such a way as to give a film thickness of 0.1 to 2.0 μm. This is pre-baked on a hot plate at 60 to 150° C. for 10 seconds to 30 minutes, and preferably at 80 to 120° C. for 30 seconds to 20 minutes. Then, it is exposed directly or through a prescribed mask by a light source selected from high energy beams such as a ultraviolet beam, a far-ultraviolet beam, an electronic beam, a X-ray, an excimer laser, a γ beam, a synchrotron radiation beam, an extreme ultraviolet beam (soft X-ray), and the like to obtained a desired pattern. The exposure amount is about 1 to about 200 mJ/cm$^2$ and preferably 10 to 100 mJ/cm$^2$, or 0.1 to 100 μC and preferably about 0.5 to about 50 μC. Then, a post-exposure bake (PEB) is performed on a hot plate at 60 to 150° C. for 10 seconds to 30 minutes, and preferably at 80 to 120° C. for 30 seconds to 20 minutes.

Further, a development is preformed by a conventional method such as a dip method, a puddle method, a spray method, and the like for 3 seconds to 3 minutes and preferably 5 seconds to 2 minutes by using a developing liquid of an alkaline aqueous solution such as tetramethyl ammonium hydroxide (TMAH) and the like having a concentration of 0.1 to 5% by weight and preferably 2 to 3% by weight to form a desired positive pattern on a substrate, wherein an exposed area is dissolved in the developing liquid while an unexposed area is not dissolved. Here, the positive resist composition of the present invention is most suitable for a fine patterning by an electronic beam, an extreme ultraviolet beam (soft X-ray), a X-ray, a γ beam, and a synchrotron radiation beam among high energy beams in particular.

EXAMPLE

In the following, the present invention will be explained specifically by Synthesis Examples and Comparative Synthesis Examples, as well as by Examples and Comparative Examples, but the present invention is not limited by the following Examples.

Synthesis Example 1

Into a 2-L flask were charged 8.1 g of 4-acetoxy styrene, 10.6 g of 6-acetoxy-2-vinylnaphthalene, and 40 g of tetrahydrofurane as a solvent. The flask was cooled to −70° C. under a nitrogen atmosphere, and the procedure of a deaeration under vacuum followed by a nitrogen blow was repeated for three times. After heated to a room temperature, 1.2 g of AIBN (azobisisobutyronitrile) was added as a polymerization initiator, and after the temperature was raised to 60° C., the reaction was carried out for 15 hours. The reaction solution was poured into 1 L of isopropyl alcohol for precipitation, and the white solid obtained was redissolved in 100 mL of methanol and 200 mL of tetrahydrofurane, added by 10 g of triethylamine and 10 g of water, and then a deprotection reaction of the acetyl group was carried out at 70° C. for 5 hours. The reaction solution was neutralized by acetic acid, concentrated, and dissolved in 100 mL of acetone. In a similar manner to those shown in the above, precipitation, filtration, and drying at 60° C. were carried out to obtain a white polymer.

A $^{13}$C-NMR, a $^1$H-NMR, and a GPC of the polymer thus obtained were measured to obtain the following analysis results.
Copolymer composition ratio (mole ratio):
4-hydroxy styrene:6-hydroxy-2-vinylnaphthalene=0.50:0.50
Weight-average molecular weight (Mw): 8,900
Molecular weight distribution (Mw/Mn): 1.84
This polymer is designated as (Polymer-1).

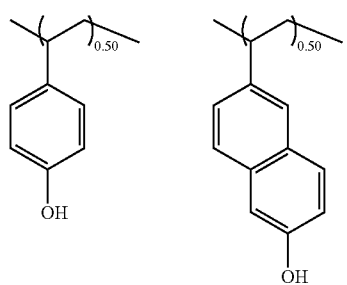

Polymer 1

Synthesis Example 2

Into a 2-L flask were charged 14.6 g of 4-acetoxy styrene, 1.5 g of indene, and 40 g of tetrahydrofurane as a solvent. The flask was cooled to −70° C. under a nitrogen atmosphere, and then the procedure of a deaeration under vacuum followed by a nitrogen blow was repeated for three times. After heated to a room temperature, 1.2 g of AIBN (azobisisobutyronitrile) was added as a polymerization initiator, and after the temperature was raised to 60° C., the reaction was carried out for 15 hours. The reaction solution was poured into 1 L of isopropyl alcohol for precipitation, and the white solid obtained was redissolved in 100 mL of methanol and 200 mL of tetrahydrofurane, added by 10 g of triethylamine and 10 g of water, and then a deprotection reaction of the acetyl group was carried out at 70° C. for 5 hours. The reaction solution was neutralized by acetic acid, concentrated, and dissolved in 100 mL of acetone. In a similar manner to those shown in the above, precipitation, filtration, and drying at 60° C. were carried out to obtain a white polymer.

A $^{13}$C-NMR, a $^1$H-NMR, and a GPC of the polymer thus obtained were measured to obtain the following analysis results.
Copolymer composition ratio (mole ratio):
4-hydroxy styrene:indene=0.90:0.10
Weight-average molecular weight (Mw): 6,300
Molecular weight distribution (Mw/Mn): 1.68
This polymer is designated as (Polymer-2).

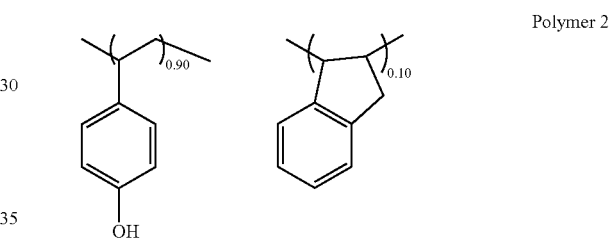

Polymer 2

Synthesis Example 3

Into a 2-L flask were charged 14.6 g of 4-acetoxy styrene, 1.4 g of benzofurane, and 40 g of tetrahydrofurane as a solvent. The flask was cooled to −70° C. under a nitrogen atmosphere, and then the procedure of a deaeration under vacuum followed by a nitrogen blow was repeated for three times. After heated to a room temperature, 1.2 g of AIBN (azobisisobutyronitrile) was added as a polymerization initiator, and after the temperature was raised to 60° C., the reaction was carried out for 15 hours. The reaction solution was poured into 1 L of isopropyl alcohol for precipitation, and the white solid obtained was redissolved in 100 mL of methanol and 200 mL of tetrahydrofurane, added by 10 g of triethylamine and 10 g of water, and then a deprotection reaction of the acetyl group was carried out at 70° C. for 5 hours. The reaction solution was neutralized by acetic acid, concentrated, and dissolved in 100 mL of acetone. In a similar manner to those shown in the above, precipitation, filtration, and drying at 60° C. were carried out to obtain a white polymer.

A $^{13}$C-NMR, a $^1$H-NMR, and a GPC of the polymer thus obtained were measured to obtain the following analysis results.
Copolymer composition ratio (mole ratio):
4-hydroxy styrene:benzofurane=0.85:0.15
Weight-average molecular weight (Mw): 6,100
Molecular weight distribution (Mw/Mn): 1.71
This polymer is designated as (Polymer-3).

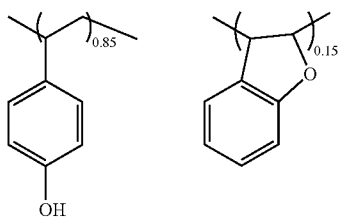

Polymer 3

Synthesis Example 4

Into a 2-L flask were charged 14.6 g of 4-acetoxy styrene, 2.0 g of benzothiophene, and 40 g of tetrahydrofurane as a solvent. The flask was cooled to −70° C. under a nitrogen atmosphere, and then the procedure of a deaeration under vacuum followed by a nitrogen blow was repeated for three times. After heated to a room temperature, 1.2 g of AIBN (azobisisobutyronitrile) was added as a polymerization initiator, and after the temperature was raised to 60° C., the reaction was carried out for 15 hours. The reaction solution was poured into 1 L of isopropyl alcohol for precipitation, and the white solid obtained was redissolved in 100 mL of methanol and 200 mL of tetrahydrofurane, added by 10 g of triethylamine and 10 g of water, and then a deprotection reaction of the acetyl group was carried out at 70° C. for 5 hours. The reaction solution was neutralized by acetic acid, concentrated, and dissolved in 100 mL of acetone. In a similar manner to those shown in the above, precipitation, filtration, and drying at 60° C. were carried out to obtain a white polymer.

A $^{13}$C-NMR, a $^{1}$H-NMR, and a GPC of the polymer thus obtained were measured to obtain the following analysis results.

Copolymer composition ratio (mole ratio):
4-hydroxy styrene:benzothiophene=0.87:0.13
Weight-average molecular weight (Mw): 6,600
Molecular weight distribution (Mw/Mn): 1.64
This polymer is designated as (Polymer-4).

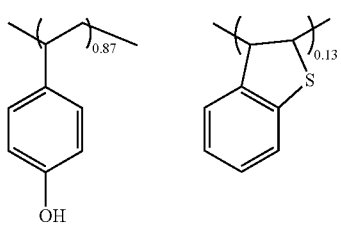

Polymer 4

Synthesis Example 5

Into a 2-L flask were charged 14.6 g of 4-acetoxy styrene, 1.5 g of acenaphthylene, and 40 g of tetrahydrofurane as a solvent. The flask was cooled to −70° C. under a nitrogen atmosphere, and then the procedure of a deaeration under vacuum followed by a nitrogen blow was repeated for three times. After heated to a room temperature, 1.2 g of AIBN (azobisisobutyronitrile) was added as a polymerization initiator, and after the temperature was raised to 60° C., the reaction was carried out for 15 hours. The reaction solution was poured into 1 L of isopropyl alcohol for precipitation, and the white solid obtained was redissolved in 100 mL of methanol and 200 mL of tetrahydrofurane, added by 10 g of triethylamine and 10 g of water, and then a deprotection reaction of the acetyl group was carried out at 70° C. for 5 hours. The reaction solution was neutralized by acetic acid, concentrated, and dissolved in 100 mL of acetone. In a similar manner to those shown in the above, precipitation, filtration, and drying at 60° C. were carried out to obtain a white polymer.

A $^{13}$C-NMR, a $^{1}$H-NMR, and a GPC of the polymer thus obtained were measured to obtain the following analysis results.

Copolymer composition ratio (mole ratio):
4-hydroxy styrene:acenaphthylene=0.90:0.10
Weight-average molecular weight (Mw): 5,500
Molecular weight distribution (Mw/Mn): 1.58
This polymer is designated as (Polymer-5).

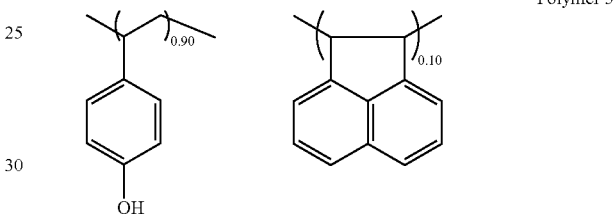

Polymer 5

Synthesis Example 6

Into a 2-L flask were charged 17.2 g of 4-ethoxyethoxy styrene, 2.2 g of chromone, and 40 g of tetrahydrofurane as a solvent. The flask was cooled to −70° C. under a nitrogen atmosphere, and then the procedure of a deaeration under vacuum followed by a nitrogen blow was repeated for three times. After heated to a room temperature, 1.2 g of AIBN (azobisisobutyronitrile) was added as a polymerization initiator, and after the temperature was raised to 60° C., the reaction was carried out for 15 hours. The reaction solution was poured into 1 L of isopropyl alcohol for precipitation, and the white solid obtained was redissolved in 100 mL of methanol and 200 mL of tetrahydrofurane, added by 10 g of oxalic acid and 10 g of water, and then a deprotection reaction of the ethoxyethoxy group was carried out at 70° C. for 1 hour. The reaction solution was neutralized by 50 g of sodium hydrogencarbonate, concentrated, and dissolved in 100 mL of acetone. In a similar manner to those shown in the above, precipitation, filtration, and drying at 60° C. were carried out to obtain a white polymer.

A $^{13}$C-NMR, a $^{1}$H-NMR, and a GPC of the polymer thus obtained were measured to obtain the following analysis results.

Copolymer composition ratio (mole ratio):
4-hydroxy styrene:chromone=0.83:0.17
Weight-average molecular weight (Mw): 5,300
Molecular weight distribution (Mw/Mn): 1.52
This polymer is designated as (Polymer-6).

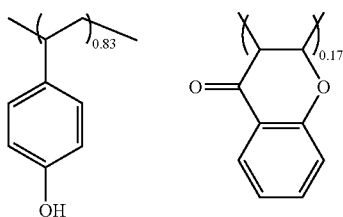

Polymer 6

Synthesis Example 7

Into a 2-L flask were charged 17.2 g of 4-ethoxyethoxy styrene, 2.2 g of cumarine, and 40 g of tetrahydrofurane as a solvent. The flask was cooled to −70° C. under a nitrogen atmosphere, and then the procedure of a deaeration under vacuum followed by a nitrogen blow was repeated for three times. After heated to a room temperature, 1.2 g of AIBN (azobisisobutyronitrile) was added as a polymerization initiator, and after the temperature was raised to 60° C., the reaction was carried out for 15 hours. The reaction solution was poured into 1 L of isopropyl alcohol for precipitation, and the white solid obtained was redissolved in 100 mL of methanol and 200 mL of tetrahydrofurane, added by 10 g of oxalic acid and 10 g of water, and then a deprotection reaction of the ethoxyethoxy group was carried out at 70° C. for 1 hour. The reaction solution was neutralized by 50 g of sodium hydrogencarbonate, concentrated, and dissolved in 100 mL of acetone. In a similar manner to those shown in the above, precipitation, filtration, and drying at 60° C. were carried out to obtain a white polymer.

A $^{13}$C-NMR, a $^1$H-NMR, and a GPC of the polymer thus obtained were measured to obtain the following analysis results.

Copolymer composition ratio (mole ratio):
4-hydroxy styrene:cumarine=0.83:0.17
Weight-average molecular weight (Mw): 5,100
Molecular weight distribution (Mw/Mn): 1.54
This polymer is designated as (Polymer-7).

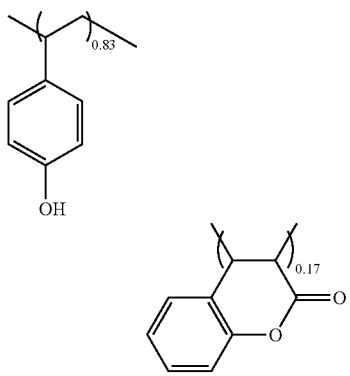

Polymer 7

Synthesis Example 8

Into a 2-L flask were charged 13.0 g of 4-acetoxy styrene, 1.5 g of acenaphthylene, 6.5 g of PAG monomer 1, and 40 g of tetrahydrofurane as a solvent. The flask was cooled to −70° C. under a nitrogen atmosphere, and then the procedure of a deaeration under vacuum followed by a nitrogen blow was repeated for three times. After heated to a room temperature, 1.2 g of AIBN (azobisisobutyronitrile) was added as a polymerization initiator, and after the temperature was raised to 60° C., the reaction was carried out for 15 hours. The reaction solution was poured into 1 L of isopropyl alcohol for precipitation, and the white solid obtained was redissolved in 100 mL of methanol and 200 mL of tetrahydrofurane, added by 10 g of triethylamine and 10 g of water, and then a deprotection reaction of the acetyl group was carried out at 70° C. for 5 hours. The reaction solution was neutralized by acetic acid, concentrated, and dissolved in 100 mL of acetone. In a similar manner to those shown in the above, precipitation, filtration, and drying at 60° C. were carried out to obtain a white polymer.

A $^{13}$C-NMR, a $^1$H-NMR, and a GPC of the polymer thus obtained were measured to obtain the following analysis results.

Copolymer composition ratio (mole ratio):
4-hydroxy styrene:acenaphthylene:PAG monomer 1=0.80:0.10:0.10
Weight-average molecular weight (Mw): 5,900
Molecular weight distribution (Mw/Mn): 1.67
This polymer is designated as (Polymer-8).

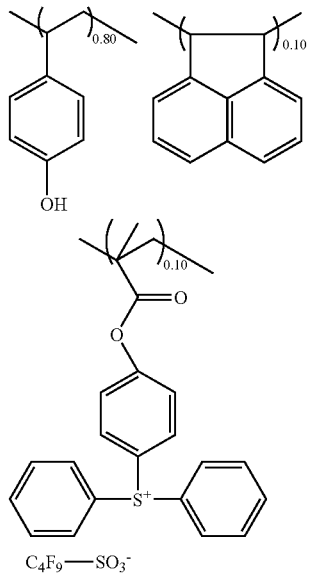

Polymer 8

Synthesis Example 9

Into a 2-L flask were charged 13.0 g of 4-acetoxy styrene, 2.2 g of chromone, 5.8 g of PAG monomer 2, and 40 g of tetrahydrofurane as a solvent. The flask was cooled to −70° C. under a nitrogen atmosphere, and then the procedure of a deaeration under vacuum followed by a nitrogen blow was repeated for three times. After heated to a room temperature, 1.2 g of AIBN (azobisisobutyronitrile) was added as a polymerization initiator, and after the temperature was raised to 60° C., the reaction was carried out for 15 hours. The reaction solution was poured into 1 L of isopropyl alcohol for precipitation, and the white solid obtained was redissolved in 100 mL of methanol and 200 mL of tetrahydrofurane, added by 10 g of triethylamine and 10 g of water, and then a deprotection reaction of the acetyl group was carried out at 70° C. for 5 hours. The reaction solution was neutralized by acetic acid, concentrated, and dissolved in 100 mL of acetone. In a similar manner to those shown in the above, precipitation, filtration, and drying at 60° C. were carried out to obtain a white polymer.

A $^{13}$C-NMR, a $^1$H-NMR, and a GPC of the polymer thus obtained were measured to obtain the following analysis results.

Copolymer composition ratio (mole ratio):
4-hydroxy styrene:chromone:PAG monomer 2=0.73 0.17:0.10
Weight-average molecular weight (Mw): 5,900
Molecular weight distribution (Mw/Mn): 1.56
This polymer is designated as (Polymer-9).

A $^{13}$C-NMR, a $^1$H-NMR, and a GPC of the polymer thus obtained were measured to obtain the following analysis results.

Copolymer composition ratio (mole ratio):
4-hydroxy styrene:chromone:PAG monomer 3=0.73:0.17:0.10
Weight-average molecular weight (Mw): 6,600
Molecular weight distribution (Mw/Mn): 1.81
This polymer is designated as (Polymer-10).

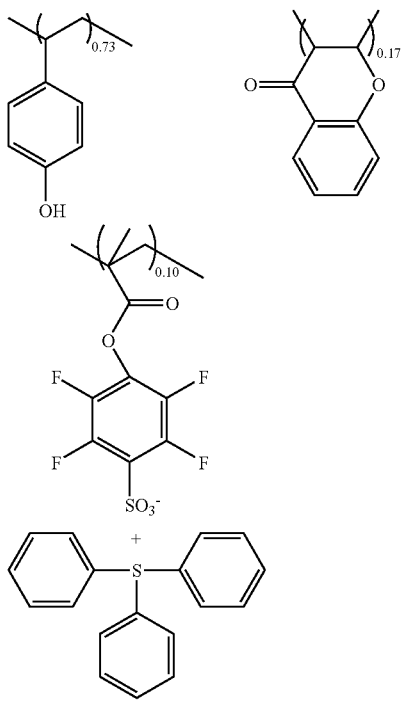

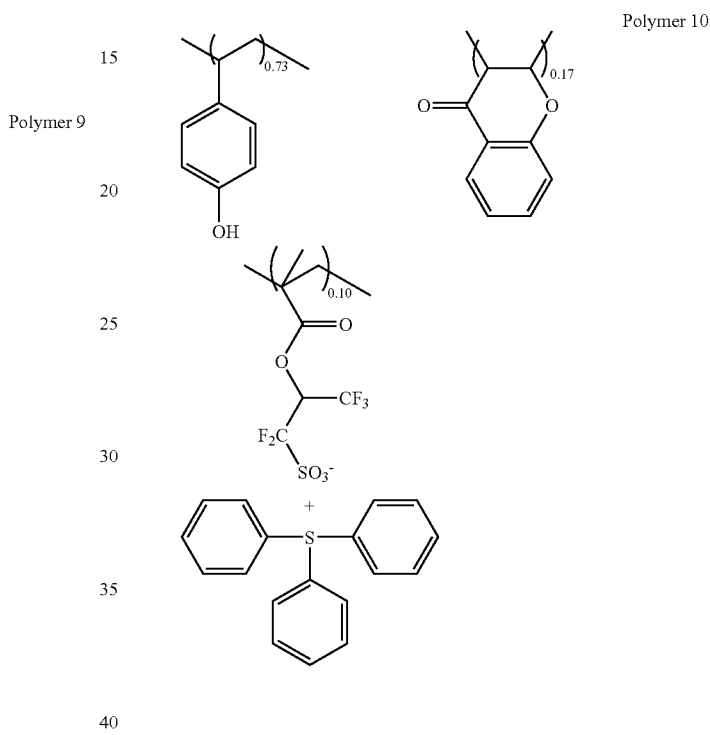

Synthesis Example 10

Into a 2-L flask were charged 13.0 g of 4-acetoxy styrene, 2.2 g of chromone, 5.6 g of PAG monomer 3, and 40 g of tetrahydrofurane as a solvent. The flask was cooled to −70° C. under a nitrogen atmosphere, and then the procedure of a deaeration under vacuum followed by a nitrogen blow was repeated for three times. After heated to a room temperature, 1.2 g of AIBN (azobisisobutyronitrile) was added as a polymerization initiator, and after the temperature was raised to 60° C., the reaction was carried out for 15 hours. The reaction solution was poured into 1 L of isopropyl alcohol for precipitation, and the white solid obtained was redissolved in 100 mL of methanol and 200 mL of tetrahydrofurane, added by 10 g of triethylamine and 10 g of water, and then a deprotection reaction of the acetyl group was carried out at 70° C. for 5 hours. The reaction solution was neutralized by acetic acid, concentrated, and dissolved in 100 mL of acetone. In a similar manner to those shown in the above, precipitation, filtration, and drying at 60° C. were carried out to obtain a white polymer.

Synthesis Example 11

Into a 2-L flask were charged 3.3 g of monomer 1, 9.7 g of 4-acetoxy styrene, 2.3 g of ethylcyclopentyl 2,5-norbornadiene-2-carboxylate, 5.6 g of PAG monomer 3, and 40 g of tetrahydrofurane as a solvent. The flask was cooled to −70° C. under a nitrogen atmosphere, and then the procedure of a deaeration under vacuum followed by a nitrogen blow was repeated for three times. After heated to a room temperature, 1.2 g of AIBN (azobisisobutyronitrile) was added as a polymerization initiator, and after the temperature was raised to 60° C., the reaction was carried out for 15 hours. The reaction solution was poured into 1 L of isopropyl alcohol for precipitation, and the white solid obtained was redissolved in 100 mL of methanol and 200 mL of tetrahydrofurane, added by 10 g of triethylamine and 10 g of water, and then a deprotection reaction of the acetyl group was carried out at 70° C. for 5 hours. The reaction solution was neutralized by acetic acid, concentrated, and dissolved in 100 mL of acetone. In a similar manner to those shown in the above, precipitation, filtration, and drying at 60° C. were carried out to obtain a white polymer.

A $^{13}$C-NMR, a $^1$H-NMR, and a GPC of the polymer thus obtained were measured to obtain the following analysis results.

Copolymer composition ratio (mole ratio):
monomer 1:4-hydroxy styrene:ethylcyclopentyl 2,5-norbornadiene-2-carboxylate:PAG monomer 3=0.10:0.70:0.10:0.10
Weight-average molecular weight (Mw): 6,900
Molecular weight distribution (Mw/Mn): 1.84
This polymer is designated as (Polymer-11).

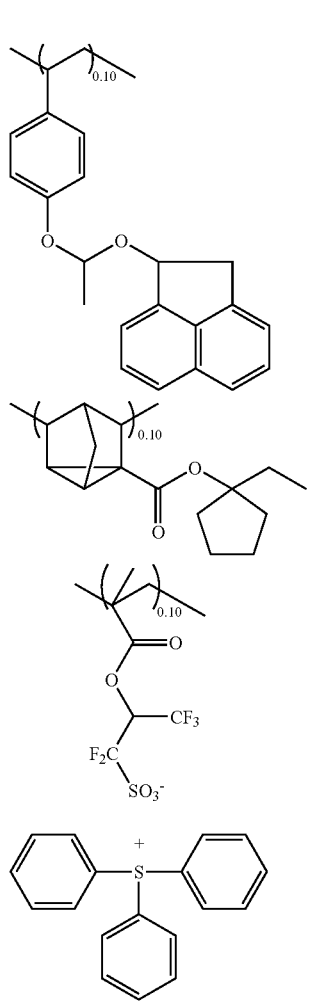

Polymer 11

Synthesis Example 12

Into a 2-L flask were charged 7.4 g of monomer 2, 9.7 g of 4-acetoxy styrene, 2.2 g of chromone, 5.6 g of PAG monomer 3, and 40 g of tetrahydrofurane as a solvent. The flask was cooled to −70° C. under a nitrogen atmosphere, and then the procedure of a deaeration under vacuum followed by a nitrogen blow was repeated for three times. After heated to a room temperature, 1.2 g of AIBN (azobisisobutyronitrile) was added as a polymerization initiator, and after the temperature was raised to 60° C., the reaction was carried out for 15 hours. The reaction solution was poured into 1 L of isopropyl alcohol for precipitation, and the white solid obtained was redissolved in 100 mL of methanol and 200 mL of tetrahydrofurane, added by 10 g of triethylamine and 10 g of water, and then a deprotection reaction of the acetyl group was carried out at 70° C. for 5 hours. The reaction solution was neutralized by acetic acid, concentrated, and dissolved in 100 mL of acetone. In a similar manner to those shown in the above, precipitation, filtration, and drying at 60° C. were carried out to obtain a white polymer.

A $^{13}$C-NMR, a $^1$H-NMR, and a GPC of the polymer thus obtained were measured to obtain the following analysis results.

Copolymer composition ratio (mole ratio):
monomer 2:4-hydroxy styrene:chromone:PAG monomer 3=0.20:0.53:0.17:0.10
Weight-average molecular weight (Mw): 6,600
Molecular weight distribution (Mw/Mn): 1.85
This polymer is designated as (Polymer-12).

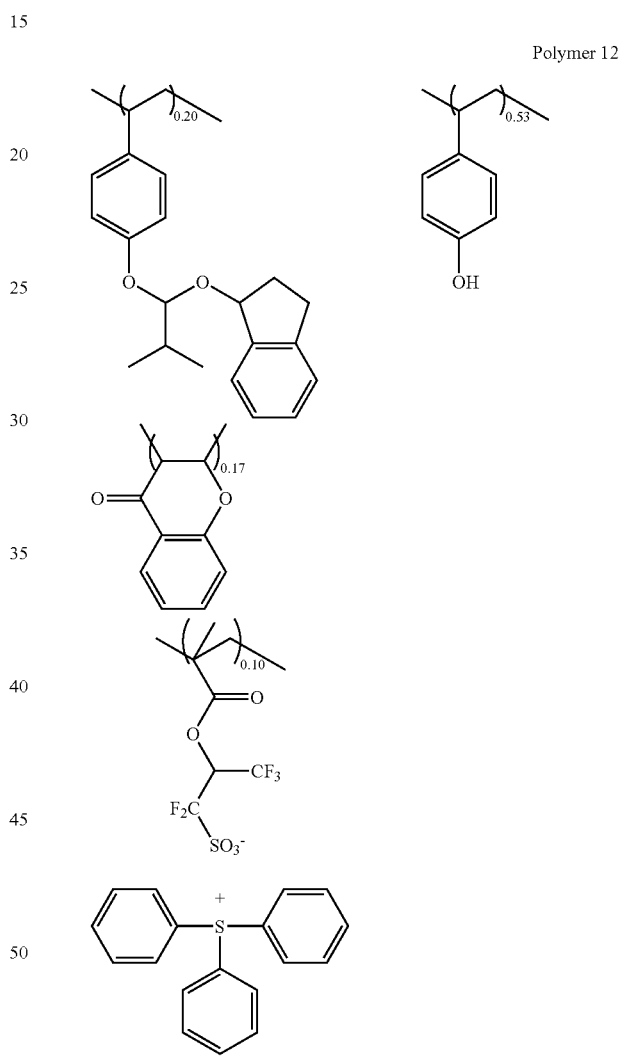

Polymer 12

Synthesis Example 13

Into a 2-L flask were charged 7.4 g of monomer 3, 9.7 g of 4-acetoxy styrene, 2.2 g of chromone, 5.6 g of PAG monomer 3, and 40 g of tetrahydrofurane as a solvent. The flask was cooled to −70° C. under a nitrogen atmosphere, and then the procedure of a deaeration under vacuum followed by a nitrogen blow was repeated for three times. After heated to a room temperature, 1.2 g of AIBN (azobisisobutyronitrile) was added as a polymerization initiator, and after the temperature was raised to 60° C., the reaction was carried out for 15 hours.

The reaction solution was poured into 1 L of isopropyl alcohol for precipitation, and the white solid obtained was redissolved in 100 mL of methanol and 200 mL of tetrahydrofurane, added by 10 g of triethylamine and 10 g of water, and then a deprotection reaction of the acetyl group was carried out at 70° C. for 5 hours. The reaction solution was neutralized by acetic acid, concentrated, and dissolved in 100 mL of acetone. In a similar manner to those shown in the above, precipitation, filtration, and drying at 60° C. were carried out to obtain a white polymer.

A $^{13}$C-NMR, a $^{1}$H-NMR, and a GPC of the polymer thus obtained were measured to obtain the following analysis results.

Copolymer composition ratio (mole ratio):
monomer 3:4-hydroxy styrene:chromone:PAG monomer 3=0.20:0.53:0.17:0.10
Weight-average molecular weight (Mw): 6,600
Molecular weight distribution (Mw/Mn): 1.85
This polymer is designated as (Polymer-13).

after adding 0.25 g of an aqueous ammonia (30%). The reaction solution was poured into 1 L of acetic acid solution for crystallization precipitation, and further washed by water for two times. The white solid thus obtained was filtered and dried at 40° C. under reduced pressure to obtain a white polymer.

A $^{13}$C-NMR, a $^{1}$H-NMR, and a GPC of the polymer thus obtained were measured to obtain the following analysis results.

Copolymer composition ratio (mole ratio):
4-hydroxy styrene:6-hydroxy-2-vinylnaphthalene:4-[1-(9-fluoreneoxy)ethoxy]styrene:6-[1-(9-fluoreneoxy)ethoxy]-2-vinylnaphthalene=0.41:0.42:0.09:0.08
Weight-average molecular weight (Mw): 9,300
Molecular weight distribution (Mw/Mn): 1.86
This polymer is designated as (Polymer-14).

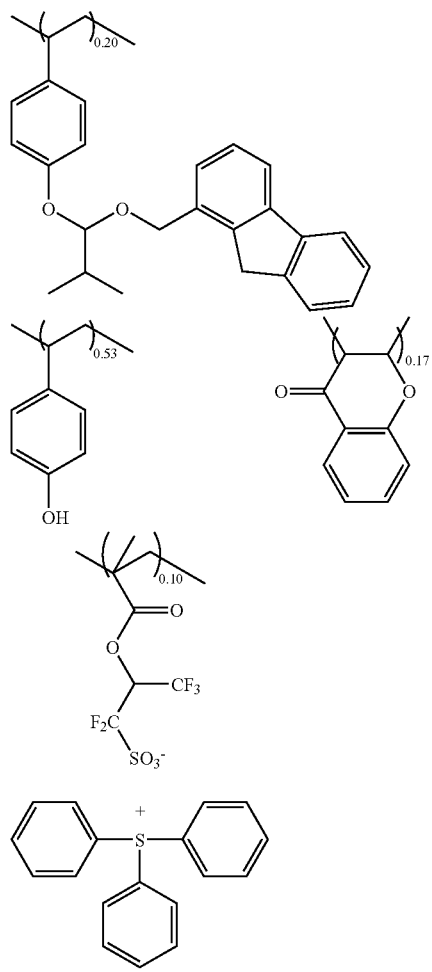

Polymer 13

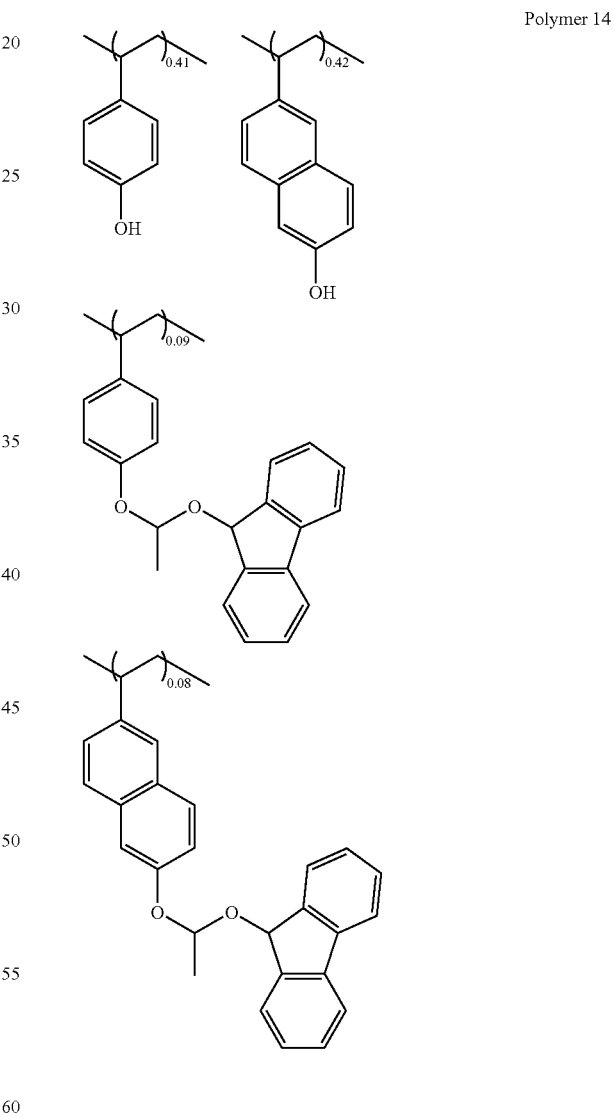

Polymer 14

Synthesis Example 14

Into 40 mL of tetrahydrofurane was dissolved 4 g of polymer 1, and then added 0.01 g of methane sulfonic acid and 1.5 g of 9-vinyloxy-9H-fluorene. The reaction was carried out at room temperature for 1 hour, and then quenched the reaction Synthesis Example 15

Into 40 mL of tetrahydrofurane was dissolved 4 g of polymer 2, and then added 0.01 g of methane sulfonic acid and 1.5 g of 9-vinyloxy-9H-fluorene. The reaction was carried out at room temperature for 1 hour, and then quenched the reaction after adding 0.25 g of an aqueous ammonia (30%). The reaction solution was poured into 1 L of acetic acid solution for crystallization precipitation, and further washed by water for two times. The white solid thus obtained was filtered and dried at 40° C. under reduced pressure to obtain a white polymer.

A $^{13}$C-NMR, a $^1$H-NMR, and a GPC of the polymer thus obtained were measured to obtain the following analysis results.

Copolymer composition ratio (mole ratio):
4-hydroxy styrene:4-[1-(9-fluorenyloxy)ethoxy]styrene:indene=0.72:0.18
Weight-average molecular weight (Mw): 6,500
Molecular weight distribution (Mw/Mn): 1.73
This polymer is designated as (Polymer-15).

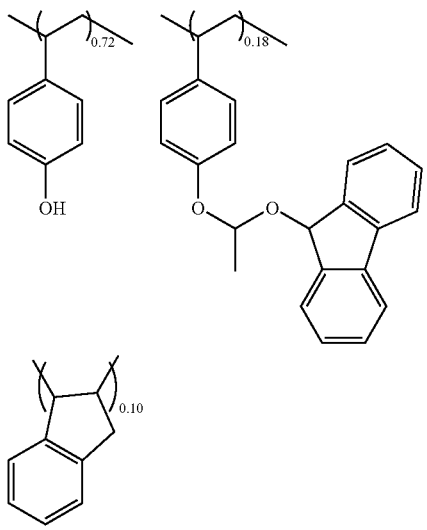

Polymer 15

Synthesis Example 16

Into 40 mL of tetrahydrofurane was dissolved 4 g of polymer 3, and then added 0.01 g of methane sulfonic acid and 1.5 g of 9-vinyloxy-9H-fluorene. The reaction was carried out at room temperature for 1 hour, and then quenched the reaction after adding 0.25 g of an aqueous ammonia (30%). The reaction solution was poured into 1 L of acetic acid solution for crystallization precipitation, and further washed by water for two times. The white solid thus obtained was filtered and dried at 40° C. under reduced pressure to obtain a white polymer.

A $^{13}$C-NMR, a $^1$H-NMR, and a GPC of the polymer thus obtained were measured to obtain the following analysis results.

Copolymer composition ratio (mole ratio):
4-hydroxy styrene:4-[1-(9-fluorenyloxy)ethoxy]styrene:benzofurane=0.73:0.13:0.14
Weight-average molecular weight (Mw): 6,300
Molecular weight distribution (Mw/Mn): 1.70

This polymer is designated as (Polymer-16).

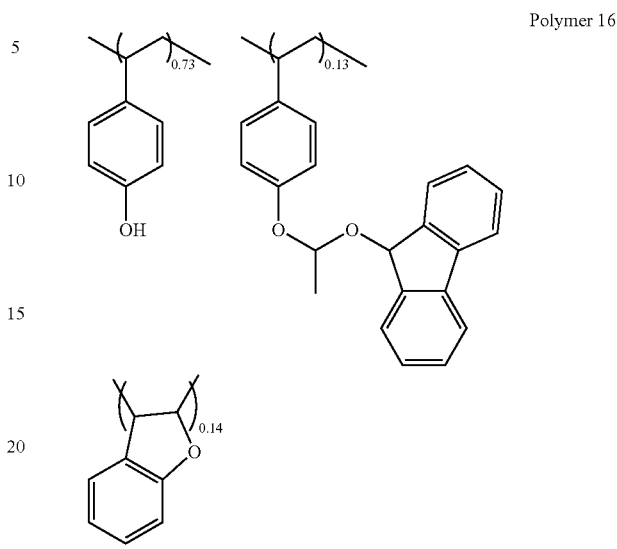

Polymer 16

Synthesis Example 17

Into 40 mL of tetrahydrofurane was dissolved 4 g of polymer 4, and then added 0.01 g of methane sulfonic acid and 1.5 g of 9-vinyloxy-9H-fluorene. The reaction was carried out at room temperature for 1 hour, and then quenched the reaction after adding 0.25 g of an aqueous ammonia (30%). The reaction solution was poured into 1 L of acetic acid solution for crystallization precipitation, and further washed by water for two times. The white solid thus obtained was filtered and dried at 40° C. under reduced pressure to obtain a white polymer.

A $^{13}$C-NMR, a $^1$H-NMR, and a GPC of the polymer thus obtained were measured to obtain the following analysis results.

Copolymer composition ratio (mole ratio):
4-hydroxy styrene:4-[1-(9-fluorenyloxy)ethoxy]styrene: benzothiophene=0.75:0.12:0.13
Weight-average molecular weight (Mw): 6,700
Molecular weight distribution (Mw/Mn): 1.64
This polymer is designated as (Polymer-17).

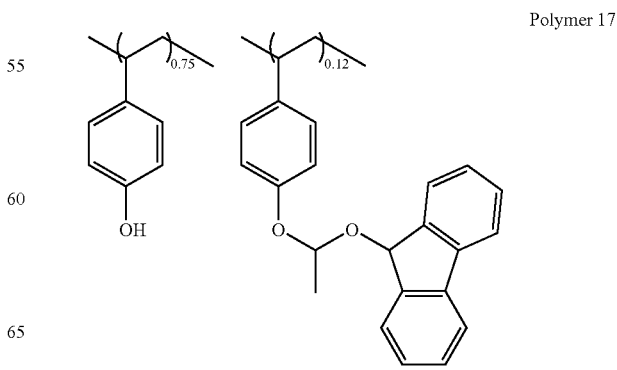

Polymer 17

-continued

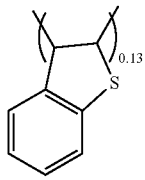

Synthesis Example 18

Into 40 mL of tetrahydrofurane was dissolved 4 g of polymer 5, and then added 0.01 g of methane sulfonic acid and 1.5 g of 9-vinyloxy-9H-fluorene. The reaction was carried out at room temperature for 1 hour, and then quenched the reaction after adding 0.25 g of an aqueous ammonia (30%). The reaction solution was poured into 1 L of acetic acid solution for crystallization precipitation, and further washed by water for two times. The white solid thus obtained was filtered and dried at 40° C. under reduced pressure to obtain a white polymer.

A $^{13}$C-NMR, a $^1$H-NMR, and a GPC of the polymer thus obtained were measured to obtain the following analysis results.

Copolymer composition ratio (mole ratio):
4-hydroxy styrene:4-[1-(9-fluorenyloxy)ethoxy]styrene: acenaphthylene=0.77:0.13:0.10
Weight-average molecular weight (Mw): 5,800
Molecular weight distribution (Mw/Mn): 1.57
This polymer is designated as (Polymer-18).

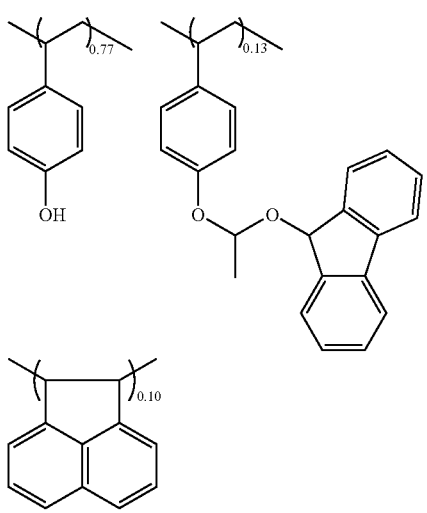

Polymer 18

Synthesis Example 19

Into 40 mL of tetrahydrofurane was dissolved 4 g of polymer 6, and then added 0.01 g of methane sulfonic acid and 1.5 g of 9-vinyloxy-9H-fluorene. The reaction was carried out at room temperature for 1 hour, and then quenched the reaction after adding 0.25 g of an aqueous ammonia (30%). The reaction solution was poured into 1 mL of acetic acid solution for crystallization precipitation, and further washed by water for two times. The white solid thus obtained was filtered and dried at 40° C. under reduced pressure to obtain a white polymer.

A $^{13}$C-NMR, a $^1$H-NMR, and a GPC of the polymer thus obtained were measured to obtain the following analysis results.

Copolymer composition ratio (mole ratio):
4-hydroxy styrene:4-[1-(9-fluorenyloxy)ethoxy]styrene: chromone=0.70:0.13:0.17
Weight-average molecular weight (Mw): 5,800
Molecular weight distribution (Mw/Mn): 1.55
This polymer is designated as (Polymer-19).

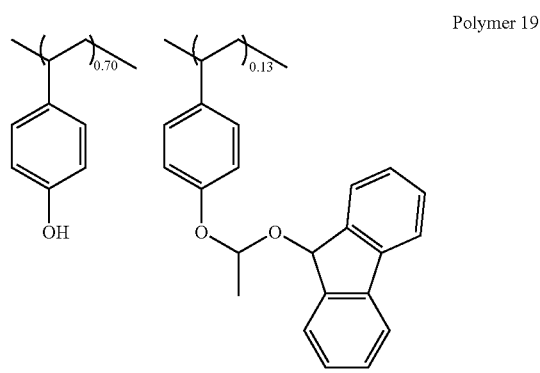

Polymer 19

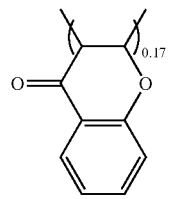

Synthesis Example 20

Into 40 mL of tetrahydrofurane was dissolved 4 g of polymer 7, and then added 0.01 g of methane sulfonic acid and 1.5 g of 9-vinyloxy-9H-fluorene. The reaction was carried out at room temperature for 1 hour, and then quenched the reaction after adding 0.25 g of an aqueous ammonia (30%). The reaction solution was poured into 1 L of acetic acid solution for crystallization precipitation, and further washed by water for two times. The white solid thus obtained was filtered and dried at 40° C. under reduced pressure to obtain a white polymer.

A $^{13}$C-NMR, a $^1$H-NMR, and a GPC of the polymer thus obtained were measured to obtain the following analysis results.

Copolymer composition ratio (mole ratio):
4-hydroxy styrene:4-[1-(9-fluorenyloxy)ethoxy]styrene:cumarine=0.70:0.13:0.17
Weight-average molecular weight (Mw): 5,400
Molecular weight distribution (Mw/Mn): 1.51

This polymer is designated as (Polymer-20).

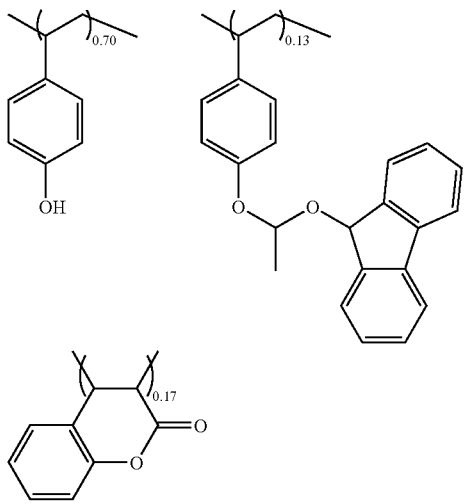

Polymer 20

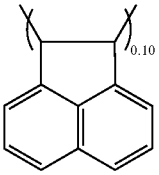

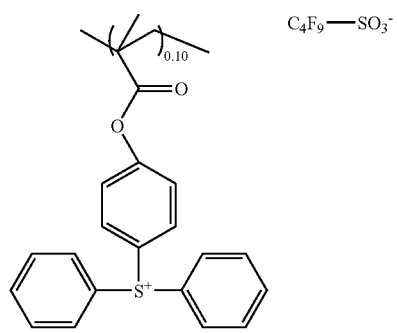

Synthesis Example 21

Into 40 mL of tetrahydrofurane was dissolved 4 g of polymer 8, and then added 0.01 g of methane sulfonic acid and 1.5 g of 9-vinyloxy-9H-fluorene. The reaction was carried out at room temperature for 1 hour, and then quenched the reaction after adding 0.25 g of an aqueous ammonia (30%). The reaction solution was poured into 1 L of acetic acid solution for crystallization precipitation, and further washed by water for two times. The white solid thus obtained was filtered and dried at 40° C. under reduced pressure to obtain a white polymer.

A $^{13}$C-NMR, a $^1$H-NMR, and a GPC of the polymer thus obtained were measured to obtain the following analysis results.

Copolymer composition ratio (mole ratio):
4-hydroxy styrene:4-[1-(9-fluorenyloxy)ethoxy]styrene: acenaphthyrene:PAG monomer 1=0.66:0.14:0.10:0.10
Weight-average molecular weight (Mw): 6,200
Molecular weight distribution (Mw/Mn): 1.65
This polymer is designated as (Polymer-21).

Synthesis Example 22

Into 40 mL of tetrahydrofurane was dissolved 4 g of polymer 9, and then added 0.01 g of methane sulfonic acid and 1.5 g of 9-vinyloxy-9H-fluorene. The reaction was carried out at room temperature for 1 hour, and then quenched the reaction after adding 0.25 g of an aqueous ammonia (30%). The reaction solution was poured into 1 L of acetic acid solution for crystallization precipitation, and further washed by water for two times. The white solid thus obtained was filtered and dried at 40° C. under reduced pressure to obtain a white polymer.

A $^{13}$C-NMR, a $^1$H-NMR, and a GPC of the polymer thus obtained were measured to obtain the following analysis results.

Copolymer composition ratio (mole ratio):
4-hydroxy styrene:4-[1-(9-fluorenyloxy)ethoxy]styrene: chromone:PAG monomer 2=0.58:0.15:0.17:0.10
Weight-average molecular weight. (Mw): 6,200
Molecular weight distribution (Mw/Mn): 1.55
This polymer is designated as (Polymer-22).

Polymer 21

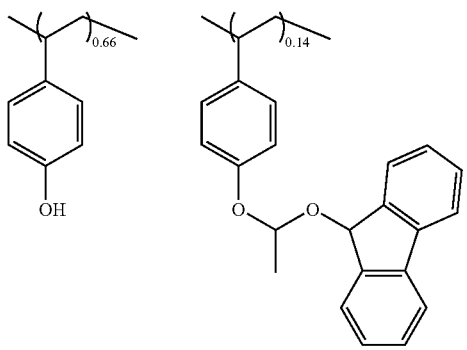

Polymer 22

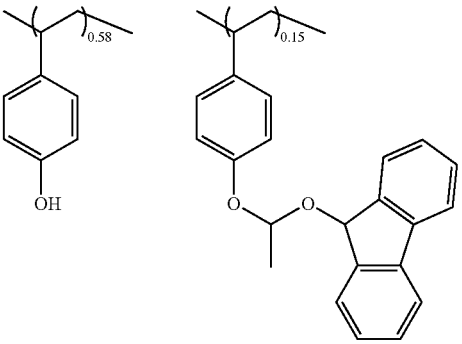

-continued

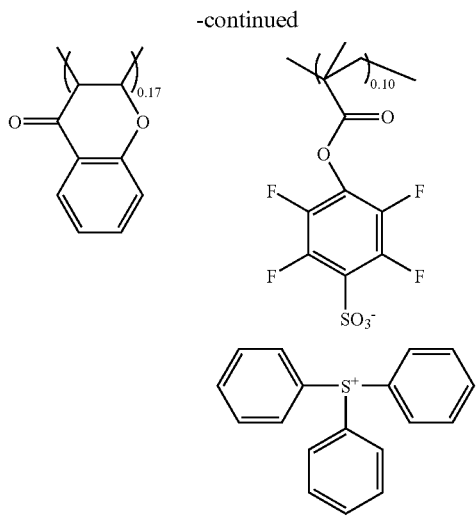

Synthesis Example 23

Into 40 mL of tetrahydrofurane was dissolved 4 g of polymer 10, and then added 0.01 g of methane sulfonic acid and 1.5 g of 9-(vinyloxy)-9H-fluorene. The reaction was carried out at room temperature for 1 hour, and then quenched the reaction after adding 0.25 g of an aqueous ammonia (30%). The reaction solution was poured into 1 L of acetic acid solution for crystallization precipitation, and further washed by water for two times. The white solid thus obtained was filtered and dried at 40° C. under reduced pressure to obtain a white polymer.

A $^{13}$C-NMR, a $^1$H-NMR, and a GPC of the polymer thus obtained were measured to obtain the following analysis results.

Copolymer composition ratio (mole ratio):
4-hydroxy styrene:4-[1-(9-fluorenyloxy)ethoxy]styrene:chromone:PAG monomer 3=0.58:0.15:0.17:0.10
Weight-average molecular weight (Mw): 6,700
Molecular weight distribution (Mw/Mn): 1.81
This polymer is designated as (Polymer-23).

Polymer 23

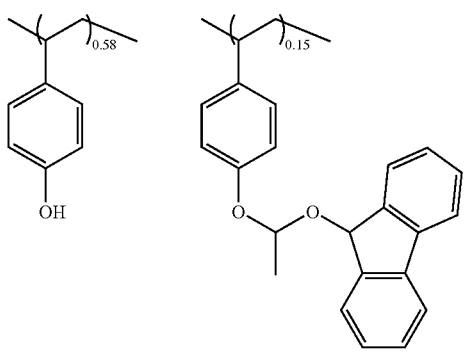

-continued

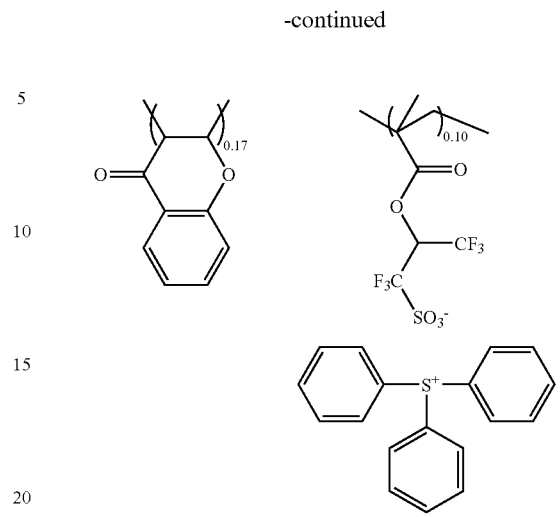

Synthesis Example 24

Into a 2-L flask were charged 3.3 g of monomer 1, 9.7 g of 4-acetoxy styrene, 1.3 g of 2-ethyladamantyl methacrylate, 5.6 g of PAG monomer 3, and 40 g of tetrahydrofurane as a solvent. The flask was cooled to −70° C. under a nitrogen atmosphere, and then the procedure of a deaeration under vacuum followed by a nitrogen blow was repeated for three times. After heated to a room temperature, 1.2 g of AIBN (azobisisobutyronitrile) was added as a polymerization initiator, and after the temperature was raised to 60° C., the reaction was carried out for 15 hours. The reaction solution was poured into 1 L of isopropyl alcohol for precipitation, and the white solid obtained was redissolved in 100 mL of methanol and 200 mL of tetrahydrofurane, added by 10 g of triethylamine and 10 g of water, and then a deprotection reaction of the acetyl group was carried out at 70° C. for 5 hours. The reaction solution was neutralized by acetic acid, concentrated, and dissolved in 100 mL of acetone. In a similar manner to those shown in the above, precipitation, filtration, and drying at 60° C. were carried out to obtain a white polymer.

A $^{13}$C-NMR, a $^1$H-NMR, and a GPC of the polymer thus obtained were measured to obtain the following analysis results.

Copolymer composition ratio (mole ratio):

monomer 1:4-hydroxy styrene:2-ethyladamantyl methacrylate:PAG monomer 3=0.10:0.70:0.10:0.10

Weight-average molecular weight (Mw): 6,900
Molecular weight distribution (Mw/Mn): 1.78

This polymer is designated as (Polymer-24).

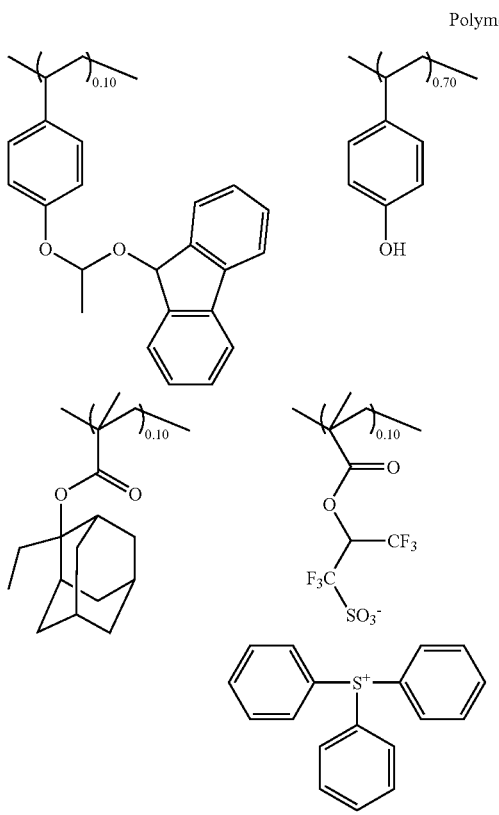

Polymer 24

Synthesis Example 25

Into a 2-L flask were charged 13.0 g of 4-acetoxy styrene, 2.2 g of chromone, 3.9 g of PAG monomer 4, and 40 g of tetrahydrofurane as a solvent. The flask was cooled to −70° C. under a nitrogen atmosphere, and then the procedure of a deaeration under vacuum followed by a nitrogen blow was repeated for three times. After heated to a room temperature, 1.2 g of AIBN (azobisisobutyronitrile) was added as a polymerization initiator, and after the temperature was raised to 60° C., the reaction was carried out for 15 hours. The reaction solution was poured into 1 L of isopropyl alcohol for precipitation, and the white solid obtained was redissolved in 100 mL of methanol and 200 mL of tetrahydrofurane, added by 10 g of triethylamine and 10 g of water, and then a deprotection reaction of the acetyl group was carried out at 70° C. for 5 hours. The reaction solution was neutralized by acetic acid, concentrated, and dissolved in 100 mL of acetone. In a similar manner to those shown in the above, precipitation, filtration, and drying at 60° C. were carried out to obtain a white polymer.

A $^{13}$C-NMR, a $^1$H-NMR, and a GPC of the polymer thus obtained were measured to obtain the following analysis results.

Copolymer composition ratio (mole ratio):
4-hydroxy styrene:chromone:PAG monomer 4=0.73:0.17:0.10
Weight-average molecular weight (Mw): 6,500
Molecular weight distribution (Mw/Mn): 1.88

This polymer is designated as (Polymer-25).

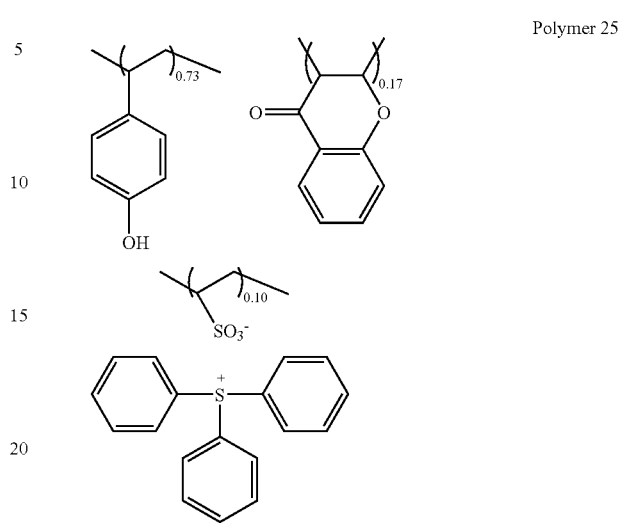

Polymer 25

Synthesis Example 26

Into 40 mL of tetrahydrofurane was dissolved 4 g of polymer 25, and then added 0.01 g of methane sulfonic acid and 1.5 g of 9-vinyloxy-9H-fluorene. The reaction was carried out at room temperature for 1 hour, and then quenched the reaction after adding 0.25 g of an aqueous ammonia (30%). The reaction solution was poured into 1 L of acetic acid solution for crystallization precipitation, and further washed by water for two times. The white solid thus obtained was filtered and dried at 40° C. under reduced pressure to obtain a white polymer.

A $^{13}$C-NMR, a $^1$H-NMR, and a GPC of the polymer thus obtained were measured to obtain the following analysis results.

Copolymer composition ratio (mole ratio):
4-hydroxy styrene:4-[1-(9-fluorenyloxy)ethoxy]styrene:chromone:PAG monomer 4=0.58:0.15:0.17:0.10
Weight-average molecular weight (Mw): 6,700
Molecular weight distribution (Mw/Mn): 1.89

This polymer is designated as (Polymer-26).

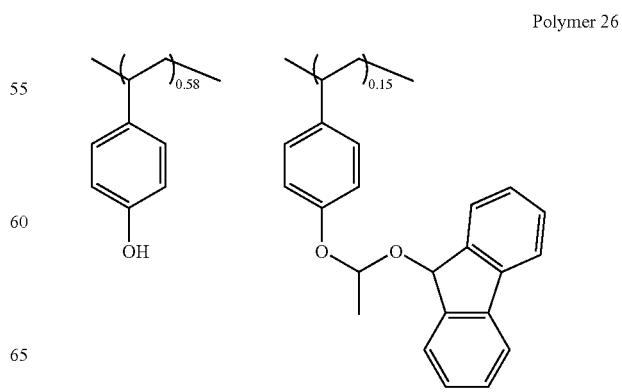

Polymer 26

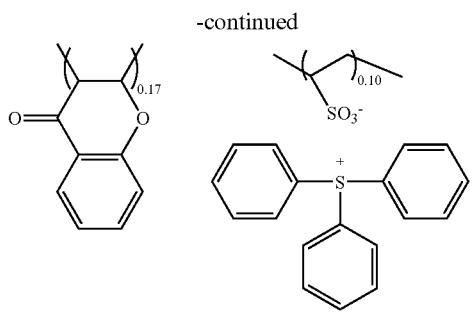

Synthesis Example 27

Into a 2-L flask were charged 13.0 g of 4-acetoxy styrene, 2.2 g of cumarine, 4.0 g of PAG monomer 5, and 40 g of tetrahydrofurane as a solvent. The flask was cooled to −70° C. under a nitrogen atmosphere, and then the procedure of a deaeration under vacuum followed by a nitrogen blow was repeated for three times. After heated to a room temperature, 1.2 g of AIBN (azobisisobutyronitrile) was added as a polymerization initiator, and after the temperature was raised to 60° C., the reaction was carried out for 15 hours. The reaction solution was poured into 1 L of isopropyl alcohol for precipitation, and the white solid obtained was redissolved in 100 mL of methanol and 200 mL of tetrahydrofurane, added by 10 g of triethylamine and 10 g of water, and then a deprotection reaction of the acetyl group was carried out at 70° C. for 5 hours. The reaction solution was neutralized by acetic acid, concentrated, and dissolved in 100 mL of acetone. In a similar manner to those shown in the above, precipitation, filtration, and drying at 60° C. were carried out to obtain a white polymer.

A $^{13}$C-NMR, a $^{1}$H-NMR, and a GPC of the polymer thus obtained were measured to obtain the following analysis results.

Copolymer composition ratio (mole ratio):
4-hydroxy styrene:cumarine:PAG monomer 5=0.73:0.17:0.10
Weight-average molecular weight (Mw): 6,600
Molecular weight distribution (Mw/Mn): 1.93
This polymer is designated as (Polymer-27).

Polymer 27

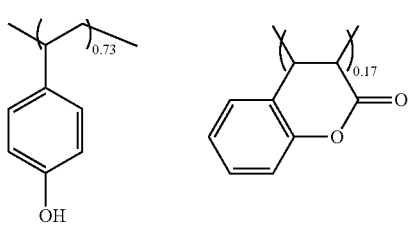

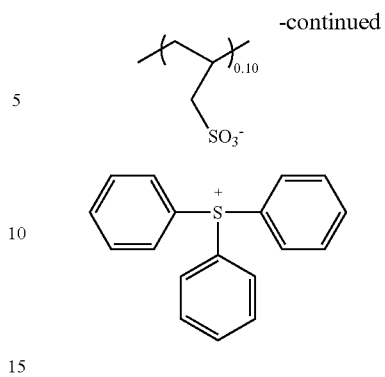

Synthesis Example 28

Into 40 mL of tetrahydrofurane was dissolved 4 g of polymer 27, and then added 0.01 g of methane sulfonic acid and 1.5 g of 9-vinyloxy-9H-fluorene. The reaction was carried out at room temperature for 1 hour, and then quenched the reaction after adding 0.25 g of an aqueous ammonia (30%). The reaction solution was poured into 1 L of acetic acid solution for crystallization precipitation, and further washed by water for two times. The white solid thus obtained was filtered and dried at 40° C. under reduced pressure to obtain a white polymer.

A $^{13}$C-NMR, a $^{1}$H-NMR, and a GPC of the polymer thus obtained were measured to obtain the following analysis results.

Copolymer composition ratio (mole ratio):
4-hydroxy styrene:4-[1-(9-fluorenyloxy)ethoxy]styrene:cumarine:PAG monomer 5=0.58:0.15:0.17:0.10
Weight-average molecular weight (Mw): 6,900
Molecular weight distribution (Mw/Mn): 1.93
This polymer is designated as (Polymer-28).

Polymer 28

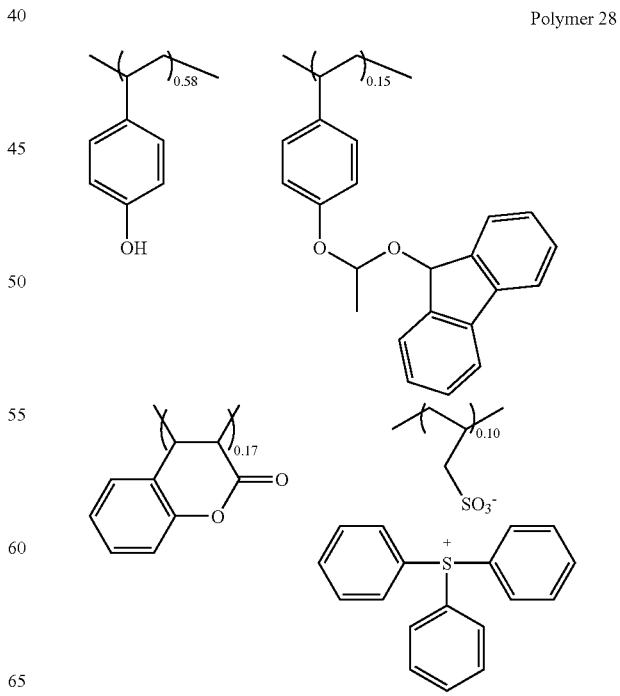

Comparative Synthesis Example 1

In a similar manner to the Synthesis Examples as mentioned above, the following 2-components polymer was synthesized.

A $^{13}$C-NMR, a $^1$H-NMR, and a GPC of the polymer thus obtained were measured to obtain the following analysis results.

Copolymer composition ratio (mole ratio):
4-hydroxy styrene:1-ethylcyclopentyl methacrylate ester=0.71:0.29
Weight-average molecular weight (Mw): 16,100
Molecular weight distribution (Mw/Mn): 1.70
This polymer is designated as (Comparative Polymer-1).

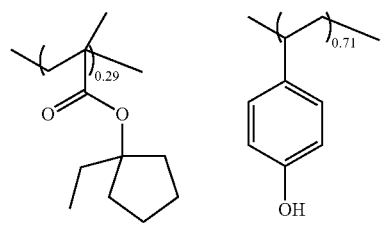

Comparative Polymer 1

Comparative Synthesis Example 2

By using a 2-L flask, 40 g of polyhydroxystyrene (Mw=11,000, Mw/Mn=1.08) was dissolved in 400 mL tetrahydrofurane. After 1.4 g of methane sulfonic acid and 12.3 g of ethyl vinyl ether were added to the mixture, the reaction was carried out at room temperature for 1 hour, and then quenched the reaction after adding 2.5 g of an aqueous ammonia (30%). The reaction solution was poured into 5 L of acetic acid solution for crystallization precipitation, and further washed by water for two times. The white solid thus obtained was filtered and dried at 40° C. under reduced pressure to obtain 47 g of a white polymer.

A $^{13}$C-NMR, a $^1$H-NMR, and a GPC of the polymer thus obtained were measured to obtain the following analysis results.

Copolymer composition ratio (mole ratio):
4-hydroxy styrene:p-ethoxyethoxystyrene=0.64:0.36
Weight-average molecular weight (Mw): 13,000
Molecular weight distribution (Mw/Mn): 1.10
This polymer is designated as (Comparative Polymer-2).

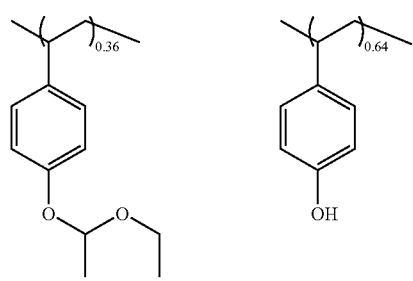

Comparative Polymer 2

Here, PAG monomers 1 to 5 and monomers 1 to 3 used in the above Synthesis Examples are shown below.

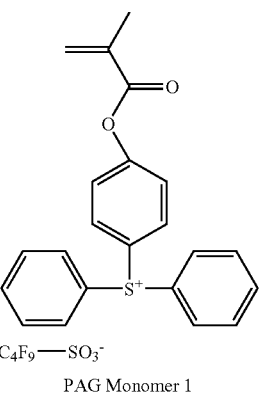

PAG Monomer 1

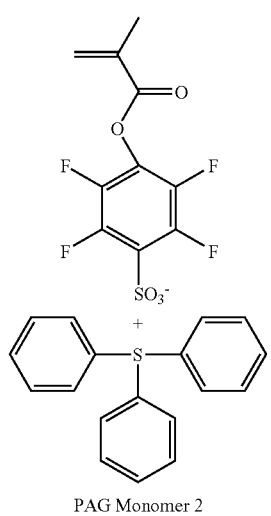

PAG Monomer 2

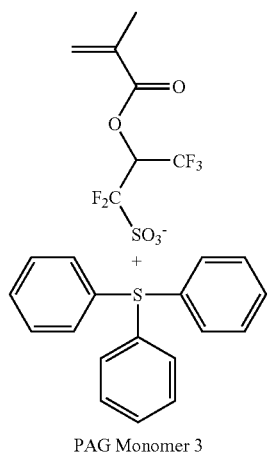

PAG Monomer 3

-continued

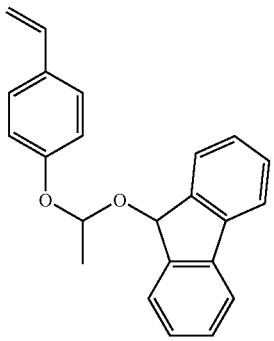

Monomer 1

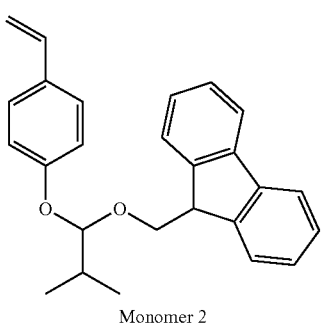

Monomer 2

-continued

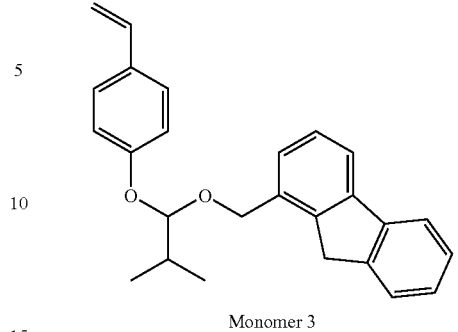

Monomer 3

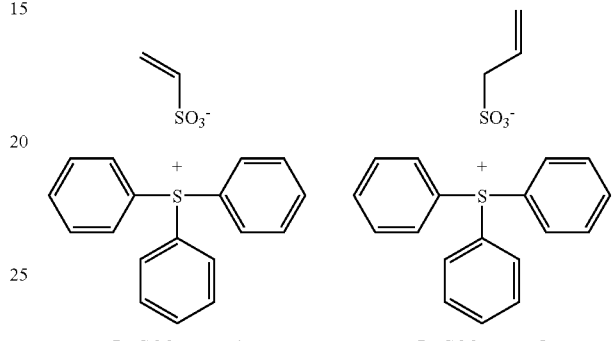

PAG Monomer 4      PAG Monomer 5

Examples and Comparative Examples

The above polymers synthesized were dissolved in accordance with the compositions shown in Table 1. The solutions thus obtained were filtered through a filter of a 0.2-μm size to obtain the positive resist compositions (Examples 1 to 20, Comparative Examples 1 and 2).

TABLE 1

|  | Polymer (Parts by mass) | Acid generator (Parts by mass) | Base (Parts by mass) | Dissoluiton inhibitor (Parts by mass) | Organic Solvent (Parts by mass) | Sensitivity (μC/cm²) | Edge roughness (nm) | Degree of resolution (nm) |
|---|---|---|---|---|---|---|---|---|
| EXAMPLE 1 | Polymer 11 (100) | — | Amine 1 (0.6) | — | PGMEA (1000) | 13.3 | 5.3 | 80 |
| EXAMPLE 2 | Polymer 12 (100) | — | Amine 1 (0.6) | — | PGMEA (1000) | 16.7 | 4.9 | 80 |
| EXAMPLE 3 | Polymer 13 (100) | — | Amine 1 (0.6) | — | PGMEA (1000) | 13.1 | 5.0 | 80 |
| EXAMPLE 4 | Polymer 14 (100) | PAG 1 (15) | Amine 1 (0.6) | — | PGMEA (1000) | 14.1 | 6.4 | 80 |
| EXAMPLE 5 | Polymer 15 (100) | PAG 1 (15) | Amine 1 (0.6) | — | PGMEA (1000) | 16.3 | 6.5 | 80 |
| EXAMPLE 6 | Polymer 16 (100) | PAG 1 (15) | Amine 1 (0.6) | — | PGMEA (1000) | 18.1 | 6.5 | 80 |
| EXAMPLE 7 | Polymer 17 (100) | PAG 1 (15) | Amine 1 (0.6) | — | PGMEA (1000) | 17.3 | 6.8 | 80 |
| EXAMPLE 8 | Polymer 18 (100) | PAG 1 (15) | Amine 1 (0.6) | — | PGMEA (1000) | 18.3 | 6.1 | 80 |

TABLE 1-continued

| | Polymer (Parts by mass) | Acid generator (Parts by mass) | Base (Parts by mass) | Dissoluiton inhibitor (Parts by mass) | Organic Solvent (Parts by mass) | Sensitivity ($\mu C/cm^2$) | Edge roughness (nm) | Degree of resolution (nm) |
|---|---|---|---|---|---|---|---|---|
| EXAMPLE 9 | Polymer 19 (100) | PAG 1 (15) | Amine 1 (0.6) | — | PGMEA (1000) | 18.2 | 6.3 | 80 |
| EXAMPLE 10 | Polymer 20 (100) | PAG 1 (15) | Amine 1 (0.6) | — | PGMEA (1000) | 18.5 | 5.2 | 80 |
| EXAMPLE 11 | Polymer 21 (100) | — | Amine 1 (0.6) | — | PGMEA (1000) | 14.2 | 5.0 | 80 |
| EXAMPLE 12 | Polymer 22 (100) | — | Amine 1 (0.6) | — | PGMEA (1000) | 18.9 | 5.9 | 80 |
| EXAMPLE 13 | Polymer 23 (100) | — | Amine 1 (0.6) | — | PGMEA (1000) | 18.4 | 6.0 | 80 |
| EXAMPLE 14 | Polymer 24 (100) | — | Amine 1 (0.6) | — | PGMEA (1000) | 18.7 | 6.5 | 80 |
| EXAMPLE 15 | Polymer 16 (100) | PAG 2 (15) | Amine 1 (0.6) | — | PGMEA (700) EL (300) | 18.6 | 7.7 | 80 |
| EXAMPLE 16 | Polymer 16 (100) | PAG 1 (15) | Amine 2 (0.6) | — | PGMEA (1000) | 16.9 | 6.2 | 80 |
| EXAMPLE 17 | Polymer 16 (100) | PAG 1 (15) | Amine 3 (0.6) | — | PGMEA (1000) | 16.3 | 6.7 | 80 |
| EXAMPLE 18 | Polymer 16 (100) | PAG 1 (15) | Amine 1 (0.6) | DRI 1 (15) | PGMEA (1000) | 15.3 | 6.8 | 80 |
| EXAMPLE 19 | Polymer 26 (100) | — | Quencher 1 (0.6) | — | PGMEA (1000) | 25.3 | 4.7 | 80 |
| EXAMPLE 20 | Polymer 28 (100) | — | Quencher 1 (0.6) | — | PGMEA (1000) | 24.0 | 4.6 | 80 |
| COMPARATIVE EXAMPLE 1 | Comparative Polymer 1 (100) | PAG 1 (15) | Amine 1 (0.6) | — | PGMEA (1000) | 18.8 | 8.8 | 100 |
| COMPARATIVE EXAMPLE 2 | Comparative Polymer 1 (100) | PAG 1 (15) | Amine 1 (0.6) | — | PGMEA (1000) | 12.5 | 8.2 | 100 |

Each compositions in Table 1 are as follows.

Polymers 11 to 24, 26 and 28: obtained by the Synthesis Examples 11 to 24, 26 and 28.

Comparative Polymers 1 and 2: obtained by the Comparative Examples 1 and 2.

Organic solvent: PGMEA (propylene glycol monomethyl ether acetate)

EL (ethyl lactate)

Acid generator: PAG 1 and PAG 2 (see the following structural formulae)

Basic compound: Amine 1, Amine 2, and Amine 3 (see the following structural formulae)

Dissolution inhibitor: DRI1 (see the following formula)

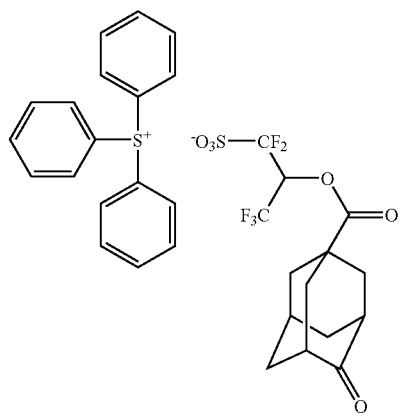

PAG1

-continued

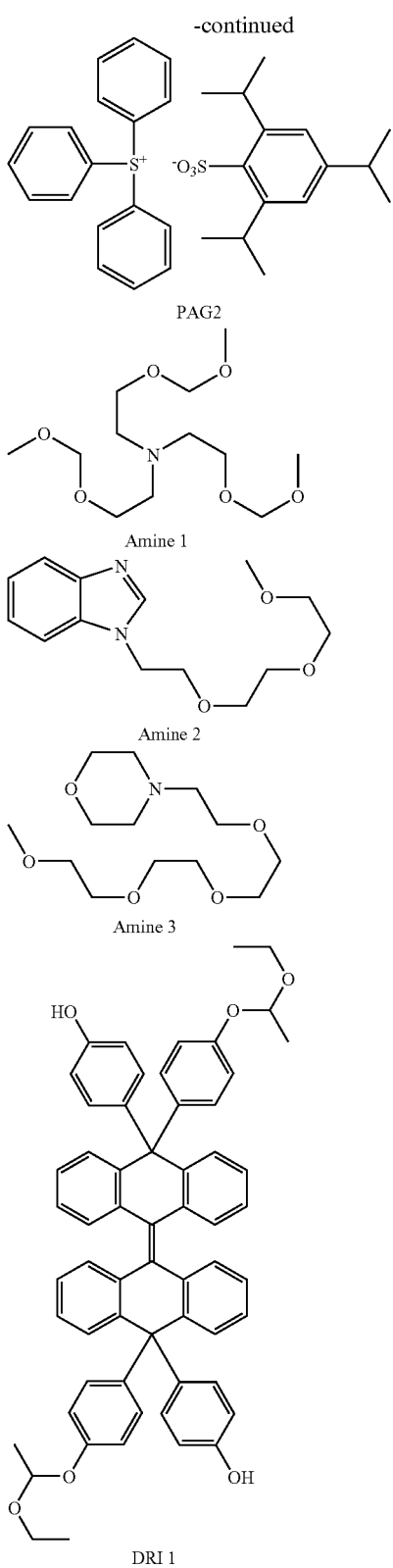

(Evaluation of an Electronic Beam Lithography)

In the evaluation of lithography, the positive resist composition prepared as shown above (Examples 1 to 20 and Comparative Examples 1 and 2) was spin-coated by using a Clean Track Mark 5 (manufactured by Tokyo Electron Ltd.) on a 6-inch diameter (150 mm) Si substrate, and then pre-baked on a hot plate at 110° C. for 90 seconds to obtain a resist film with 100 nm thickness. On this positive resist composition, a vacuum chamber lithography was carried out by using a HL-800D (manufactured by Hitachi, Ltd.) at an HV voltage of 50 keV.

Immediately after the lithography, a post exposure bake (PEB) was carried out on a hot plate at 100° C. for 90 seconds by using a Clean Track Mark 5 (manufactured by Tokyo Electron Ltd.), and then puddle-developed by an aqueous TMAH solution (2.38% by weight concentration) for 30 seconds to obtain a positive pattern.

The resist pattern thus obtained was evaluated as follows. An edge roughness of 100 nm LS at the exposure amount to resolve a 100-nm line-and-space at 1:1 was measured by a SEM.

The results of the sensitivity and the degree of resolution in relation with the resist composition and the EB exposure are shown in Table 1.

As shown in Table 1, it was confirmed that the positive resist compositions in Examples 1 to 20 had higher degree of resolution as compared with those in Comparative Examples 1 and 2. In addition, it can be seen that the sensitivity and the pattern configuration after exposure are excellent.

(Evaluation of the Dry Etching Resistance)

In the test for the dry etching resistance, 2 g of a polymer synthesized by the above methods (Polymers 11 to 24, 26 and 28, and Comparative Polymers 1 and 2) was dissolved in 10 g of PGMEA. The mixture thus obtained was filtered through a filter of a 0.2 µm size, and then the filtered polymer solution was applied on a Si substrate by a spin coat to obtain a film with 300 nm thickness. It was evaluated in the following conditions.

(Etching Tests in a $CHF_3/CF_4$ Gas System)

A difference of the polymer film thickness before and after the etching was measured by using a dry etching equipment TE-8500P (manufactured by Tokyo Electron Ltd.).

The etching conditions are as following:

| Chamber pressure: | 40.0 Pa |
|---|---|
| RF power: | 1,000 W |
| Gap: | 9 mm |
| $CHF_3$ gas flow: | 30 mL/minute |
| $CF_4$ gas flow: | 30 mL/minute |
| Ar gas flow: | 100 mL/minute |
| Time: | 60 seconds |

In this evaluation, when the difference in film thickness is small, namely the reduction amount is small, the film is judged to have the etching resistance.

The results of the dry etching resistance tests are shown in Table 2.

TABLE 2

| Polymer | $CHF_3/CF_4$ Gas Etching Rate (nm/min) |
|---|---|
| Polymer 11 | 82 |
| Polymer 12 | 87 |
| Polymer 13 | 87 |
| Polymer 14 | 80 |
| Polymer 15 | 83 |

TABLE 2-continued

| Polymer | CHF$_3$/CF$_4$ Gas Etching Rate (nm/min) |
|---|---|
| Polymer 16 | 84 |
| Polymer 17 | 84 |
| Polymer 18 | 79 |
| Polymer 19 | 88 |
| Polymer 20 | 89 |
| Polymer 21 | 92 |
| Polymer 22 | 94 |
| Polymer 23 | 95 |
| Polymer 24 | 100 |
| Polymer 26 | 94 |
| Polymer 28 | 97 |
| Comparative Polymer 1 | 132 |
| Comparative Polymer 2 | 129 |

From the results in Table 2, it was confirmed that the polymers according to the present invention (Polymer to 24, 26 and 28) have a higher resistance in dry etching than Comparative Polymers 1 and 2.

From the results shown in the above, it was found that a positive resist composition containing the polymer of the present invention as the base resin fully satisfies a resolution, a sensitivity, and a roughness, and have an excellent dry etching resistance in view of a small difference in the film thickness after the etching.

It must be stated here that the present invention is not restricted by the embodiments shown by Examples. The embodiments shown by Examples are merely examples so that any embodiments composed of substantially the same technical concept as disclosed in the claims of the present invention and expressing a similar effect are included in the technical scope of the present invention.

What is claimed is:

1. A positive resist composition, wherein the positive resist composition contains at least, as a base resin, a polymer whose hydrogen atom of a phenolic hydroxide group is substituted by an acid labile group represented by the following general formula (1):

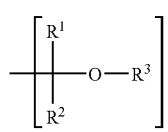

(1)

(In the formula, R$^1$ and R$^2$ each represent independently any of a linear, a branched, and a cyclic alkyl group having 1 to 6 carbon atoms, and a hydrogen atom; R$^3$ represents a fluorenyl group or a fluorenylmethyl group).

2. The positive resist composition according to claim 1, wherein the polymer is the one whose hydrogen atom of a phenolic hydroxide group is substituted by an acid labile group represented by the following general formula (2):

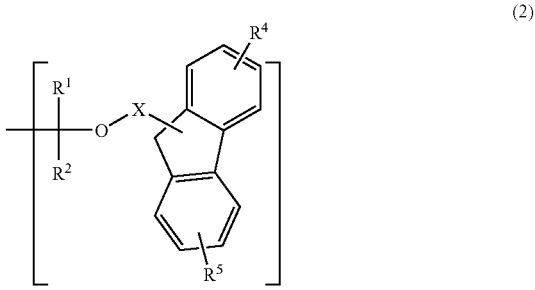

(2)

(In the formula, R$^1$ and R$^2$ represent the same meanings as before; R$^4$ and R$^5$ each represent independently any of a hydrogen atom, an alkyl group having 1 to 30 carbon atoms, an alkyl group a part of or all of whose hydrogen atoms are substituted by a halogen atom, an alkoxy group, an alkanoyl group, an alkoxycarbonyl group, an aryl group having 6 to 10 carbon atoms, and a halogen atom; X represents a single bond or a methylene group).

3. The positive resist composition according to claim 2, wherein the polymer has the weight-average molecular weight of 1,000 to 500,000 and contains at least a repeating unit a1, a hydroxy styrene substituted by the acid labile group, and/or a repeating unit b1, a hydroxy vinyl naphthalene substituted by the acid labile group, and a repeating unit a2 and/or a repeating unit b2, as represented by the following general formula (3):

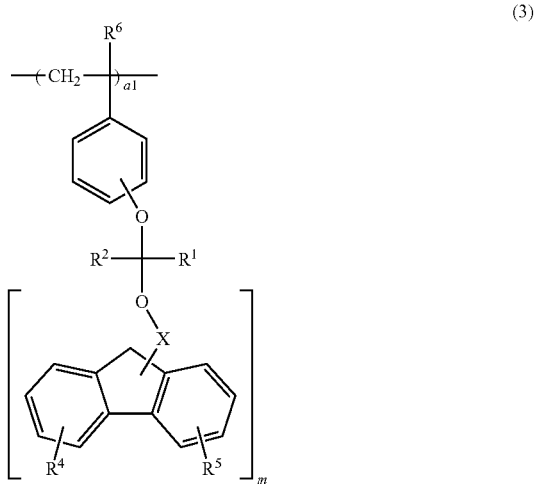

(3)

-continued

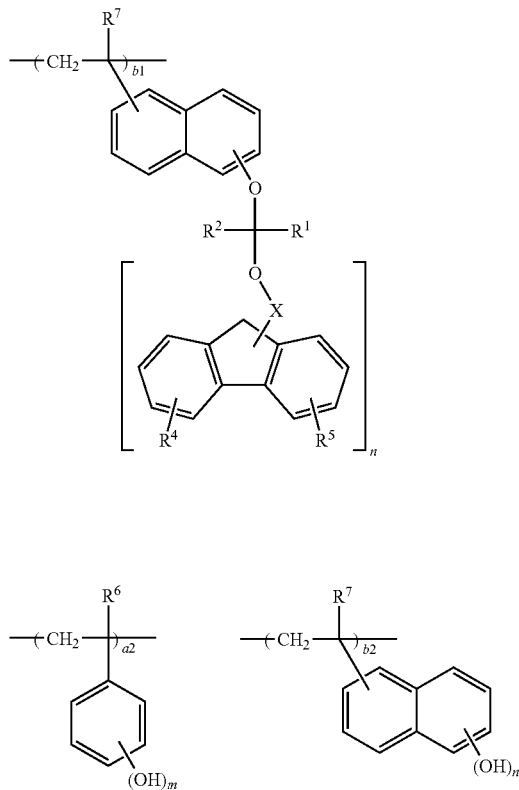

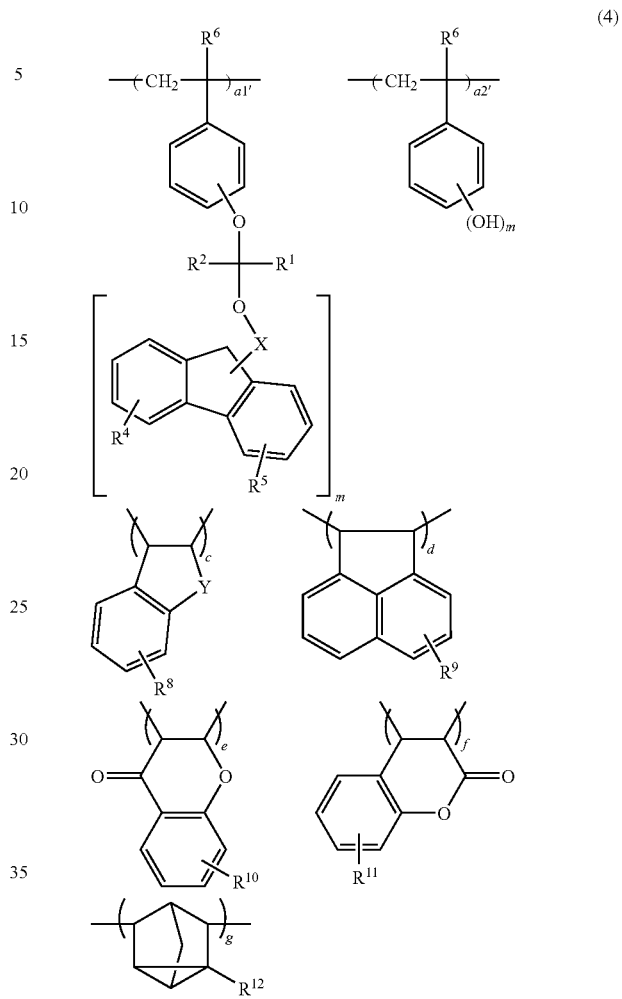

(In the formula, $R^6$ and $R^7$ each represent independently a hydrogen atom or a methyl group; $R^1$ and $R^2$ represent the same meanings as before; $R^4$ and $R^5$ each represent independently any of a hydrogen atom, an alkyl group having 1 to 30 carbon atoms, an alkyl group a part of or all of whose hydrogen atoms are substituted by a halogen atom, an alkoxy group, an alkanoyl group, an alkoxycarbonyl group, an aryl group having 6 to 10 carbon atoms, and a halogen atom; X represents a single bond or a methylene group; Here, m and n represent 1 or 2, and $0 \leq a1/(a1+b1+a2+b2) \leq 0.5$, $0 \leq b1/(a1+b1+a2+b2) \leq 0.5$, and $0.05 \leq (a1+b1)/(a1+b1+a2+b2) \leq 0.5$).

4. The positive resist composition according to claim 3, wherein the positive resist composition is a chemically amplified positive resist composition containing further an organic solvent and an acid generator.

5. The positive resist composition according to claim 4, wherein the positive resist composition contains further a dissolution inhibitor.

6. The positive resist composition according to claim 4, wherein the positive resist composition contains further a basic compound and/or a surfactant as an additive.

7. The positive resist composition according to claim 2, wherein the polymer has the weight-average molecular weight of 1,000 to 500,000 and contains at least a repeating unit a1', a hydroxy styrene substituted by the acid labile group, and a repeating unit a2' represented by the following general formula (4), and further contains one or more of repeating units selected from c, d, e, f, and g that are represented by the following general formula (4):

(In the formula, $R^6$ represents a hydrogen atom or a methyl group; $R^1$ and $R^2$ represent the same meaning as before; $R^4$ and $R^5$ each represent independently any of a hydrogen atom, an alkyl group having 1 to 30 carbon atoms, an alkyl group a part of or all of whose hydrogen atoms are substituted by a halogen atom, an alkoxy group, an alkanoyl group, an alkoxycarbonyl group, an aryl group having 6 to 10 carbon atoms, and a halogen atom; X represents a single bond or a methylene group; $R^8$ to $R^{12}$ each represent independently any of a hydrogen atom, an alkyl group having 1 to 30 carbon atoms, an alkyl group a part of or all of whose hydrogen atoms are substituted by a halogen atom, a hydroxy group, an alkoxy group, an alkanoyl group, an alkoxycarbonyl group, an aryl group having 6 to 10 carbon atoms, a halogen atom, and a 1,1,1,3,3,3-hexafluoro-2-propanol group; Y represents any of a methylene group, an oxygen atom, and a sulfur atom; Here, m represents 1 or 2, and $0<a1'/(a1'+a2'+c+d+e+f+g) \leq 0.5$, $0 \leq a2'/(a1'+a2'+c+d+e+f+g) \leq 0.9$, $0 \leq c/(a1'+a2'+c+d+e+f+g) \leq 0.5$, $0 \leq d/(a1'+a2'+c+d+e+f+g) \leq 0.5$, $0 \leq e/(a1'+a2'+c+d+e+f+g) \leq 0.5$, $0 \leq f/(a1'+a2'+c+d+e+f+g) \leq 0.5$, $0 \leq g/(a1'+a2'+c+d+e+f+g) \leq 0.5$, and $0.03 \leq (c+d+e+f+g)/(a1'+a2'+c+d+e+f+g) \leq 0.4$).

8. The positive resist composition according to claim 7, wherein the positive resist composition is a chemically amplified positive resist composition containing further an organic solvent and an acid generator.

9. The positive resist composition according to claim 8, wherein the positive resist composition contains further a dissolution inhibitor.

10. The positive resist composition according to claim 8, wherein the positive resist composition contains further a basic compound and/or a surfactant as an additive.

11. The positive resist composition according to claim 2, wherein the positive resist composition is a chemically amplified positive resist composition containing further an organic solvent and an acid generator.

12. The positive resist composition according to claim 11, wherein the positive resist composition contains further a dissolution inhibitor.

13. The positive resist composition according to claim 11, wherein the positive resist composition contains further a basic compound and/or a surfactant as an additive.

14. The positive resist composition according to claim 1, wherein the polymer has the weight-average molecular weight of 1,000 to 500,000 and contains at least a repeating unit a1, a hydroxy styrene substituted by the acid labile group, and/or a repeating unit b1, a hydroxy vinyl naphthalene substituted by the acid labile group, and a repeating unit a2 and/or a repeating unit b2, as represented by the following general formula (3):

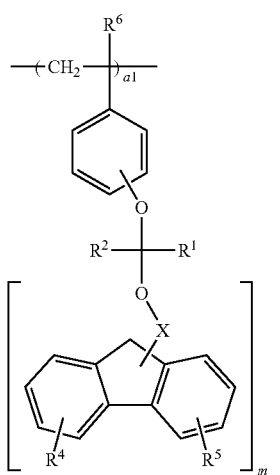

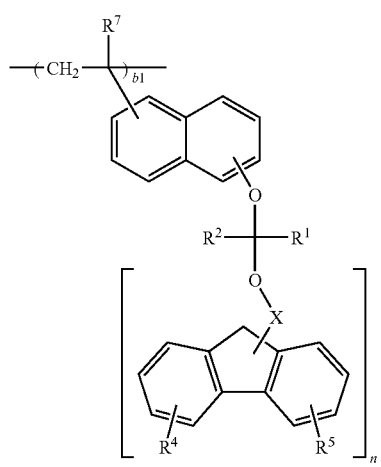

-continued

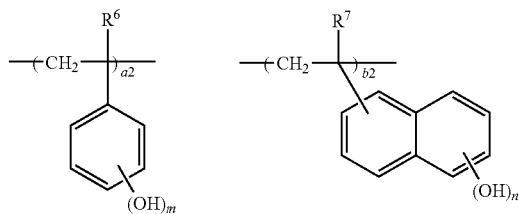

(In the formula, $R^6$ and $R^7$ each represent independently a hydrogen atom or a methyl group; $R^1$ and $R^2$ represent the same meanings as before; $R^4$ and $R^5$ each represent independently any of a hydrogen atom, an alkyl group having 1 to 30 carbon atoms, an alkyl group a part of or all of whose hydrogen atoms are substituted by a halogen atom, an alkoxy group, an alkanoyl group, an alkoxycarbonyl group, an aryl group having 6 to 10 carbon atoms, and a halogen atom; X represents a single bond or a methylene group; Here, m and n represent 1 or 2, and $0 \leq a1/(a1+b1+a2+b2) \leq 0.5$, $0 \leq b1/(a1+b1+a2+b2) \leq 0.5$, and $0.05 \leq (a1+b1)/(a1+b1+a2+b2) \leq 0.5$).

15. The positive resist composition according to claim 14, wherein the positive resist composition is a chemically amplified positive resist composition containing further an organic solvent and an acid generator.

16. The positive resist composition according to claim 15, wherein the positive resist composition contains further a dissolution inhibitor.

17. The positive resist composition according to claim 15, wherein the positive resist composition contains further a basic compound and/or a surfactant as an additive.

18. The positive resist composition according to claim 1, wherein the polymer has the weight-average molecular weight of 1,000 to 500,000 and contains at least a repeating unit a1', a hydroxy styrene substituted by the acid labile group, and a repeating unit a2' represented by the following general formula (4), and further contains one or more of repeating units selected from c, d, e, f, and g that are represented by the following general formula (4):

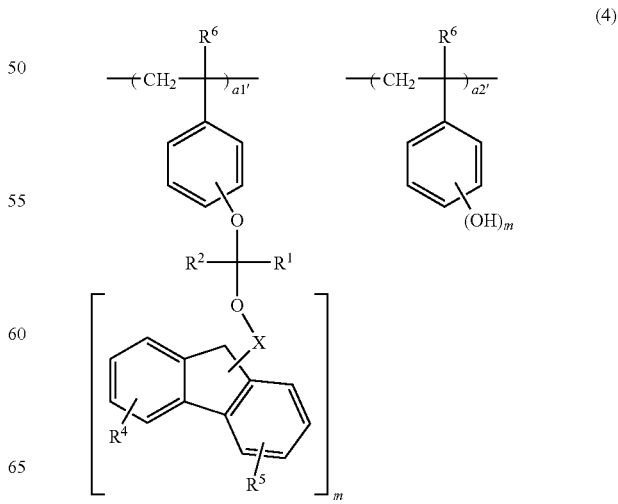

-continued

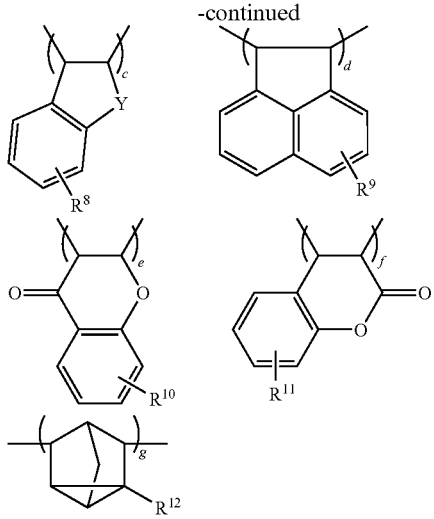

(In the formula, $R^6$ represents a hydrogen atom or a methyl group; $R^1$ and $R^2$ represent the same meaning as before; $R^4$ and $R^5$ each represent independently any of a hydrogen atom, an alkyl group having 1 to 30 carbon atoms, an alkyl group a part of or all of whose hydrogen atoms are substituted by a halogen atom, an alkoxy group, an alkanoyl group, an alkoxycarbonyl group, an aryl group having 6 to 10 carbon atoms, and a halogen atom; X represents a single bond or a methylene group; $R^8$ to $R^{12}$ each represent independently any of a hydrogen atom, an alkyl group having 1 to 30 carbon atoms, an alkyl group a part of or all of whose hydrogen atoms are substituted by a halogen atom, a hydroxy group, an alkoxy group, an alkanoyl group, an alkoxycarbonyl group, an aryl group having 6 to 10 carbon atoms, a halogen atom, and a 1,1,1,3,3,3-hexafluoro-2-propanol group; Y represents any of a methylene group, an oxygen atom, and a sulfur atom; Here, m represents 1 or 2, and $0<a1'/(a1'+a2'+c+d+e+f+g)\leqq0.5$, $0\leqq a2'/(a1'+a2'+c+d+e+f+g)\leqq0.9$, $0\leqq c/(a1'+a2'+c+d+e+f+g)\leqq0.5$, $0\leqq d/(a1'+a2'+c+d+e+f+g)\leqq0.5$, $0\leqq e/(a1'+a2'+c+d+e+f+g)\leqq0.5$, $0\leqq f/(a1'+a2'+c+d+e+f+g)\leqq0.5$, $0\leqq g/(a1'+a2'+c+d+e+f+g)\leqq0.5$, and $0.03\leqq(c+d+e+f+g)/(a1'+a2'+c+d+e+f+g)\leqq0.4$).

19. The positive resist composition according to claim 18, wherein the positive resist composition is a chemically amplified positive resist composition containing further an organic solvent and an acid generator.

20. The positive resist composition according to claim 19, wherein the positive resist composition contains further a dissolution inhibitor.

21. The positive resist composition according to claim 19, wherein the positive resist composition contains further a basic compound and/or a surfactant as an additive.

22. The positive resist composition according to claim 1, wherein the positive resist composition is a chemically amplified positive resist composition containing further an organic solvent and an acid generator.

23. The positive resist composition according to claim 22, wherein the positive resist composition contains further a dissolution inhibitor.

24. The positive resist composition according to claim 22, wherein the positive resist composition contains further a basic compound and/or a surfactant as an additive.

25. A patterning process comprising at least a step of applying the positive resist composition according to claim 1 on a substrate, a step of exposing the substrate high energy beam after heat-treatment, and a step of developing the substrate with a developer.

* * * * *